(12) United States Patent
Thiel et al.

(10) Patent No.: US 11,876,327 B1
(45) Date of Patent: *Jan. 16, 2024

(54) DC-DC CONVERSION SYSTEM

(71) Applicant: LAT Enterprises, Inc., Raleigh, NC (US)

(72) Inventors: Laura Thiel, Raleigh, NC (US); Giancarlo Urzi, Raleigh, NC (US)

(73) Assignee: LAT ENTERPRISES, INC., Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/128,740

(22) Filed: Mar. 30, 2023

Related U.S. Application Data

(63) Continuation of application No. 17/197,763, filed on Mar. 10, 2021, now Pat. No. 11,621,529, which is a continuation of application No. 17/029,821, filed on Sep. 23, 2020, now Pat. No. 10,950,988.

(51) Int. Cl.
| | |
|---|---|
| *H01R 13/66* | (2006.01) |
| *H02M 3/04* | (2006.01) |
| *B64D 27/24* | (2006.01) |
| *H05K 7/14* | (2006.01) |
| *B64D 41/00* | (2006.01) |
| *H05K 5/02* | (2006.01) |

(52) U.S. Cl.
CPC ......... *H01R 13/6675* (2013.01); *B64D 27/24* (2013.01); *B64D 41/00* (2013.01); *H02M 3/04* (2013.01); *H05K 5/0217* (2013.01); *H05K 7/1427* (2013.01)

(58) Field of Classification Search
None
See application file for complete search history.

(56) References Cited

U.S. PATENT DOCUMENTS

| | | | |
|---|---|---|---|
| 6,545,890 B2 | 4/2003 | Pitzele | |
| 6,894,468 B1 | 5/2005 | Bretz et al. | |
| 7,050,309 B2 | 5/2006 | Farrington | |
| 7,787,261 B2 | 8/2010 | Farrington et al. | |
| 8,720,762 B2 | 5/2014 | Hilliard et al. | |
| 10,950,988 B1* | 3/2021 | Thiel | H02M 3/04 |
| 11,621,529 B2* | 4/2023 | Thiel | H02M 3/04 307/24 |
| 2015/0357834 A1* | 12/2015 | McLean | H02M 3/04 307/31 |
| 2017/0229692 A1* | 8/2017 | Thiel | H02S 30/20 |
| 2018/0013301 A1* | 1/2018 | Young | H02J 7/0044 |
| 2018/0102656 A1* | 4/2018 | Thiel | A45C 13/36 |
| 2022/0094117 A1 | 3/2022 | Thiel et al. | |

* cited by examiner

*Primary Examiner* — Jared Fureman
*Assistant Examiner* — Aqeel H Bukhari
(74) *Attorney, Agent, or Firm* — NEO IP

(57) ABSTRACT

A direct current (DC)-DC conversion system including at least one DC source, at least one source cable, a DC-DC converter, at least one output cable, and at least one DC load. Each of the at least one source cable includes a source input connector, a source output connector, and a source input cable. The DC-DC converter includes a housing, a DC-DC input connector, and a DC-DC output connector. Each of the at least one output cable includes a load input connector, at least one load output connector, and a load output cable. The DC-DC converter is operable to receive energy from the at least one source via the at least one source cable, and is operable to provide energy to the at least one DC load via the at least one output cable.

20 Claims, 44 Drawing Sheets

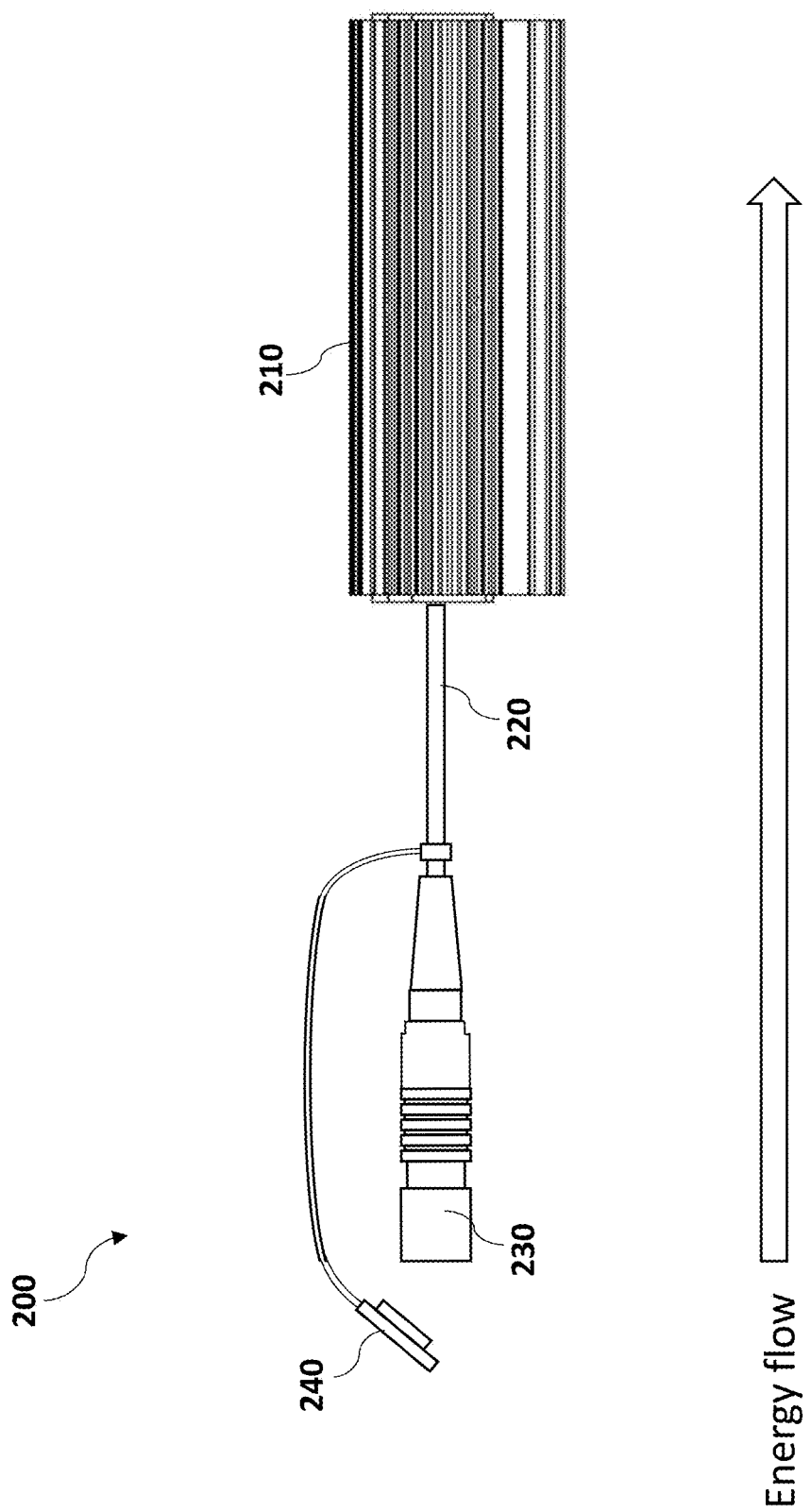

MATING FACE VIEW OF PLUG
ARRANGEMENT 6-6
PIN FACE SHOWN

DC-DC CONVERSION SYSTEM

CROSS REFERENCE TO RELATED APPLICATIONS

This application is related to and claims priority from the following U.S. patents and patent applications. This application is a continuation of U.S. application Ser. No. 17/197,763, filed Mar. 10, 2021, which is a continuation of U.S. application Ser. No. 17/029,821, filed Sep. 23, 2020, each of which is incorporated herein by reference in its entirety.

BACKGROUND OF THE INVENTION

1. Field of the Invention

The present invention relates generally to a system and a method for converting power from a first direct current power source with a first voltage to provide power to at least one other direct current power source with at least one different voltage.

2. Description of the Prior Art

The military uses various types of portable electronic devices (e.g., radios) and batteries used to power portable electronic devices. Radios are one example of mission critical devices that must be powered at all times. However, not all of these portable electronic devices and batteries use the same operating voltage. It is known in the prior art to provide direct current (DC)-DC converters.

Representative prior art patent documents include the following:

U.S. Patent Publication No. 20170229692 for material for dissipating heat from and/or reducing heat signature of electronic devices and clothing by inventors Thiel, et al., filed Mar. 27, 2017 and published Aug. 10, 2017, is directed to systems, methods and articles having a heat-shielding or blocking, heat-dissipating and/or heat signature-reducing material layer or coating. In one example, the heat-shielding or blocking, heat-dissipating and/or heat signature-reducing material completely covers the interior of a housing having a plurality of battery cells removably disposed therein. Other examples include a heat-shielding or blocking, heat-dissipating and/or heat signature-reducing material layer having anti-static, anti-radio frequency (RF), anti-electromagnetic interference (EMI), anti-tarnish, and/or anti-corrosion materials and properties that effectively protect battery-operated devices and/or the batteries that power them from damage or diminished operation.

U.S. Pat. No. 6,545,890 for flanged terminal pins for dc/dc converters by inventor Pitzele, filed Dec. 19, 2000 and issued Apr. 8, 2003, is directed to a dc/dc converter mounted to a printed circuit board with rigid terminal pins which extend into a converter substrate to provide electrical connection to circuitry on the substrate. A terminal pin includes a flange which abuts the printed circuit board and spaces the converter substrate from the printed circuit board. Connection to the printed circuit board is made by solder provided between the flange and the circuit board.

U.S. Pat. No. 6,894,468 for control of DC/DC converters having synchronous rectifiers by inventors Bretz, et al., filed Jul. 7, 2000 and issued May 17, 2005, is directed to a DC to DC power converter including synchronous rectifiers which respond to a control waveform. Negative current from a load into the power converter is prevented by increasing the converter output voltage at a minimum current limit. The synchronous rectifiers may be held off in response to decision logic by activation of a hold-off circuit connected to a control terminal of a synchronous rectifier or of an ORing transistor at the converter output. When the synchronous rectifier is subsequently enabled, its control waveform may be increased slowly relative to the switching cycle.

U.S. Pat. No. 7,050,309 for power converter with output inductance by inventor Farrington, filed Dec. 5, 2003 and issued May 23, 2006, is directed to the duty cycle of a primary winding circuit in a power converter that causes near continuous flow of power through the primary and secondary winding circuits during normal operation. By providing no regulation during normal operation, a very efficient circuit is obtained with a synchronous rectifier in the secondary operating at all times. However, during certain conditions such as start up or a short-circuit, the duty cycle of the primary may be reduced to cause freewheeling periods. To simplify the gate drive, the synchronous rectifiers may be allowed to turn off during the freewheeling periods, resulting in large ripple. A filter inductance of the secondary winding circuit reduces that ripple, and is sufficient to minimize ripple during normal operation, but still allows large ripple during the freewheeling periods. By accepting large ripple during other than normal operation, a smaller filter inductance can be used.

U.S. Pat. No. 7,787,261 for intermediate bus architecture with a quasi-regulated bus converter by inventors Farrington, et al., filed Nov. 1, 2007 and issued Aug. 31, 2010, is directed to a dc-dc converter system that comprises a quasi-regulated bus converter and plural regulation stages that regulate the output of the bus converter. The bus converter has at least one controlled rectifier with a parallel uncontrolled rectifier. A control circuit controls the controlled rectifier to cause a normally non-regulated mode of operation through a portion of an operating range of source voltage and a regulated output during another portion. The bus converter may be an isolation stage having primary and secondary transformer winding circuits. For the non-regulated output, each primary winding has a voltage waveform with a fixed duty cycle. The fixed duty cycle causes substantially uninterrupted flow of power during non-regulated operation. Inductors at the bus converter input and in a filter at the output of the bus converter may saturate during non-regulated operation.

U.S. Pat. No. 8,720,762 for load carrier systems and associated manufacturing methods by inventors Hilliard et al., filed Jun. 17, 2011 and issued May 13, 2014, is directed to load carrier systems and associated manufacturing methods. The patent discloses that a load carrier system can include a unitary piece of material. The unitary piece of material can include a body portion comprising a first face side, an opposing face side, a first peripheral edge and an opposing second peripheral edge; and one or more straps comprising a respective extended end, wherein the straps are an integral part of the body portion; wherein the one or more straps are folded over onto the first face side adjacent to the first peripheral edge; and wherein at least one respective end of the one or more straps is fastened to the opposing second peripheral edge.

SUMMARY OF THE INVENTION

The present invention relates generally to a system for converting power from a first direct current (DC) power source with a first voltage to provide power to at least one other direct current power source with at least one different voltage.

In one embodiment, the present invention provides a direct current (DC)-DC conversion system including at least one DC source, at least one source cable, wherein each of the at least one source cable includes a source input connector, a source output connector, and a source input cable electrically connecting the source input connector with the source output connector, a DC-DC converter, wherein the DC-DC converter includes a housing, a DC-DC input connector, and a DC-DC output connector, at least one output cable, wherein each of the at least one output cable includes a load input connector, at least one load output connector, and a load input cable electrically connecting the load input connector with the at least one load output connector, and at least one DC load, wherein the housing is configured to store electronics, wherein the electronics include a printed circuit board (PCB), and wherein the PCB is configured to designate at least one output voltage, wherein the DC-DC converter is operable to receive energy from the at least one source via the at least one source cable, wherein the source input connector is operable to electrically connect to the at least one source, and wherein the source output connector is operable to electrically connect to the DC-DC input connector, wherein the DC-DC converter is operable to provide energy to the at least one load via the at least one output cable, wherein the DC-DC output connector is operable to electrically connect to the load input connector, and wherein one or more of the at least one load output connector is operable to electrically connect to one or more of the at least one DC load, and wherein the at least one source cable includes a helicopter source cable.

In another embodiment, the present invention provides a direct current (DC)-DC conversion system including at least one DC source, at least one source cable, wherein each of the at least one source cable includes a source input connector, a source output connector, and a source input cable electrically connecting the source input connector with the source output connector, a DC-DC converter, wherein the DC-DC converter includes a housing, a DC-DC input connector, and a DC-DC output connector, at least one output cable, wherein each of the at least one output cable includes a load input connector, at least one load output connector, and a load input cable electrically connecting the load input connector with the at least one load output connector, at least one DC load, and a pouch, wherein the pouch is configured to hold the at least one source cable, the DC-DC converter, and the at least one output cable, wherein the housing is configured to store electronics, wherein the electronics include a printed circuit board (PCB), and wherein the PCB is configured to designate at least one output voltage, wherein the DC-DC converter is operable to receive energy from the at least one source via the at least one source cable, wherein the source input connector is operable to electrically connect to the at least one source, and wherein the source output connector is operable to electrically connect to the DC-DC input connector, wherein the DC-DC converter is operable to provide energy to the at least one load via the at least one output cable, wherein the DC-DC output connector is operable to electrically connect to the load input connector, and wherein one or more of the at least one load output connector is operable to electrically connect to one or more of the at least one DC load, and wherein the at least one source cable includes a helicopter source cable.

In yet another embodiment, the present invention provides a direct current (DC)-DC conversion system including at least one DC source, wherein the at least one DC source includes a vehicle battery, at least one source cable, wherein each of the at least one source cable includes a source input connector, a source output connector, and a source input cable electrically connecting the source input connector with the source output connector, a DC-DC converter, wherein the DC-DC converter includes a housing, a DC-DC input connector, and a DC-DC output connector, at least one output cable, wherein each of the at least one output cable includes a load input connector, at least one load output connector, and a load input cable electrically connecting the load input connector with the at least one load output connector, at least one DC load, and a battery protector, wherein the battery protector is electrically connected to the vehicle battery and the DC-DC converter, wherein the housing is configured to store electronics, wherein the electronics include a printed circuit board (PCB), and wherein the PCB is configured to designate at least one output voltage, wherein the DC-DC converter is operable to receive energy from the at least one source via the at least one source cable, wherein the source input connector is operable to electrically connect to the at least one source, and wherein the source output connector is operable to electrically connect to the DC-DC input connector, wherein the DC-DC converter is operable to provide energy to the at least one load via the at least one output cable, wherein the DC-DC output connector is operable to electrically connect to the load input connector, and wherein one or more of the at least one load output connector is operable to electrically connect to one or more of the at least one DC load, wherein the at least one source cable includes a helicopter source cable, and wherein the battery protector prevents draining of the vehicle battery.

These and other aspects of the present invention will become apparent to those skilled in the art after a reading of the following description of the preferred embodiment when considered with the drawings, as they support the claimed invention.

BRIEF DESCRIPTION OF THE DRAWINGS

FIG. 3 illustrates one embodiment of a DC-DC converter.

DETAILED DESCRIPTION

Figure 1:
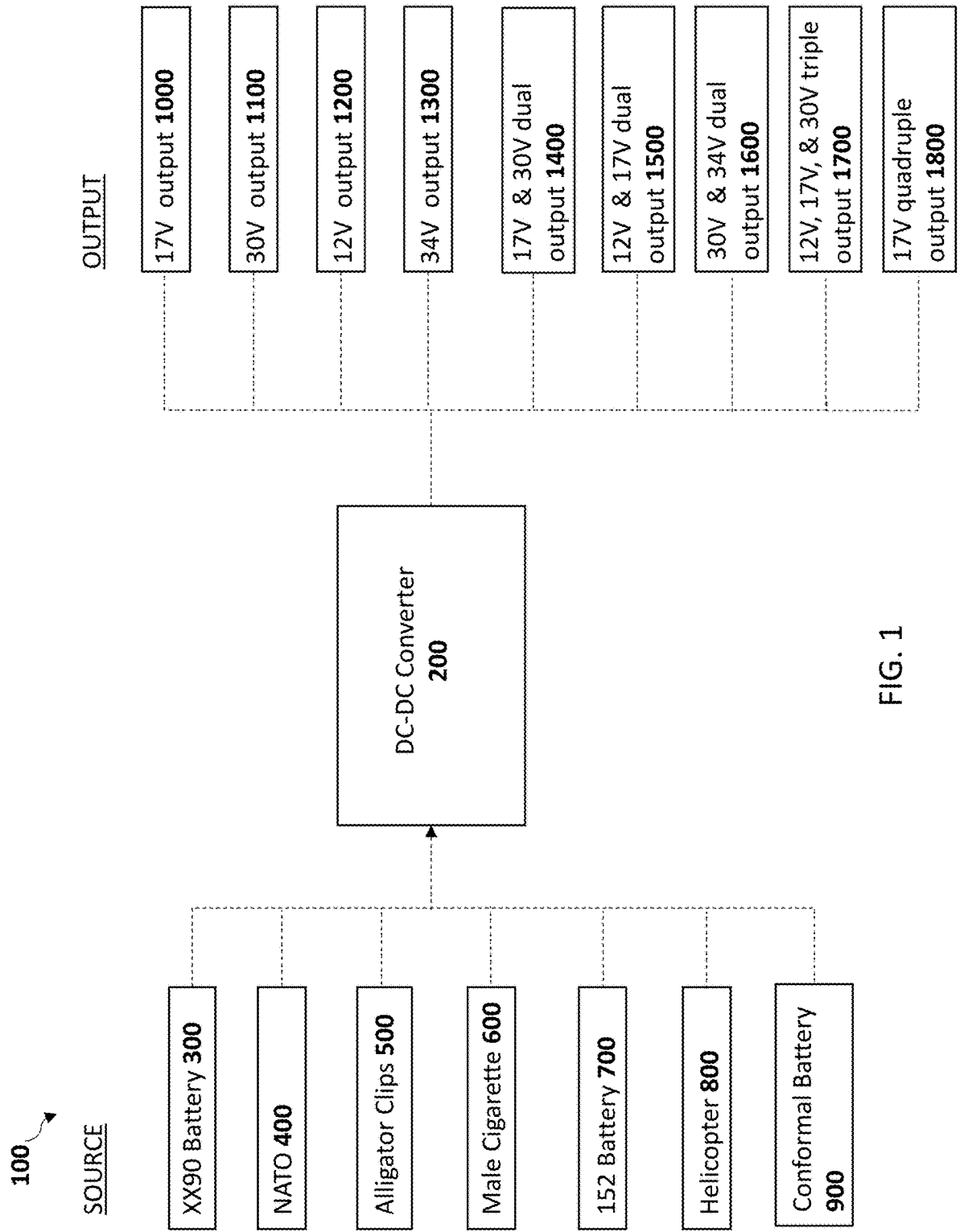
FIG. 1 illustrates a diagram of one embodiment of a DC-DC conversion system.

The present invention is generally directed to a system and a method for converting power from a first direct current power source with a first voltage to provide power to at least one other direct current power source with at least one different voltage.

In one embodiment, the present invention provides a direct current (DC)-DC conversion system including at least one DC source, at least one source cable, wherein each of the at least one source cable includes a source input connector, a source output connector, and a source input cable electrically connecting the source input connector with the source output connector, a DC-DC converter, wherein the DC-DC converter includes a housing, a DC-DC input connector, and a DC-DC output connector, at least one output cable, wherein each of the at least one output cable includes a load input connector, at least one load output connector, and a load input cable electrically connecting the load input connector with the at least one load output connector, and at least one DC load, wherein the housing is configured to store electronics, wherein the electronics include a printed circuit board (PCB), and wherein the PCB is configured to designate at least one output voltage, wherein the DC-DC converter is operable to receive energy from the at least one source via the at least one source cable, wherein the source input connector is operable to electrically connect to the at least one source, and wherein the source output connector is operable to electrically connect to the DC-DC input connector, wherein the DC-DC converter is operable to provide energy to the at least one load via the at least one output cable, wherein the DC-DC output connector is operable to electrically connect to the load input connector, and wherein one or more of the at least one load output connector is operable to electrically connect to one or more of the at least one DC load, and wherein the at least one source cable includes a helicopter source cable.

In another embodiment, the present invention provides a direct current (DC)-DC conversion system including at least one DC source, at least one source cable, wherein each of the at least one source cable includes a source input connector, a source output connector, and a source input cable electrically connecting the source input connector with the source output connector, a DC-DC converter, wherein the DC-DC converter includes a housing, a DC-DC input connector, and a DC-DC output connector, at least one output cable, wherein each of the at least one output cable includes a load input connector, at least one load output connector, and a load input cable electrically connecting the load input connector with the at least one load output connector, at least one DC load, and a pouch, wherein the pouch is configured to hold the at least one source cable, the DC-DC converter, and the at least one output cable, wherein the housing is configured to store electronics, wherein the electronics include a printed circuit board (PCB), and wherein the PCB is configured to designate at least one output voltage, wherein the DC-DC converter is operable to receive energy from the at least one source via the at least one source cable, wherein the source input connector is operable to electrically connect to the at least one source, and wherein the source output connector is operable to electrically connect to the DC-DC input connector, wherein the DC-DC converter is operable to provide energy to the at least one load via the at least one output cable, wherein the DC-DC output connector is operable to electrically connect to the load input connector, and wherein one or more of the at least one load output connector is operable to electrically connect to one or more of the at least one DC load, and wherein the at least one source cable includes a helicopter source cable.

In yet another embodiment, the present invention provides a direct current (DC)-DC conversion system including at least one DC source, wherein the at least one DC source includes a vehicle battery, at least one source cable, wherein each of the at least one source cable includes a source input connector, a source output connector, and a source input cable electrically connecting the source input connector with the source output connector, a DC-DC converter, wherein the DC-DC converter includes a housing, a DC-DC input connector, and a DC-DC output connector, at least one output cable, wherein each of the at least one output cable includes a load input connector, at least one load output connector, and a load input cable electrically connecting the load input connector with the at least one load output connector, at least one DC load, and a battery protector, wherein the battery protector is electrically connected to the vehicle battery and the DC-DC converter, wherein the housing is configured to store electronics, wherein the electronics include a printed circuit board (PCB), and wherein the PCB is configured to designate at least one output voltage, wherein the DC-DC converter is operable to receive energy from the at least one source via the at least one source cable, wherein the source input connector is operable to electrically connect to the at least one source, and wherein the source output connector is operable to electrically connect to the DC-DC input connector, wherein the DC-DC converter is operable to provide energy to the at least one load via the at least one output cable, wherein the DC-DC output connector is operable to electrically connect to the load input connector, and wherein one or more of the at least one load output connector is operable to electrically connect to one or more of the at least one DC load, wherein the at least one source cable includes a helicopter source cable, and wherein the battery protector prevents draining of the vehicle battery.

Team operations in remote locations, such as military operations, require radios to allow team members to communicate about danger, injuries, opportunities, etc. Without radios in these environments, more people would be injured or die. These operations also require other equipment (e.g., amplifiers, wearable batteries, smartphones, tablets) to allow team members to communicate, survey the environment, etc. The radios and other equipment typically require lithium ion batteries. However, the lithium ion batteries may not be able to the power the radios and other equipment for the time necessary to complete the operation on a single charge. As such, a portable power supply may be required to recharge the lithium ion batteries.

Further, not all equipment and batteries operate using the same supply voltage. What is needed is a DC-DC conversion system that is operable to provide a DC voltage to at least one electronic device (e.g., battery, radio) using at least one charging device. Additionally, there is a long-felt unmet need for a DC-DC conversion system that is able to harvest energy from typically unused sources including, but not limited to, a helicopter (e.g., UH-60).

To achieve multiple scavenging tips coordinating with multiple outputs to gear and/or batteries, DC-DC conversion systems of the prior art either (1) simplify the system down to one cable so that it can only collect from one source and deliver the correct energy to one battery or device, thereby losing flexibility in the field, or (2) make the system maximally complex and flexible such that an operator must program the inputs on a central DC-DC "power manager" device, which causes a loss of situational awareness as the operator looks down at the power manager device to plug the correct cable into the correct marked port, thus distracting the operator from combat. Thus, an operator has had to choose between simplicity of use or maximum flexibility, either sacrificing flexibility or simplicity and speed of operation. The present invention unites flexibility with simplicity by putting the complexity inside a housing and not requiring a user to program anything, and by making a three-part cable that an operator assembles simply and quickly, without having to learn or read which parts to use. Modularity provides flexibility and also makes it possible to only carry the input and output cable sections that are necessary for the mission at hand, saving weight, expense, and further simplifying the system.

Further, the present invention rapidly dissipates heat from the DC-DC converter to prevent operators from getting burned by the DC-DC converter. The barrel housing of the DC-DC converter incorporates imbedded copper high speed heat dissipating vacuum tubes to dispel heat away from the DC-DC converter safely.

Additionally, extremely low retention connectors near the operator facilitate rapid transition from mounted to dismounted without getting clotheslined or tangled in the charging cables. The battery or device cables on the output end are easily identified by touch even in low light or no light situations because the size of the connector is unique to a voltage. For example, big connectors work with higher voltages, while lower voltages correspond to smaller connectors.

None of the prior art provides a DC-DC conversion system that is operable to provide a DC voltage to at least one electronic device (e.g., radio, battery) using at least one charging device including, but not limited to, a helicopter (e.g., UH-60) while providing advantages including simplicity and flexibility as described above.

Certain aspects of the presently disclosed subject matter of the invention, having been stated hereinabove, are addressed in whole or in part by the presently disclosed subject matter, and other aspects will become evident as the description proceeds when taken in connection with the accompanying illustrative examples and figures as best described herein below.

Referring now to the drawings in general, the illustrations are for the purpose of describing a preferred embodiment of the invention and are not intended to limit the invention thereto.

System

FIG. 1 illustrates a block diagram of one embodiment of a DC-DC conversion system 100. In the embodiment shown in FIG. 1, a DC-DC converter 200 is operable to receive energy from at least one source via at least one source cable. The at least one source includes, but is not limited to, an XX90 source cable 300 connected to an XX90 battery, a North American Treaty Organization (NATO) source cable 400 connected, e.g., to a NATO ground vehicle, an alligator clip source cable 500 connected, e.g., to a vehicle battery, a male cigarette source cable 600 connected, e.g., to a cigarette lighter socket in a vehicle, a 152/148 battery source cable 700 connected to a battery operable to power, e.g., a PRC-152 radio or a PRC-148 radio, a helicopter source cable 800 connected to, e.g., a UH-60 helicopter (i.e., Black Hawk), and/or a conformal wearable battery source cable 900 connected to, e.g., a NETT WARRIOR battery. In one embodiment, a voltage range of the at least one source is automatically any voltage between 9 VDC and 40 VDC.

The DC-DC converter 200 is operable to provide energy to at least one load via at least one output cable. Each of the at least one output cable includes a load input connector connected to the DC-DC converter and at least one load output connector connected to at least one load (e.g., rechargeable battery, wearable battery, portable power case, radio, electronic device). The at least one output cable includes, but is not limited to, a 17V output cable 1000, a 30V output cable 1100, a 12V output cable 1200, a 34V output cable 1300, a 17V and 30V dual output cable 1400, a 12V and 17V dual output cable 1500, a 30V and 34V dual output cable 1600, a 12V, 17V, and 30V triple output cable 1700, and/or a 17V quadruple output cable 1800.

The at least one load is preferably a battery or a power source (e.g., portable power case) rather than another type of electronic device (e.g., radio). Advantageously, charging a battery or a power source allows for maximum flexibility when using any other type of electronic device (e.g., radio). For example, if the DC-DC converter is used to charge a battery, the battery is operable to power a radio, a laser designator and/or rangefinder (e.g., a Special Operations Forces Laser Rangefinder Designator (SOFLAM)), a tablet, a smartphone, a satellite phone, a thermal imaging device, or any other type of electronic device.

In a preferred embodiment, a voltage output of the DC-DC converter is arranged via pin out of the load input connector. This is in contrast to "smart cabling", which is not robust enough for soldiers to use in the field.

Preferably, the diameter and/or shape of each of the at least one load output connector of an output cable is different for different output voltages. In one example, a first load output connector has a higher output voltage (e.g., 29.4V ("30V")) and larger diameter, while a second load output connector has a lower output voltage (e.g., 16.8V ("17V")) and smaller diameter. This coordination of higher voltage with larger diameter and lower voltage with smaller diameter makes it intuitive for an operator to use the correct output connector for the correct device (e.g., rechargeable battery, wearable battery, portable power case). Advantageously, this coordination allows an operator to associate the correct output connector with the correct device in the dark. Thus, each of the at least one output connector on an output cable is an inherent voltage selector. Further, the operator can quickly connect devices without knowing an operating voltage, thereby maintaining situational awareness and eyes on combat.

Figure 2:
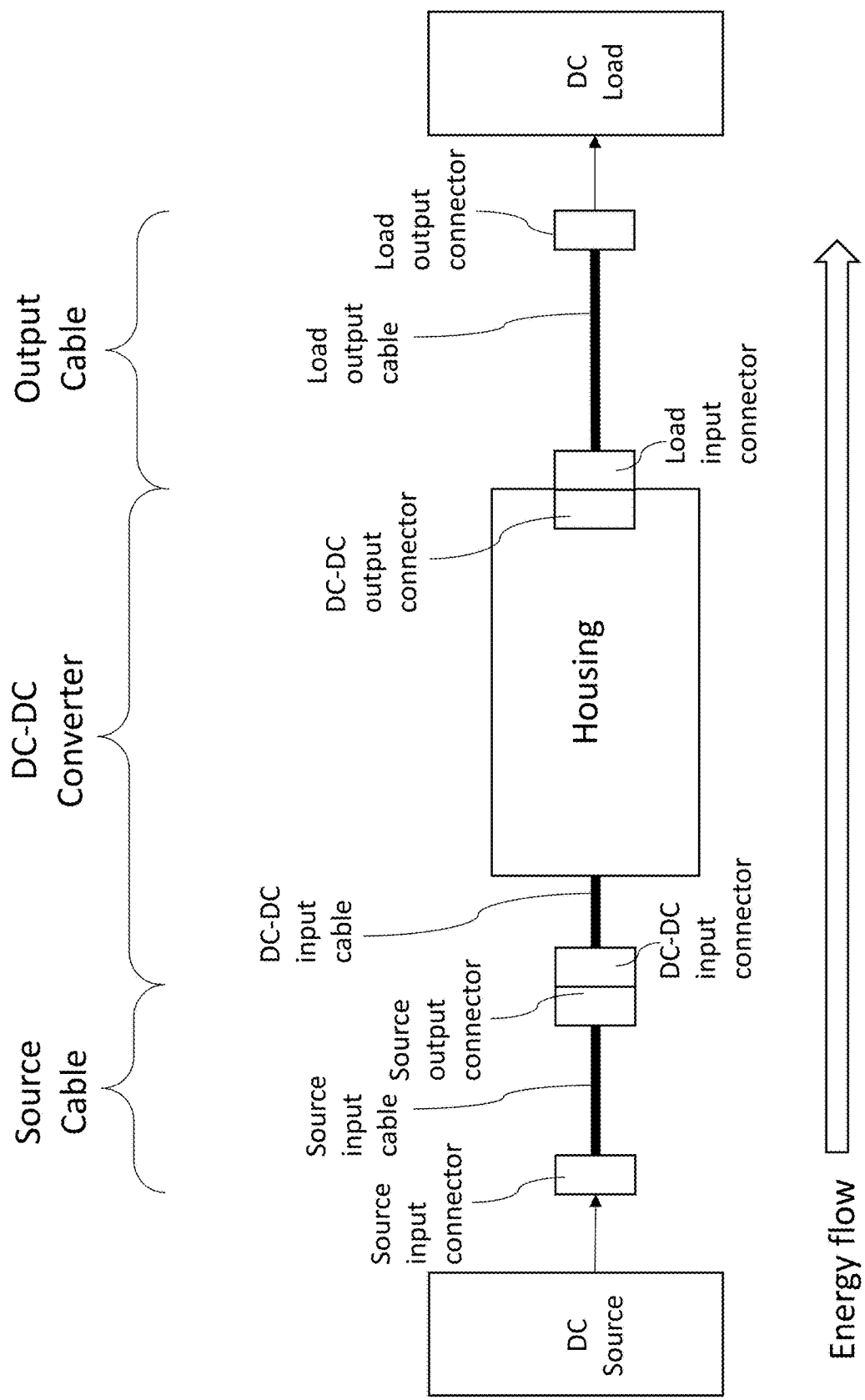
FIG. 2 illustrates a block diagram of the DC-DC conversion system.

FIG. 2 illustrates a block diagram of the DC-DC conversion system. The DC-DC converter is preferably a three-component system: (1) at least one source cable each having a source input connector operable to matingly connect to a DC source (e.g., via a DC source connector), a source input cable, and a source output connector operable to connect to a DC-DC input connector of a DC-DC converter; (2) the DC-DC converter with a housing for electronic components and further including the DC-DC input connector operable to matingly connect to the source output connector, a DC-DC input cable, and a DC-DC output connector operable to matingly connect to a load input connector of an output cable; and (3) at least one output cable each with the load input connector operable to matingly connect to the DC-DC output connector, a load output cable, and a load output connector operable to matingly connect to a DC load (e.g., via a DC load connector). Energy flows from the DC source to the DC load. The DC load is preferably a rechargeable battery operable both to receive and discharge energy simultaneously. Thus, the DC load is both operable to power a device (e.g., a radio) while be charged using the DC-DC conversion system.

DC-DC Converter 200

FIG. 3 illustrates one embodiment of the DC-DC converter 200. In a preferred embodiment, the DC-DC converter includes a housing 210 and a DC-DC input cable 220 with a DC-DC input connector 230. In one embodiment, the DC-DC input cable 220 is permanently fixed to the DC-DC converter. In an alternative embodiment, the DC-DC input cable 220 is removably attachable to the DC-DC converter. A dust cap 240 protects the DC-DC input connector 230 from environmental elements (e.g., dust, sand) when not in use, which could cause equipment failure in the field. In one embodiment, the DC-DC input connector 230 is a slip away connector. In another embodiment, the DC-DC input connector 230 is a FISCHER SOV A105 A087 connector. Alternatively, the DC-DC input connector 230 is a locking connector. In a preferred embodiment, the dust cap 240 is molded into a boot of the DC-DC input connector 230.

The DC-DC input connector 230 preferably exclusively mates to the source output connector on the source cable, thus eliminating confusion in how to connect the three-component system. Advantageously, this allows an operator to easily discern between connectors in the dark. Additionally, this allows the operator to quickly connect devices while in combat, thereby maintaining situational awareness.

Figure 4A:
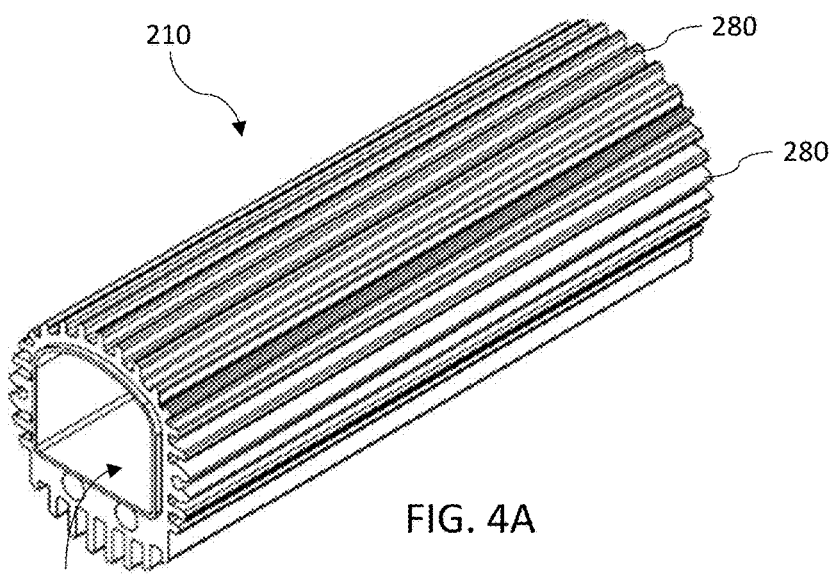
FIG. 4A illustrates an angled view of the housing of one embodiment of a DC-DC converter.
Figure 4B:
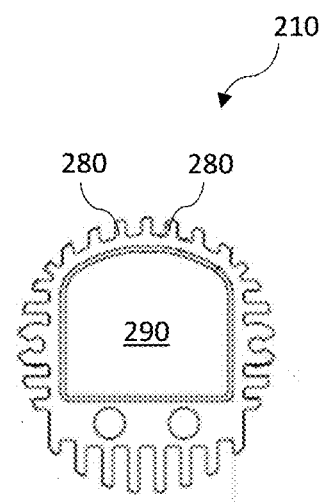
FIG. 4B illustrates an end view of the housing of one embodiment of a DC-DC converter.
Figure 4C:
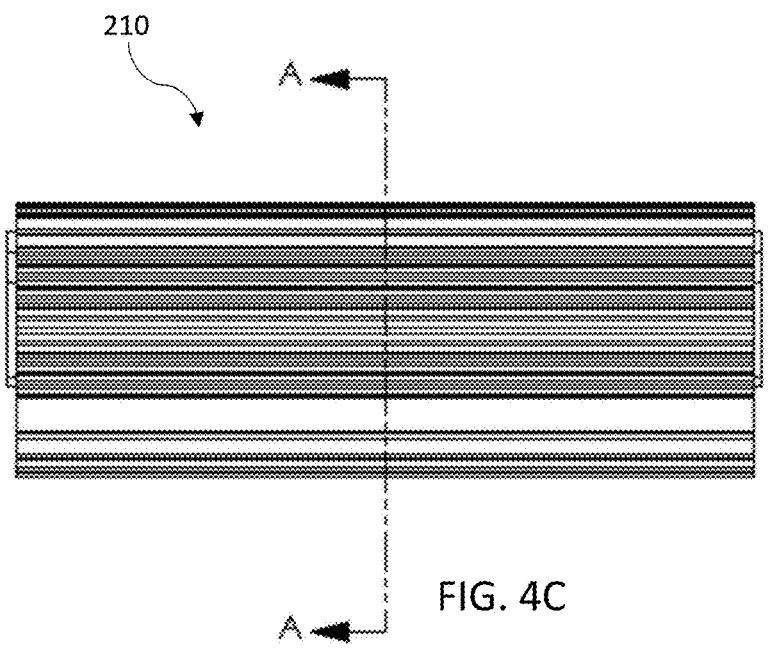
FIG. 4C illustrates a side view of the housing of one embodiment of a DC-DC converter.
Figure 4D:
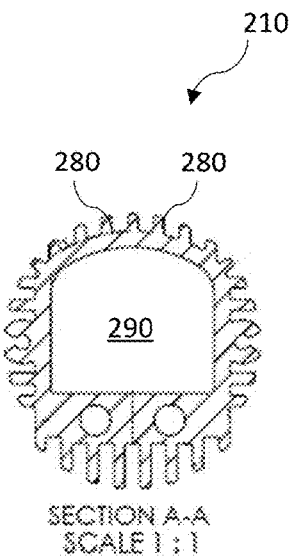
FIG. 4D illustrates a cross-section of the housing of one embodiment of a DC-DC converter.

FIG. 4A illustrates an angled view of a housing 210 of one embodiment of a DC-DC converter. FIG. 4B shows an end view of the housing 210 of one embodiment of a DC-DC converter. FIG. 4C shows a side view of the housing 210 of one embodiment of a DC-DC converter. FIG. 4D shows a cross-section of the housing 210 of one embodiment of a DC-DC converter.

As best seen in FIGS. 4A-4B and 4D, the exterior of the housing 210 preferably has fins 280 to dissipate heat (i.e., a heat sink). The fins 280 provide a larger surface area to dissipate the heat. Additionally, or alternatively, the housing of the DC-DC converter is formed of copper vacuum tubes encased in an aluminum extrusion. Copper has a high thermal conductivity, which allows heat to quickly dissipate, and aluminum provides a weight savings.

The housing 210 preferably is hollow to allow electronics to be stored within a cavity 290 in the DC-DC converter. The electronics preferably include a printed circuit board (PCB). In a preferred embodiment, the PCB designates at least one output voltage (e.g., two output voltages, three output voltages, four output voltages, five output voltages, six output voltages, etc.). In one embodiment, the PCB designates four different output voltages. In one embodiment, the four different output voltages are operable to be selected sequentially. In one embodiment, one or more of the at least one output voltage is not programmed. In one example, a first output voltage is 17V, a second output voltage is 30V, and a third output voltage and a fourth output voltage are not programmed. Advantageously, this allows retrofitting of the DC-DC converter to the voltage of future devices.

In one embodiment, the electronics include a buck-boost regulator that converts an input voltage to an output voltage. In one embodiment, the DC-DC converter employs synchronous rectification to produce a high conversion efficiency. In a preferred embodiment, the DC-DC converter has an input voltage range of between about 9V and about 40V. Alternatively, the DC-DC converter has an input voltage range of between about 5V and about 50V. In one embodiment, the DC-DC converter has an output voltage range of between about 0V and about 40V. In one embodiment, the buck-boost regulator has a current of 15 A.

The DC-DC converter preferably includes an input under-voltage lockout to protect the DC-DC converter at low input voltages. In another preferred embodiment, the DC-DC converter includes an over-current shutdown to protect the DC-DC converter from high load currents and/or short circuits. In still another preferred embodiment, the DC-DC converter includes an over-voltage protection to protect both input (e.g., source) and output (e.g., load) from high voltages. In yet another preferred embodiment, the DC-DC converter includes a thermal shutdown to protect the DC-DC converter from high temperatures (e.g., greater than or equal to 115° C.).

While designing the DC-DC converter, it was attempted to use a ¼ brick. However, the ¼ brick was not able to handle the load needed. The design was modified to use a ½ brick, which worked, but was hot enough to burn a user when it was touched. As a result, it was impossible to place in a polymer or a plain metal housing. If heat dissipation was done using only fins, the fins would be too long and it would be impractical to carry the housing. However, by inserting the copper vacuum tubes, the fin size was able to be reduced by half. This advantageously reduces the diameter of the housing by half and is acceptable to an end user.

Figure 4E:
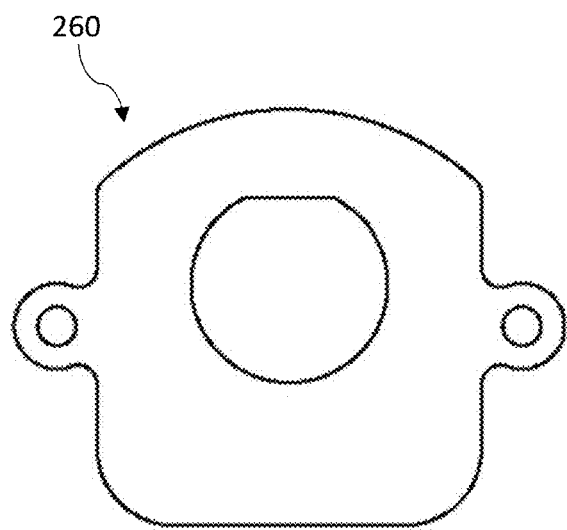
FIG. 4E illustrates an end view of a connector end cap for the housing of one embodiment of a DC-DC converter.
Figure 4F:
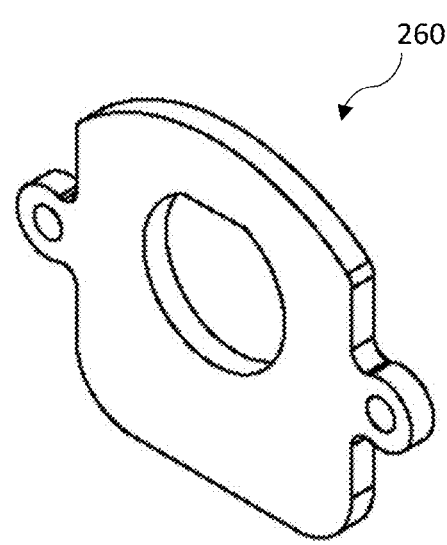
FIG. 4F illustrates an angled view of a connector end cap for the housing of one embodiment of a DC-DC converter.
Figure 4G:
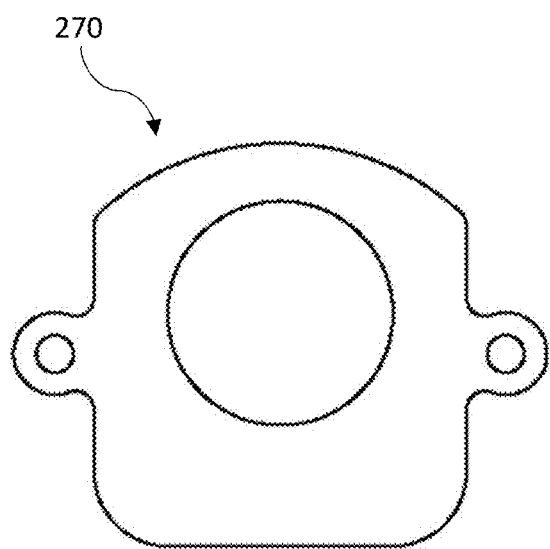
FIG. 4G illustrates an end view of a grommet end cap for the housing of one embodiment of a DC-DC converter.
Figure 4H:
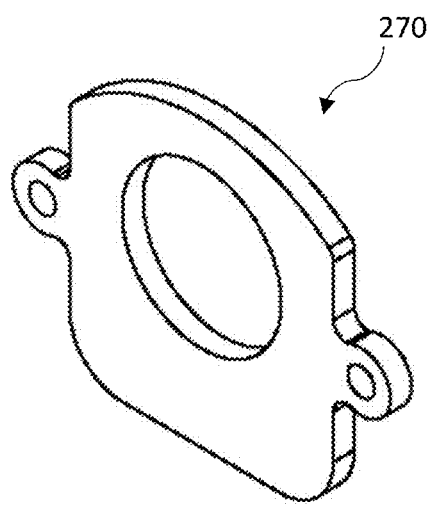
FIG. 4H illustrates an angled view of a grommet end cap for the housing of one embodiment of a DC-DC converter.

FIG. 4E shows an end view of a connector end cap 260 for an input end of the housing 210 of one embodiment of a DC-DC converter. FIG. 4F shows an angled view of a connector end cap 260 for the input end of the housing 210 of one embodiment of a DC-DC converter. FIG. 4G shows an end view of a grommet end cap 270 for an output end of the housing of one embodiment of a DC-DC converter. FIG. 4H shows an angled view of a grommet end cap 270 for the output end of the housing of one embodiment of a DC-DC converter.

Figure 5:
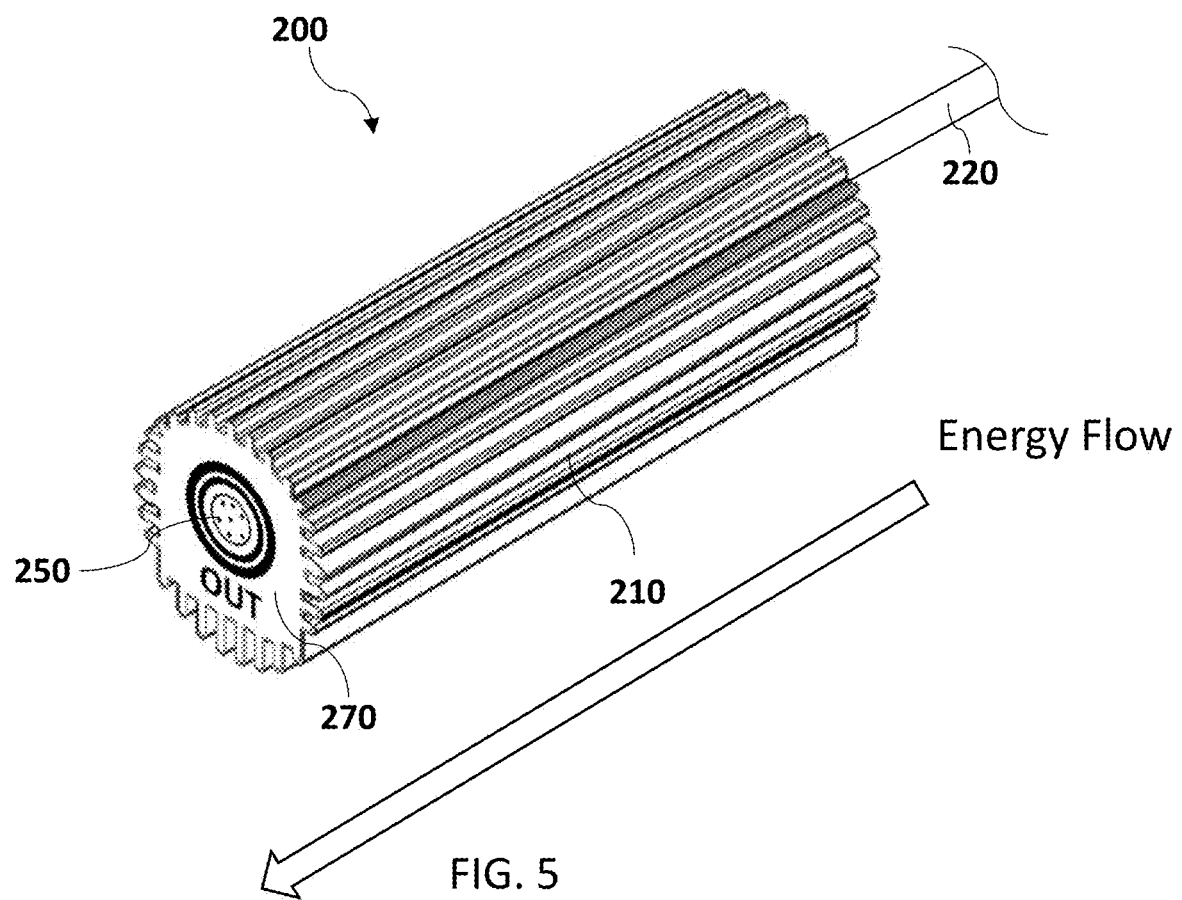
FIG. 5 illustrates an angled perspective view of the DC-DC converter.

FIG. 5 illustrates an angled perspective view of the DC-DC converter 200. In a preferred embodiment, the DC-DC converter 200 includes a DC-DC output connector 250 on an end opposite of the DC-DC input connector. The DC-DC output connector 250 is preferably panel mounted. In one embodiment, the DC-DC output connector 250 is a FISHER DBP U104 A054 connector.

The DC-DC output connector 250 preferably exclusively mates to the load input connector on the output cable, thus eliminating confusion in how to connect the three-component system. Advantageously, this allows an operator to easily discern between connectors in the dark.

Figure 6:
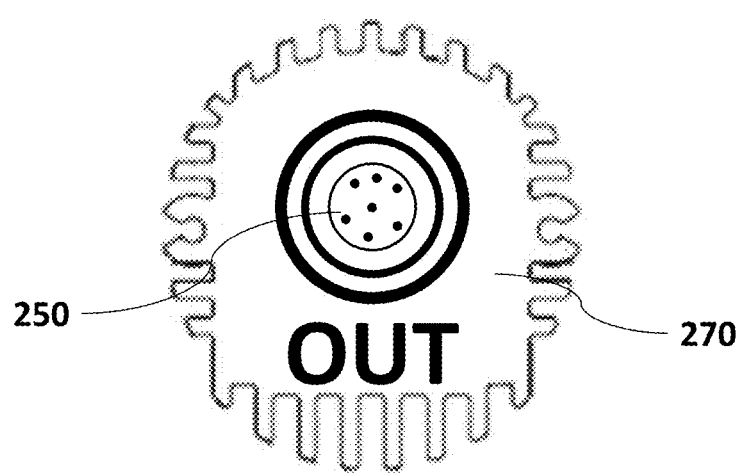
FIG. 6 illustrates an orthogonal view of the output end of the DC-DC converter.

FIG. 6 illustrates an orthogonal view of the output end of the DC-DC converter 200.

In one embodiment, the DC-DC converter includes a panel mount strain relief to be a right-angle adapter. Advantageously, this embodiment prevents the DC-DC converter from hitting an operator on the head when using a utility receptacle 28 VDC on a helicopter, which is located on the ceiling above the operator's head.

XX90 300

The system preferably includes an XX90 source cable 300 operable to connect to an XX90 battery. The XX90 battery includes, but is not limited to a BA5590 battery, a BB2590 battery, and/or a BA5390 battery. The XX90 battery is a military battery, and includes any battery with a connector equivalent to a connector on the BA5590 battery, the BB2590 battery, and/or the BA5390 battery. The XX90 battery is rechargeable or non-rechargeable. In one embodiment, the XX90 battery includes two independent battery sections that can be connected in either series or parallel. In one embodiment, a voltage of the XX90 battery is 15V in parallel and 30V in series.

Figure 7:
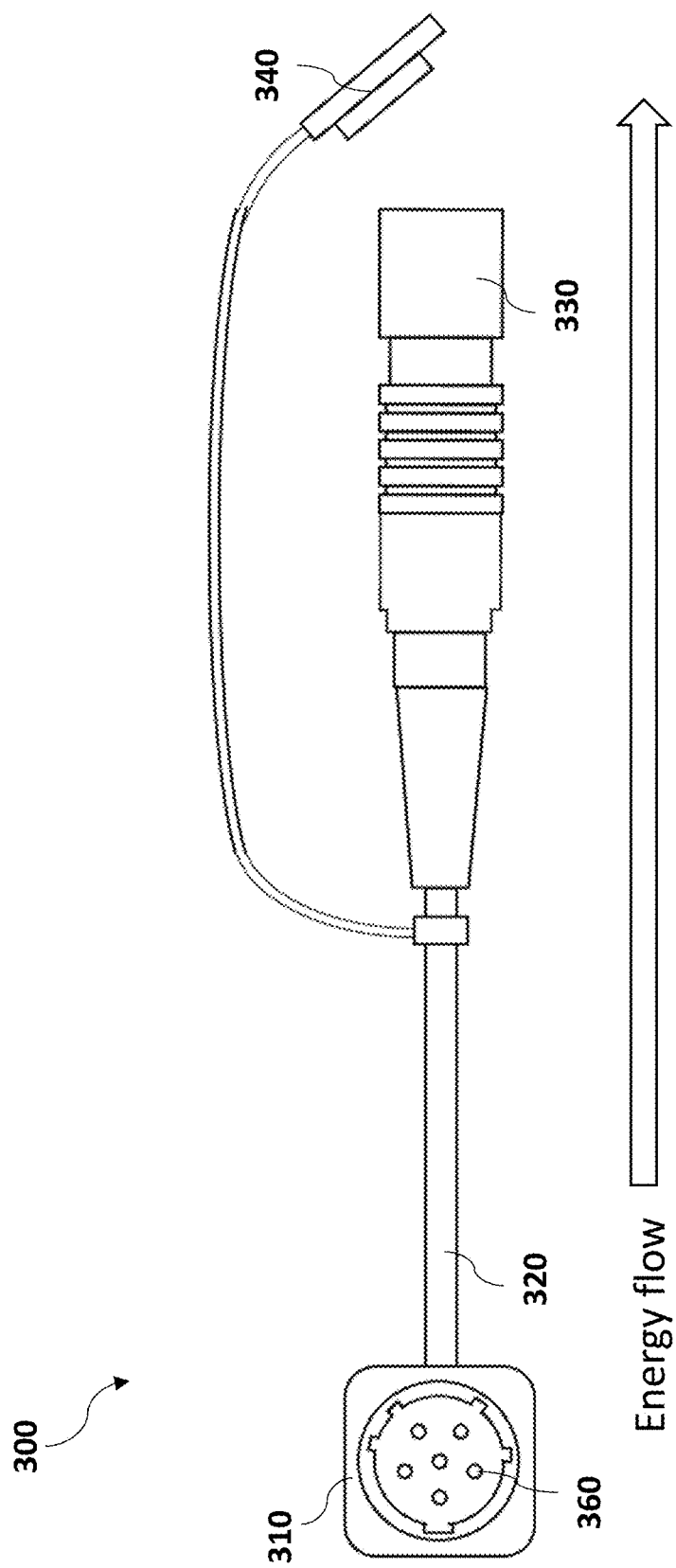
FIG. 7 illustrates one embodiment of an XX90 source cable for use with the DC-DC conversion system.

FIG. 7 illustrates one embodiment of the XX90 source cable 300. The XX90 source cable 300 includes an XX90 input connector 310, an XX90 source input cable 320, a source output connector 330, and a source output dust cap 340. The source output connector 330 is operable to mate to the DC-DC input connector of the DC-DC converter. In one embodiment, the source output connector 330 is a FISHER K105 A087 connector. The source output dust cap 340 is operable to protect the source output connector 330 from external elements (e.g., dust, water). In a preferred embodiment, the source output dust cap 340 is molded into a boot of the source output connector 330. The XX90 input connector 310 includes electrical pins 360 operable to electrically connect with a mating connector on the XX90 battery.

Figure 8A:
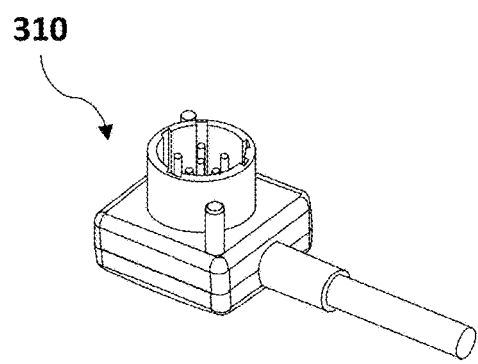
FIG. 8A is an angled perspective view of the XX90 source connector for use with the DC-DC conversion system.
Figure 8B:
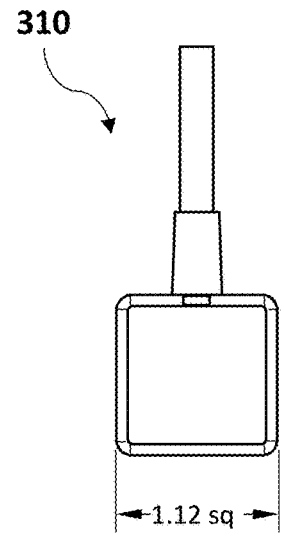
FIG. 8B is a bottom orthogonal view of the XX90 source connector for use with the DC-DC conversion system.
Figure 8C:
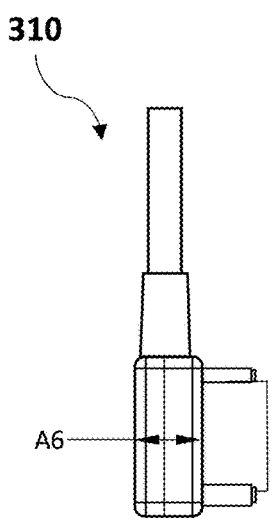
FIG. 8C is a side view of the XX90 source connector for use with the DC-DC conversion system.
Figure 8D:
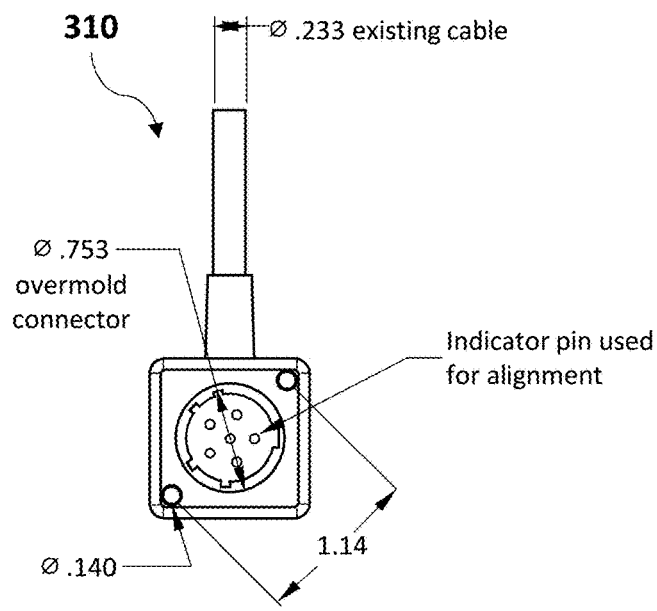
FIG. 8D is a top orthogonal view of the XX90 source connector for use with the DC-DC conversion system.

FIGS. 8A-8D are perspective views of the XX90 input connector 310. FIG. 8A is an angled perspective view of the XX90 input connector 310. FIG. 8B is a bottom orthogonal view of the XX90 input connector 310. FIG. 8C is a side view of the XX90 input connector 310. FIG. 8D is a top orthogonal view of the XX90 input connector 310.

NATO 400

The system preferably includes a North American Treaty Organization (NATO) source cable 400 operable to connect, e.g., to a NATO ground vehicle. The NATO ground vehicle includes a High Mobility Multipurpose Wheeled Vehicle (Humvee), a Joint Light Tactical Vehicle (JLTV), a Mine-Resistant Ambush Protected (MRAP) vehicle, an Infantry Carrier Vehicle (ICV) Stryker vehicle, an Infantry Mobility Vehicle (IMV), and/or any other vehicle with a NATO receptacle.

Figure 9:
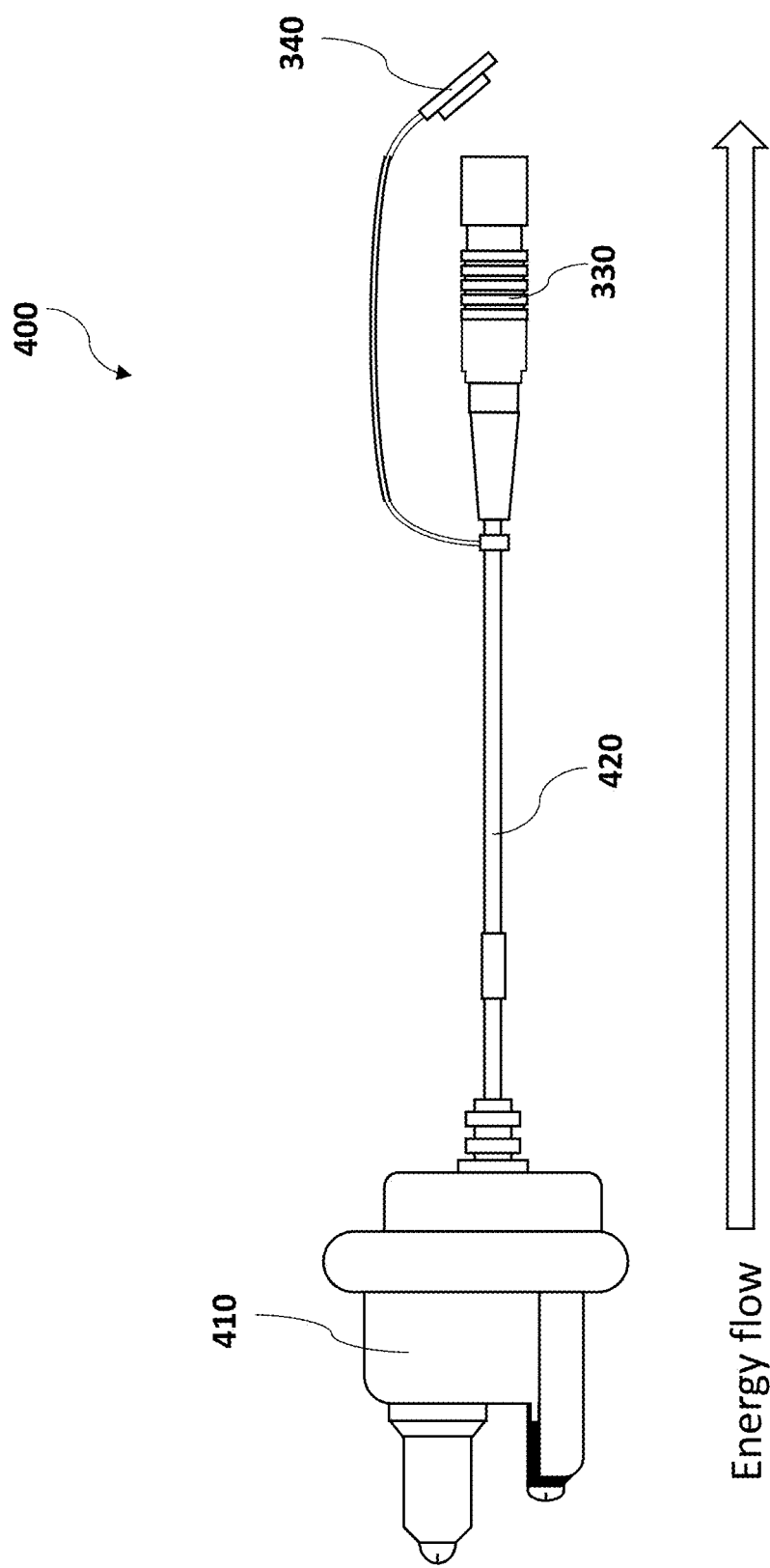
FIG. 9 illustrates a preferred embodiment of a NATO source cable for use with the DC-DC conversion system.

FIG. 9 illustrates a preferred embodiment of the NATO source cable 400. The NATO source cable 400 includes a NATO input connector 410, a NATO source input cable 420, a source output connector 330, a source output dust cap 340, and a NATO input dust cap 450. The source output connector 330 is operable to mate to the DC-DC input connector of the DC-DC converter. In one embodiment, the source output connector 330 is a FISHER K105 A087 connector. In one embodiment, the NATO input connector 410 is a CBLHV-F00010 available from LIND ELECTRONICS or an equivalent NATO input connector. The source output dust cap 340 is operable to protect the source output connector 330 from external elements (e.g., dust, water). The NATO input dust cap 450 is operable to protect the NATO input connector 410 from external elements (e.g., dust, water). In a preferred embodiment, the source output dust cap 340 is molded into a boot of the source output connector 330.

Figure 10:
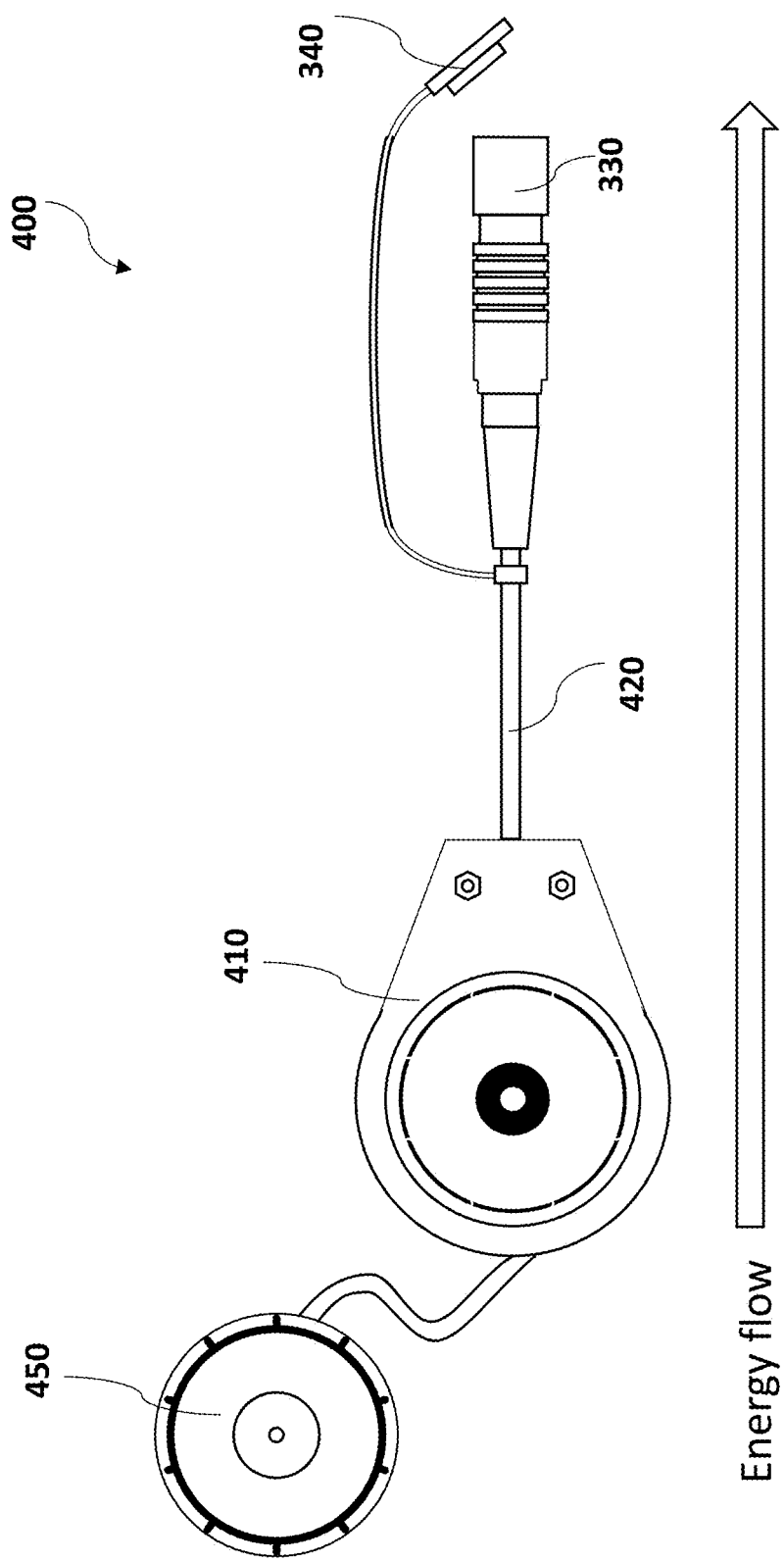
FIG. 10 illustrates another embodiment of a NATO source cable for use with the DC-DC conversion system.

FIG. 10 illustrates another embodiment of the NATO source cable 400. The embodiment shown in FIG. 9 is preferred because it is lighter and more streamlined than the embodiment shown in FIG. 10. In one embodiment, the NATO input connector 410 is a SN-70413-99 available from SUPPLYNET or an equivalent NATO input connector.

Alligator Clip 500

The system preferably includes an alligator clip source cable 500 operable to connect, e.g., to battery terminals from a battery. In one embodiment, the battery is a vehicle battery in a vehicle, including, but not limited to, a car, a truck, a motorcycle, a moped, a High Mobility Multipurpose Wheeled Vehicle (Humvee), a Joint Light Tactical Vehicle (JLTV), a Mine-Resistant Ambush Protected (MRAP) vehicle, a boat, a watercraft, an unmanned vehicle (e.g., unmanned aerial vehicle (UAV)), and/or an all-terrain vehicle (ATV). Alternatively, the battery is any battery with a positive terminal and a negative terminal with a voltage within the input voltage range (e.g., 9V battery).

Figure 11:
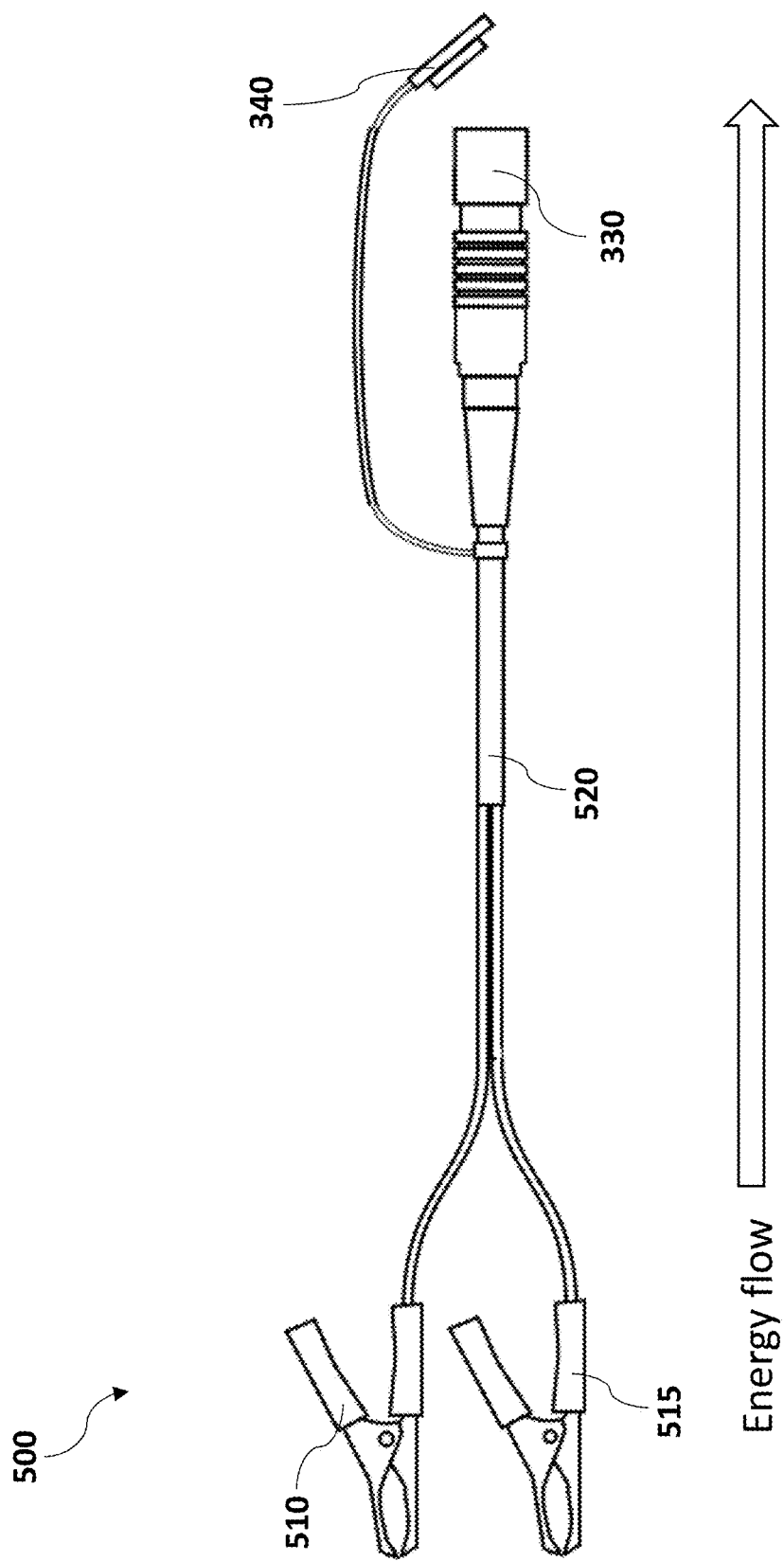
FIG. 11 illustrates one embodiment of an alligator clip source cable for use with the DC-DC conversion system.

FIG. 11 illustrates one embodiment of an alligator clip source cable 500. The alligator clip source cable 500 includes a negative end clamp 510, a positive end clamp 515, an alligator clip source input cable 520, a source output connector 330, and a source output dust cap 340. The negative end clamp 510 connects to a negative terminal of a battery and the positive end clamp 515 connects to a positive terminal of the battery. Advantageously, this allows power to be obtained from a vehicle battery (e.g., 12V battery) and/or any other battery with a positive terminal and a negative terminal within the input voltage range. In a preferred embodiment, the negative end clamp 510 is black and the positive end clamp 515 is red. The source output connector 330 is operable to mate to the DC-DC input connector of the DC-DC converter. In one embodiment, the source output connector 330 is a FISHER K105 A087 connector. The source output dust cap 340 is operable to protect the source output connector 330 from external elements (e.g., dust, water). In a preferred embodiment, the source output dust cap 340 is molded into a boot of the source output connector 330.

The system allows the load to charge using a vehicle battery after the ignition is turned off. The system preferably includes a battery protector 550 to prevent users from being stranded due to a drained vehicle battery.

Figure 12:
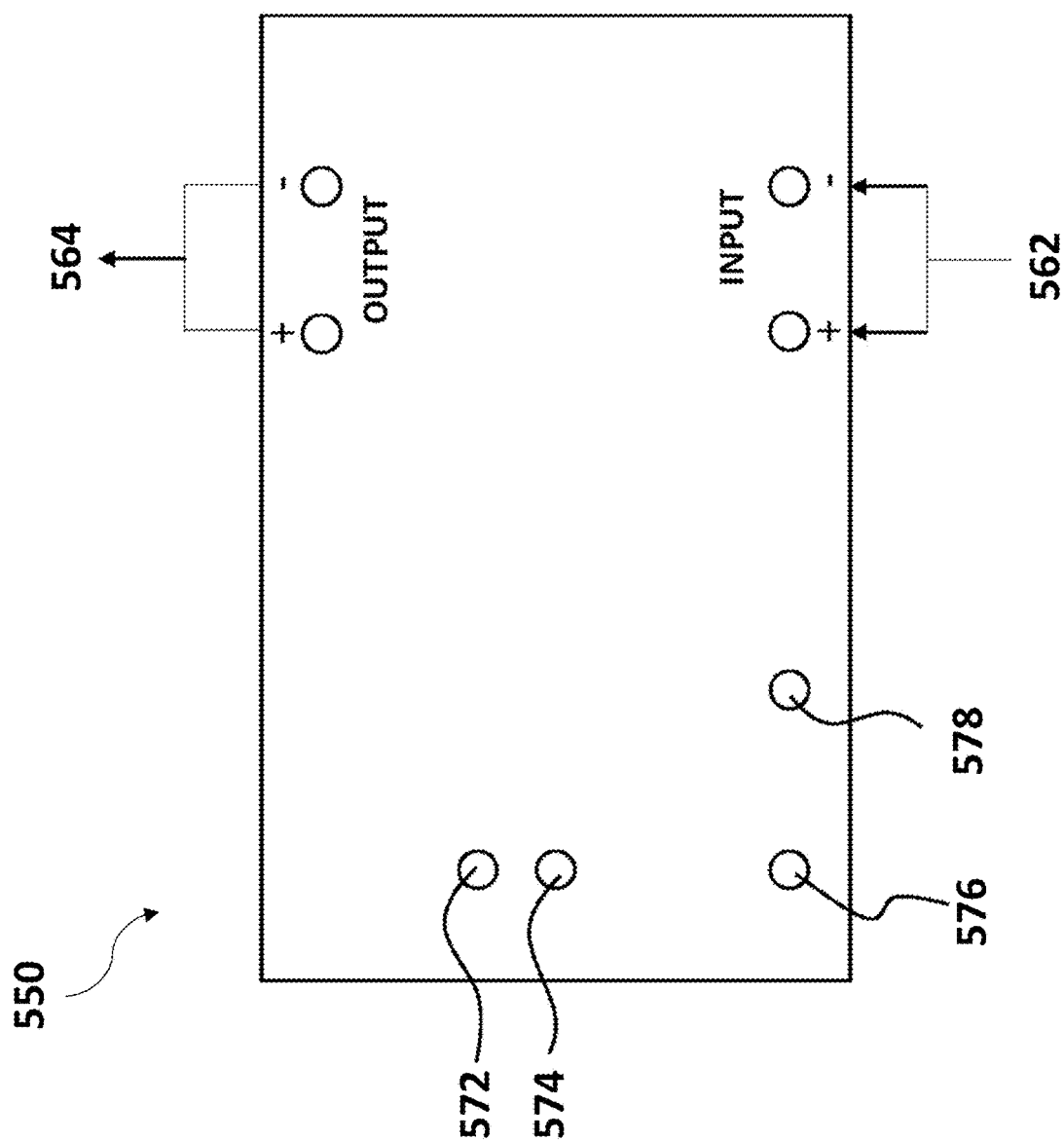
FIG. 12 illustrates a block diagram of the battery protector.

FIG. 12 illustrates a block diagram of the battery protector. The battery protector includes INPUT from the battery 562 and OUTPUT to the DC-DC converter cable 564. A green LED 572 and a red LED 574 provide visual information regarding the current charge status. The battery protector includes a rotary switch 578 to select a desired time or voltage setting. In a preferred embodiment, the battery protector is connected to the vehicle battery using ring terminals. Alternatively, the battery protector is connected to the vehicle battery using alligator clips or a NATO slave adapter.

In one embodiment, the battery protector is a timer set to a time where the load will not drain the vehicle battery (e.g., 2 minutes, 15 minutes, 30 minutes, 1 hour, 2 hours, 3 hours, 4 hours, 5 hours, 8 hours, or 12 hours). Additionally or alternatively, the battery protector is a low voltage disconnect (LVD) that automatically disconnects the load when the vehicle battery voltage falls below a set DC voltage (e.g., 10.6V, 10.8V, 11.0V, 11.2V, 11.4V, 11.6V, 11.8V, 12.0V, 12.1V, or 12.2V for a 12V battery or 19V, 20V, 21V, 21.4V, 22V, 22.5V, 22.8V, 23V, 24V, 24.2V, 25V, or 25.5V for a 24V battery). In one embodiment, the battery protector automatically reconnects the load when the battery voltage returns to a normal value (e.g., above the set DC voltage) after charging. The battery protector automatically detects the vehicle battery voltage (e.g., 12V or 24V) and selects a corresponding set DC voltage (e.g., 11.6V for a 12V battery or 22.8V for a 24V battery) in another embodiment.

The battery protector has overvoltage protection that automatically disconnects the load when the battery protector detects a voltage higher than a set DC voltage (e.g., above 16V) in a preferred embodiment. In one embodiment, the battery protector automatically reconnects the load when the detected voltage falls below the set DC voltage (e.g., below 16V).

The battery protector includes an emergency override switch 576 in one embodiment. This allows the load to charge using the vehicle battery for an additional period of time (e.g., 15 minutes) in an emergency by overriding a timed-out timer.

In a preferred embodiment, the battery protector includes a visual indicator (e.g., LED lights) to indicate a current status. In one embodiment, the battery protector has a green LED light to indicate that the engine is running and the load is charging; a flashing green LED light to indicate that the vehicle engine is off, the timer has started, and the load is charging; a flashing red LED light to indicate that the timer has expired and the load is no longer charging; a slow flashing red LED light to indicate that the vehicle battery voltage is below the set DC voltage and the load is no longer charging; and a solid red light to indicate an overvoltage condition. The battery protector is preferably waterproof. Alternatively, the battery protector is water resistant.

Male Cigarette 600

The system preferably includes a male cigarette source cable 600 operable to connect to a cigarette lighter socket. In one embodiment, the cigarette lighter socket is in a vehicle. Alternatively, the cigarette lighter socket is incorporated into a cable, e.g., a SAE to Car Charger Adapter (e.g., such as one sold by WATERLILY). The cigarette lighter socket preferably is a 12V power source.

Figure 13:
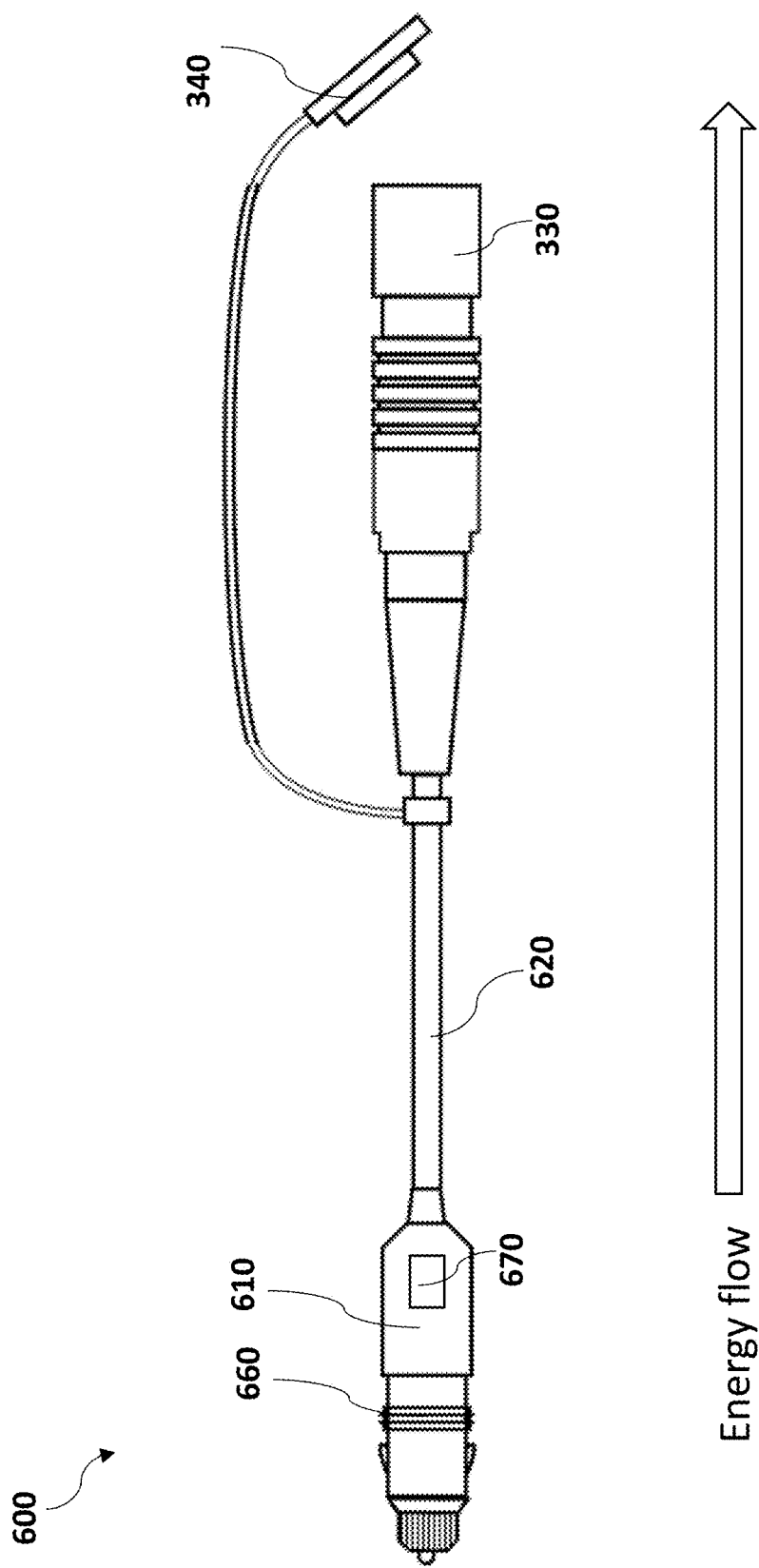
FIG. 13 illustrates one embodiment of a male cigarette source cable for use with the DC-DC conversion system.

FIG. 13 illustrates one embodiment of a male cigarette source cable 600. The male cigarette source cable 600 includes a male cigarette input connector 610, a male cigarette source input cable 620, a source output connector 330, and a source output dust cap 340. The source output connector 330 is operable to mate to the DC-DC input connector of the DC-DC converter. In one embodiment, the source output connector 330 is a FISHER K105 A087 connector. The source output dust cap 340 is operable to protect the source output connector 330 from external elements (e.g., dust, water). In a preferred embodiment, the source output dust cap 340 is molded into a boot of the source output connector 330. The male cigarette source cable 600 preferably includes a weather seal 660 to protect the cigarette lighter socket from external elements (e.g., dust, water). In one embodiment, the male cigarette source cable 600 includes a light emitting diode (LED) indicator 670.

152/148 Battery 700

The system preferably includes a 152/148 battery source cable 700 operable to connect to a battery operable to power an AN/PRC-152 radio or a AN/PRC-148 radio. The 152/148 battery source cable 700 is also preferably operable to connect to a battery operable to power a AN/PRC-161 or a AN/PRC-163 radio.

Figure 14:
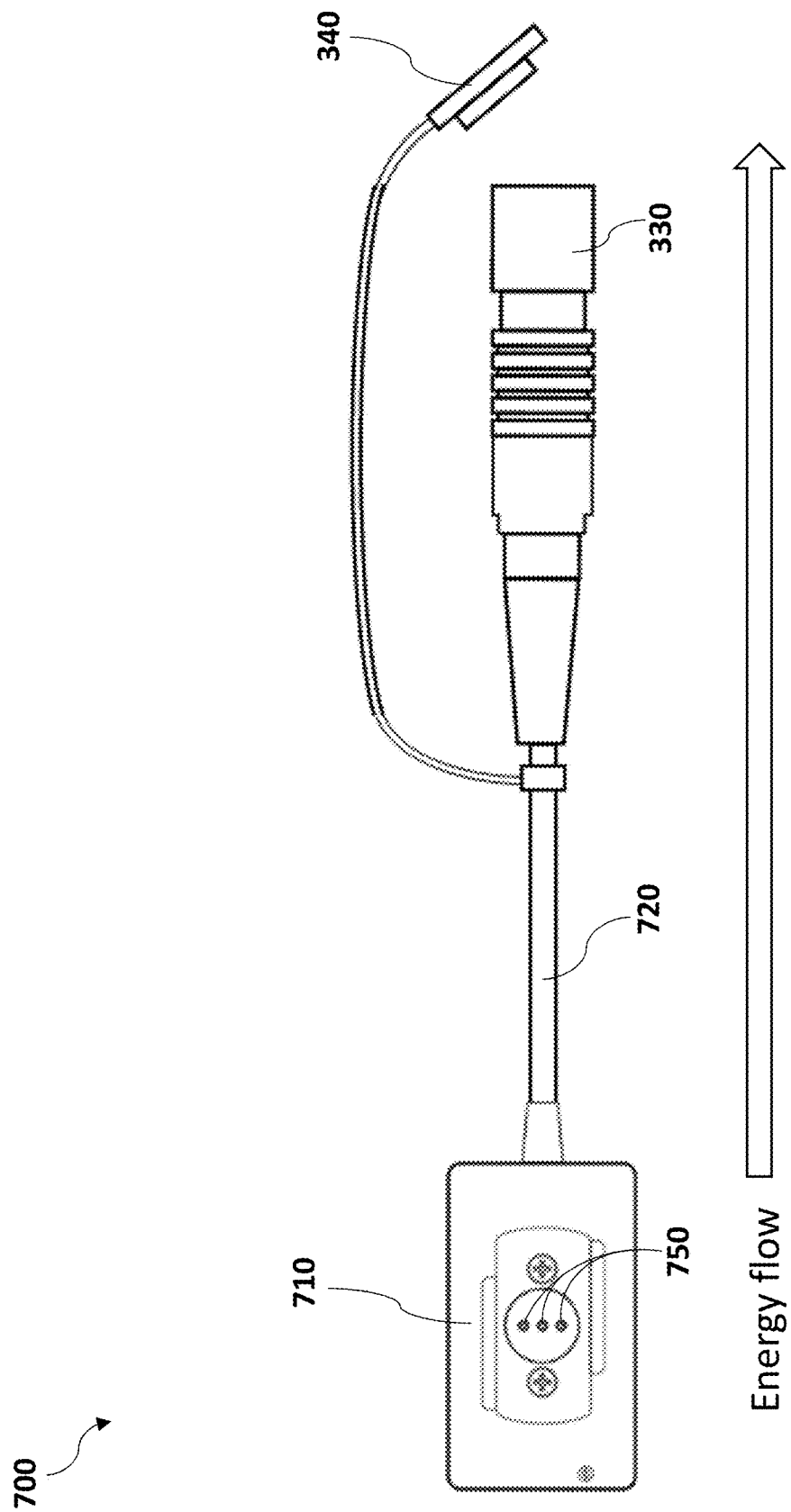
FIG. 14 illustrates one embodiment of AN/PRC-152/PRC-148 ("152/148") battery source cable for use with the DC-DC conversion system.

FIG. 14 illustrates one embodiment of the 152/148 battery source cable 700. The 152/148 battery source cable 700 includes a 152/148 battery input connector 710, a 152/148 battery source input cable 720, a source output connector 330, and a source output dust cap 340. The 152/148 battery input connector includes three voltage output pins 750 (e.g., 750A-750C). The source output connector 330 is operable to mate to the DC-DC input connector of the DC-DC converter. In one embodiment, the source output connector 330 is a FISHER K105 A087 connector. The source output dust cap 340 is operable to protect the source output connector 330 from external elements (e.g., dust, water). In a preferred embodiment, the source output dust cap 340 is molded into a boot of the source output connector 330.

Figure 15A:
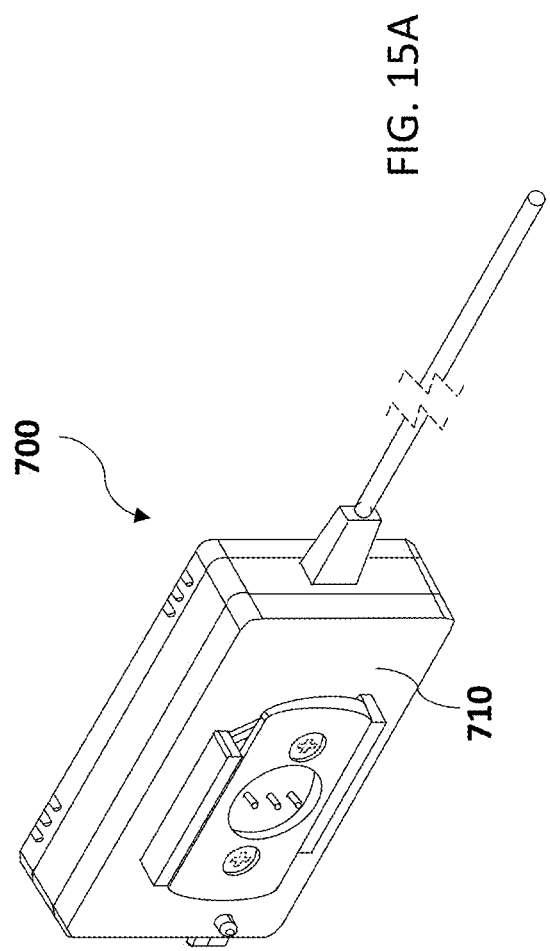
FIG. 15A illustrates an angled perspective view of the 152/148 battery source cable for use with the DC-DC conversion system.
Figure 15B:
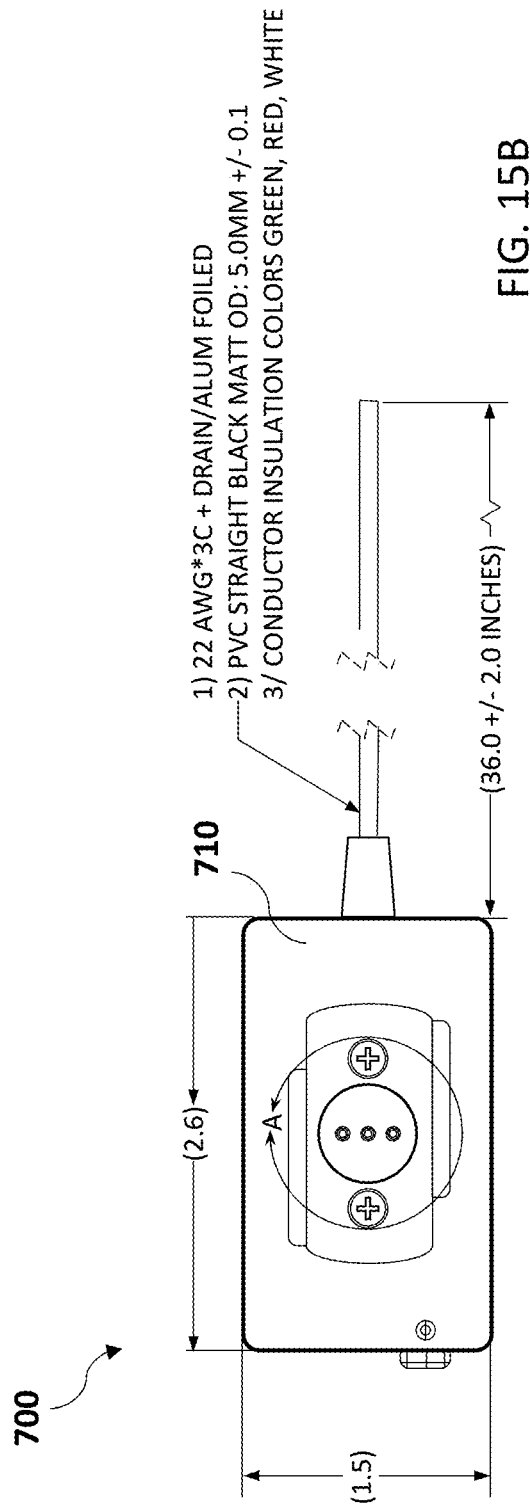
FIG. 15B illustrates a top perspective view of the 152/148 battery source cable for use with the DC-DC conversion system.
Figure 15C:
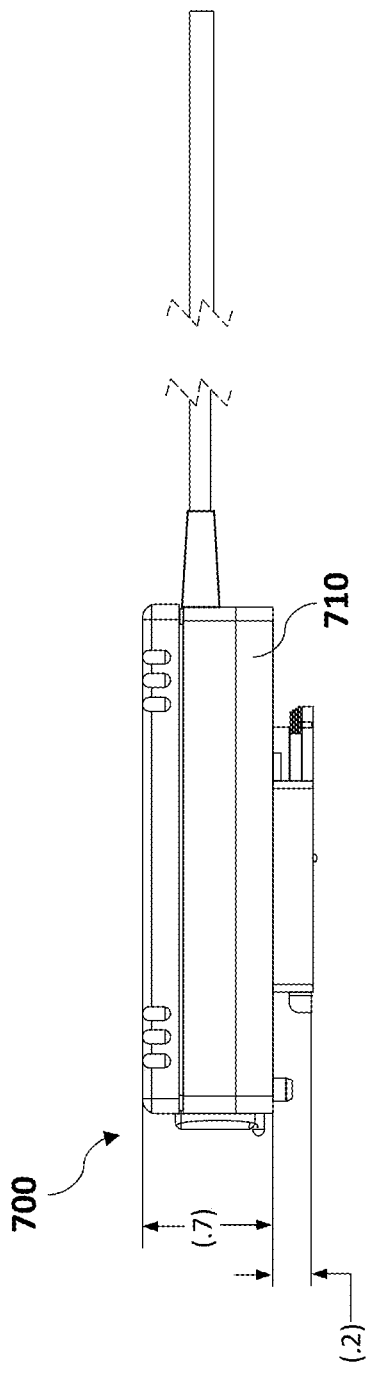
FIG. 15C illustrates a side perspective view of the 152/148 battery source cable for use with the DC-DC conversion system.
Figure 15D:
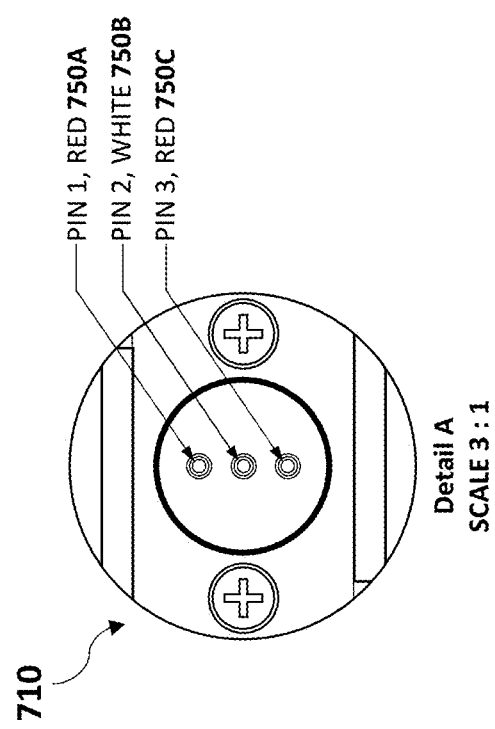
FIG. 15D illustrates a detailed view of the 152/148 battery source cable for use with the DC-DC conversion system.

FIGS. 15A-15D illustrate perspective views of the 152/148 battery source cable 700. FIG. 15A illustrates an angled perspective view of the 152/148 battery source cable 700. FIG. 15B illustrates a top perspective view of the 152/148 battery source cable 700. FIG. 15C illustrates a side perspective view of the 152/148 battery source cable 700. FIG. 15D illustrates a detailed view of the 152/148 battery input connector 710.

As previously mentioned, the DC-DC converter preferably has an input voltage range of between about 9V and about 40V. This is particularly advantageous with respect to batteries for military radios (e.g., AN/PRC-152), which do not have a low voltage cutoff. As a result, it is possible to drain the battery below the operating range of the battery. Other DC-DC conversion systems include an input voltage range beginning at 5V, which is disadvantageous because this will drain the battery below the operating range of the battery and render the battery unusable. Therefore, the system of the present invention provides a cost savings by not rendering expensive military batteries unusable. There is a long-felt, unmet need for a system that protects military batteries from being drained below the operating range of the battery.

Helicopter 800

The system preferably includes a helicopter source cable 800 operable to connect to a utility receptacle 28 VDC. The utility receptacle 28 VDC is present on a helicopter (e.g., UH-60 Black Hawk). Advantageously, the utility receptacle 28 VDC allows for operators to charge the at least one device using the system. For example, the system allows a radio operator to ensure that a battery used to power a radio is fully charged before the radio operator is dropped off for a mission. As a duration of the mission can vary, ensuring the battery is fully charged before drop off protects the radio operator and other soldiers from prematurely losing communications.

Figure 16:
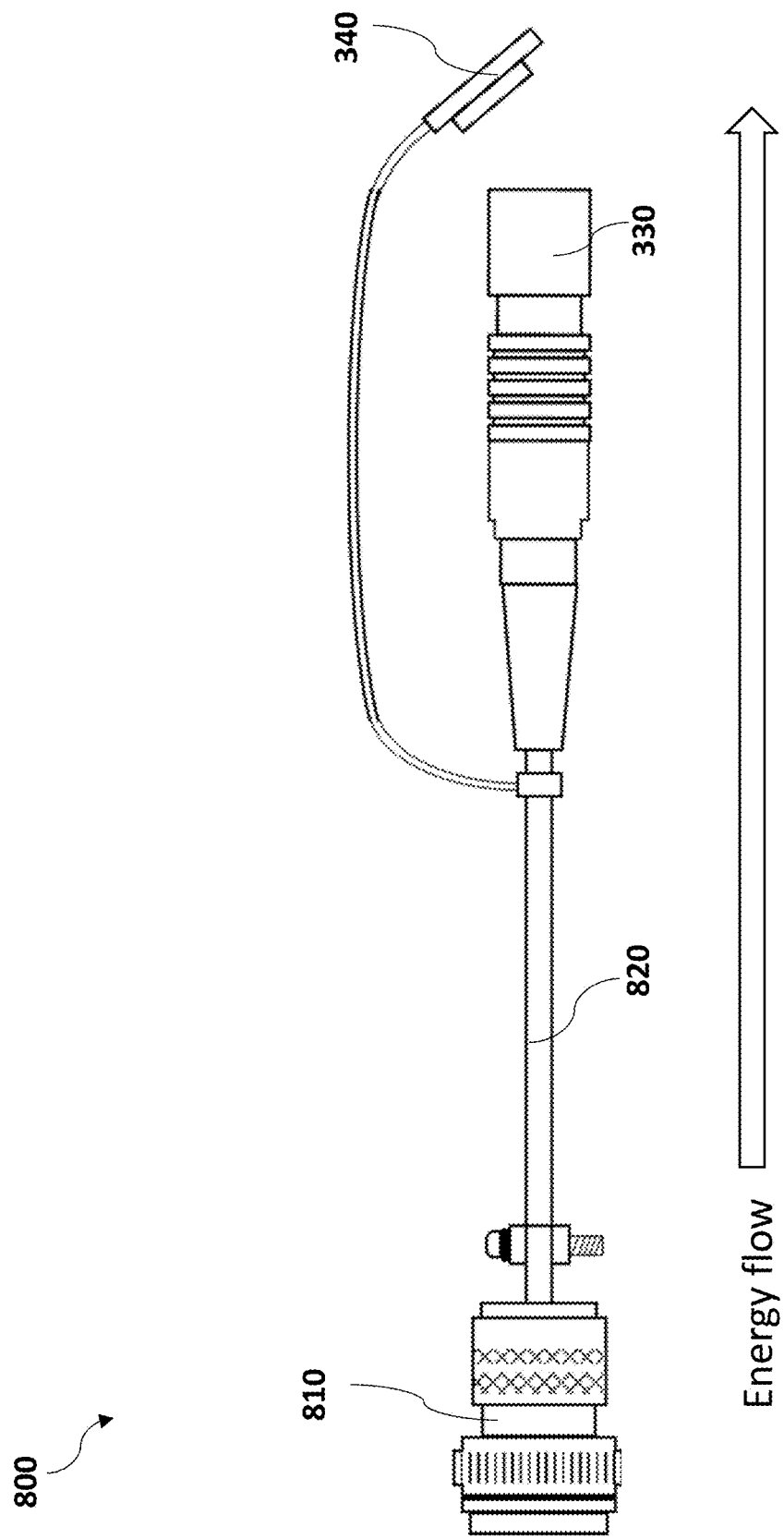
FIG. 16 illustrates one embodiment of a helicopter source cable for use with the DC-DC conversion system.

FIG. 16 illustrates one embodiment of the helicopter source cable 800. The helicopter source cable 800 includes a helicopter input connector 810, a helicopter source input cable 820, a source output connector 330, and a source output dust cap 340. The source output connector 330 is operable to mate to the DC-DC input connector of the DC-DC converter. In one embodiment, the helicopter input connector 810 is a MS3106A16-11P connector available from AMPHENOL. The helicopter input connector 810 preferably conforms to MIL-DTL-5015H (2000) and/or SAE-AS50151 (Jun. 1, 2020), each of which is incorporated herein by reference in its entirety. In one embodiment, the source output connector 330 is a FISHER K105 A087 connector. The source output dust cap 340 is operable to protect the source output connector 330 from external elements (e.g., dust, water). In a preferred embodiment, the source output dust cap 340 is molded into a boot of the source output connector 330.

Figure 17:
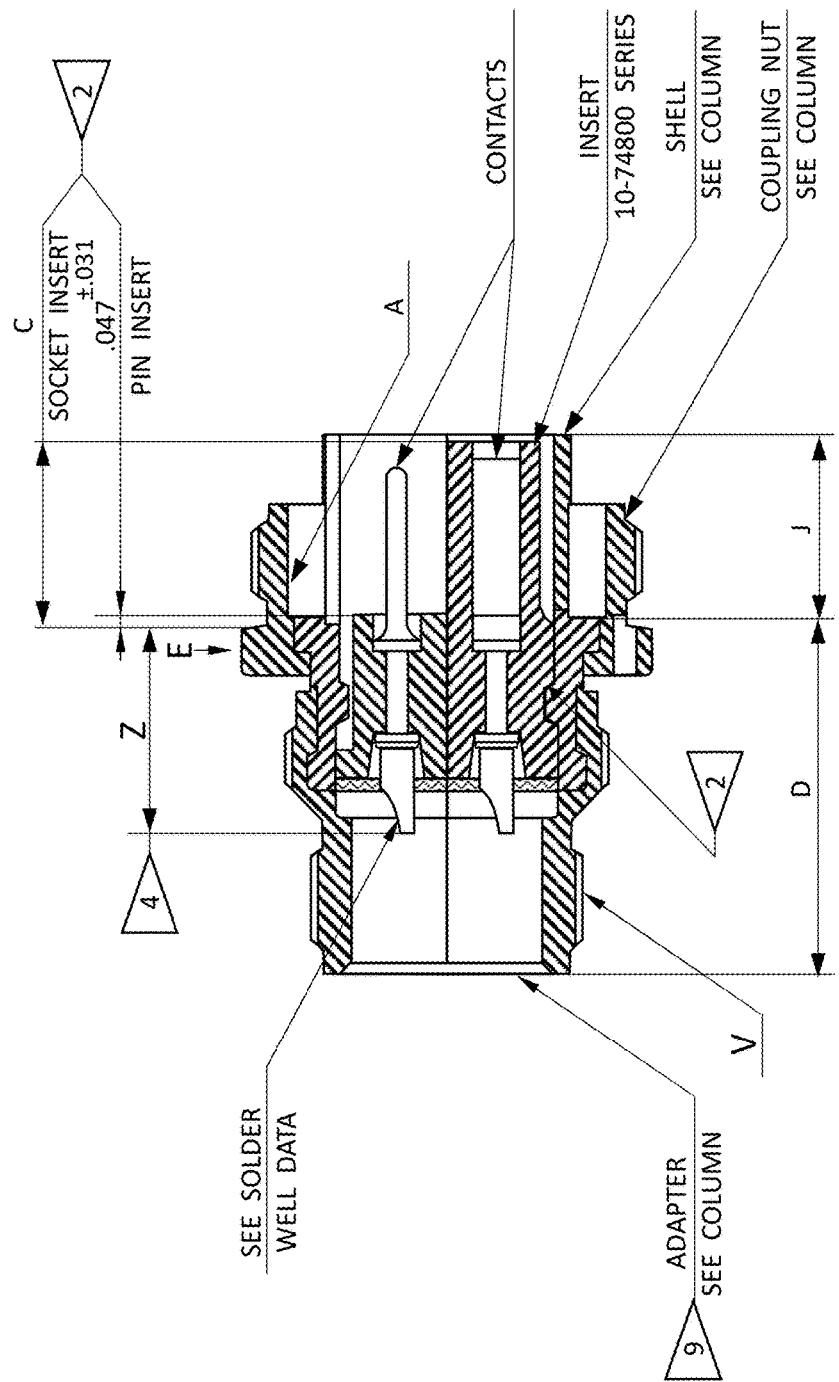
FIG. 17 illustrates a cutaway view of one embodiment of a helicopter input connector of the helicopter source cable.

FIG. 17 illustrates a cutaway view of one embodiment of a helicopter input connector of the helicopter source cable.

Figure 18:
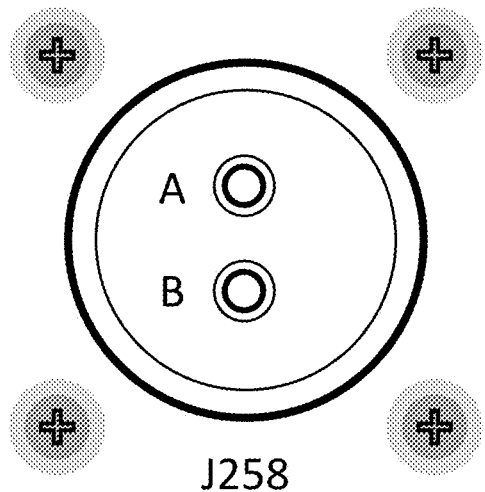
FIG. 18 illustrates one embodiment of the utility receptacle 28 VDC operable to mate with the helicopter source cable of FIG. 16.

FIG. 18 illustrates one embodiment of the utility receptacle 28 VDC operable to mate with the helicopter source cable shown in FIG. 16.

NETT Warrior 900

The system preferably includes a conformal wearable battery source cable 900 operable to connect to a conformal wearable battery. In a preferred embodiment, the conformal wearable battery is a NETT WARRIOR battery.

Figure 19:
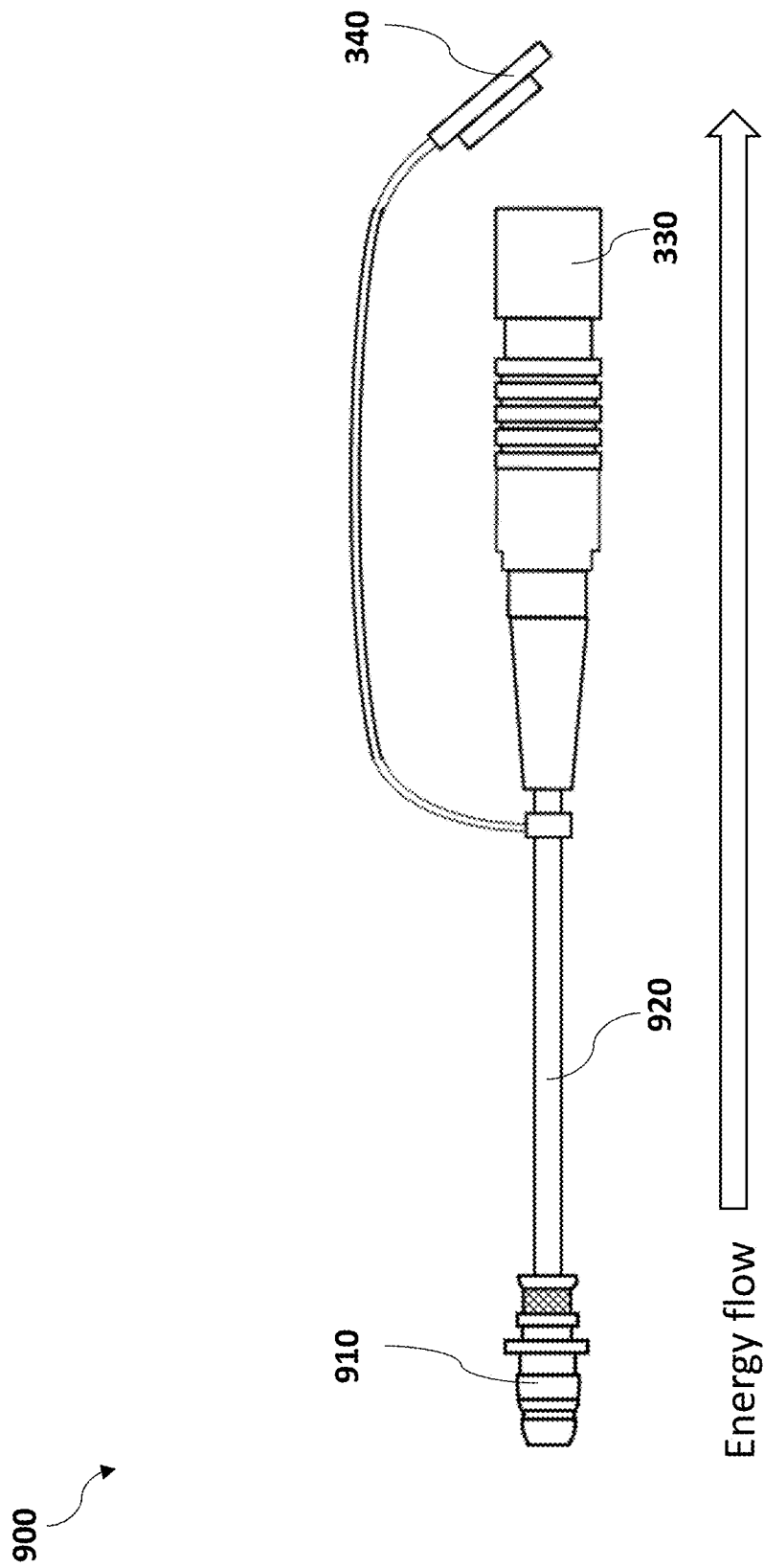
FIG. 19 illustrates one embodiment of the conformal wearable battery source cable for use with the DC-DC conversion system.

FIG. 19 illustrates one embodiment of the conformal wearable battery source cable 900. The conformal wearable battery source cable 900 includes a conformal wearable battery input connector 910, a conformal wearable battery source input cable 920, a source output connector 330, and a source output dust cap 340. The source output connector 330 is operable to mate to the DC-DC input connector of the DC-DC converter. In one embodiment, the conformal wearable battery input connector 910 is a Series 80 MIGHTY MOUSE connector by GLENAIR. In one embodiment, the source output connector 330 is a FISHER K105 A087 connector. The source output dust cap 340 is operable to protect the source output connector 330 from external elements (e.g., dust, water). In a preferred embodiment, the source output dust cap 340 is molded into a boot of the source output connector 330. In one embodiment, the conformal wearable battery source cable 900 includes a conformal wearable battery input dust cap (not shown) operable to protect the conformal wearable battery input connector 910 from external elements (e.g., dust, water). In one embodiment, the conformal wearable battery input dust cap is molded into a boot of the conformal wearable battery input connector 910.

Figure 20A:
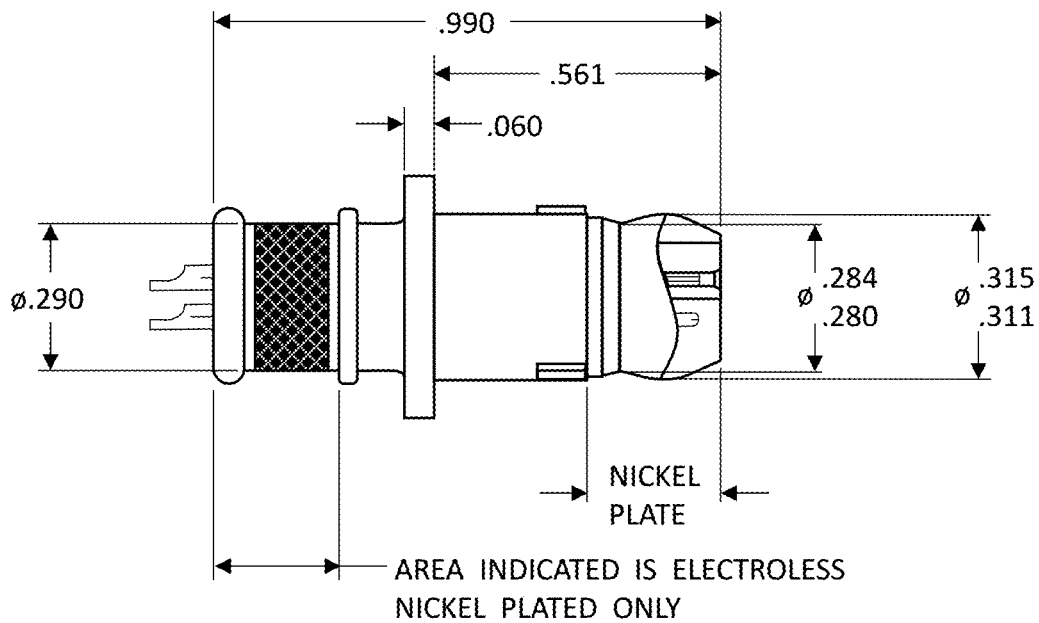
FIG. 20A illustrates a cutaway view of the conformal wearable battery input connector.
Figure 20B:
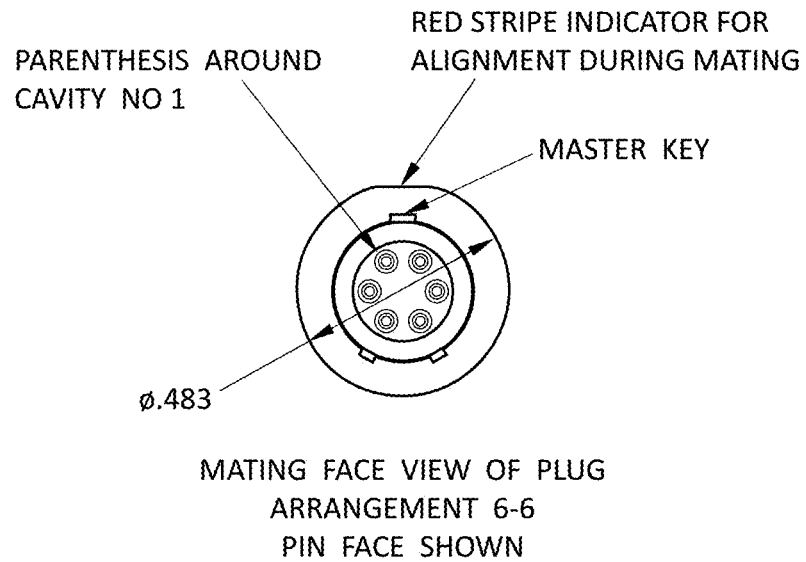
FIG. 20B illustrates an end view of the conformal wearable battery input connector.

FIGS. 20A-20B illustrate perspective views of the conformal wearable battery input connector. FIG. 20A illustrates a cutaway view of the conformal wearable battery input connector. FIG. 20B illustrates an end view of the conformal wearable battery input connector.

17V Output 1000

Figure 21:
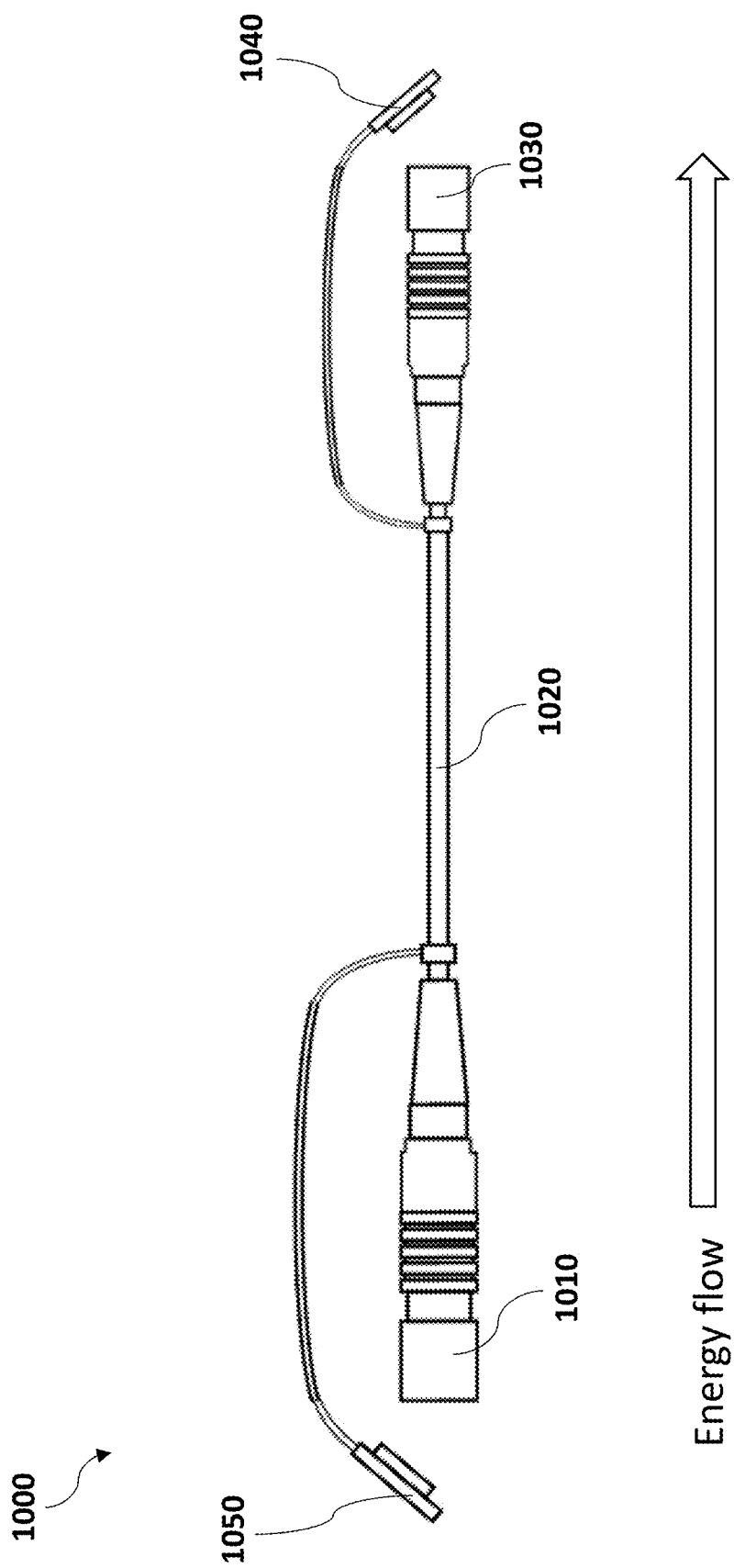
FIG. 21 illustrates one embodiment of a 17V output cable for use with the DC-DC conversion system.

FIG. 21 illustrates one embodiment of a 17V output cable 1000. The 17V output cable 1000 includes a load input connector 1010, a 17V load output cable 1020, a 17V output connector 1030, a 17V output dust cap 1040, and a load input dust cap 1050. The load input connector 1010 is operable to mate to the DC-DC output connector of the DC-DC converter. In one embodiment, the load input connector 1010 is a FISHER S104 A054 connector. In one embodiment, the 17V output connector 1030 is a modified TAJIMI R04-P5m connector. The 17V output dust cap 1040 is operable to protect the 17V output connector 1030 from external elements (e.g., dust, water). The load input dust cap 1050 is operable to protect the load input connector 1010 from external elements (e.g., dust, water). In a preferred embodiment, the 17V output dust cap 1040 is molded into a boot of the 17V output connector 1030. In a preferred embodiment, the load input dust cap 1050 is molded into a boot of the load input connector 1010.

To make the modified TAJIMI R04-P5m connector, a locking ring on a TAJIMI R04-P5m connector is replaced with a floating aluminum guard to protect the connector contact block, but still allow the connector to slip away. This was developed specifically to allow the slip away connector to mate with a DC load connector (e.g., on a portable battery pack) in a non-locking fashion, such that an operator can charge a battery on the portable battery pack while in a vehicle, yet achieve unimpeded, rapid egress if dismounting were suddenly required. Other connectors were attempted to be used with the present invention, but were used exclusively as a charging connector, which reduced flexibility and increased the number of connectors to learn and wear. Advantageously, the modified TAJIMI R04-P5m connector allows an operator to have full capability of in/out power on each connection to the DC load.

As previously mentioned, the 17V output connector 1030 is preferably a slip away connector to allow for rapid egress in mounted to dismounted operations. The 17V output connector 1030 is operable to mate to a portable battery pack and/or a portable power case. Examples of a portable battery are described in U.S. Pat. Nos. 9,780,344, 10,461,289, and 10,531,590, and U.S. Patent Publication Nos. 20180258882, 20190109349, 20200099023, and 20200187379, each of which is incorporated herein by reference in its entirety. Examples of a portable power case are described in U.S. Patent Publication Nos. 20180102656, 20180062197, and 20190081493, each of which is incorporated herein by reference in its entirety.

30V Output 1100

Figure 22:
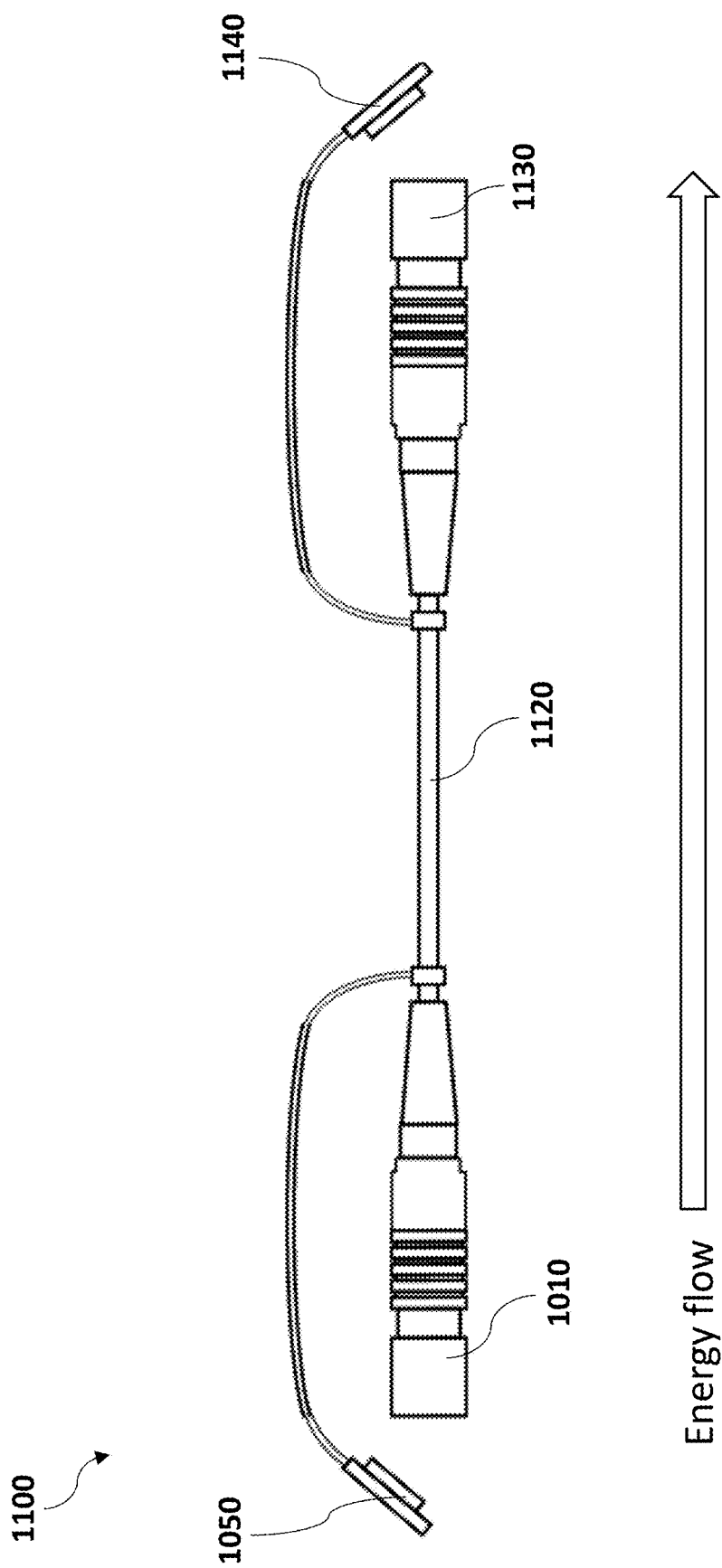
FIG. 22 illustrates one embodiment of a 30V output cable for use with the DC-DC conversion system.

FIG. 22 illustrates one embodiment of a 30V output cable 1100. The 30V output cable 1100 includes a load input connector 1010, a 30V load output cable 1120, a 30V output connector 1130, a 30V output dust cap 1140, and a load input dust cap 1050. The load input connector 1010 is operable to mate to the DC-DC output connector of the DC-DC converter. In one embodiment, the load input connector 1010 is a FISHER S104 A054 connector. In one embodiment, the 30V output connector 1130 is a FISHER SOV 105 A087 connector. The 30V output dust cap 1140 is operable to protect the 30V output connector 1130 from external elements (e.g., dust, water). The load input dust cap 1050 is operable to protect the load input connector 1010 from external elements (e.g., dust, water). In a preferred embodiment, the 30V output dust cap 1140 is molded into a boot of the 30V output connector 1130. In a preferred embodiment, the load input dust cap 1050 is molded into a boot of the load input connector 1010.

The 30V output connector 1130 is preferably a slip away connector to allow for rapid egress in mounted to dismounted operations. The 30V output connector 1130 is operable to mate to a battery and/or a portable power case. Examples of a battery are described in U.S. Patent Publication No. 20170229692, which is incorporated herein by reference in its entirety. Examples of a portable power case are described in U.S. Patent Publication Nos. 20180102656, 20180062197, and 20190081493, each of which is incorporated herein by reference in its entirety.

12V Output 1200

Figure 23:
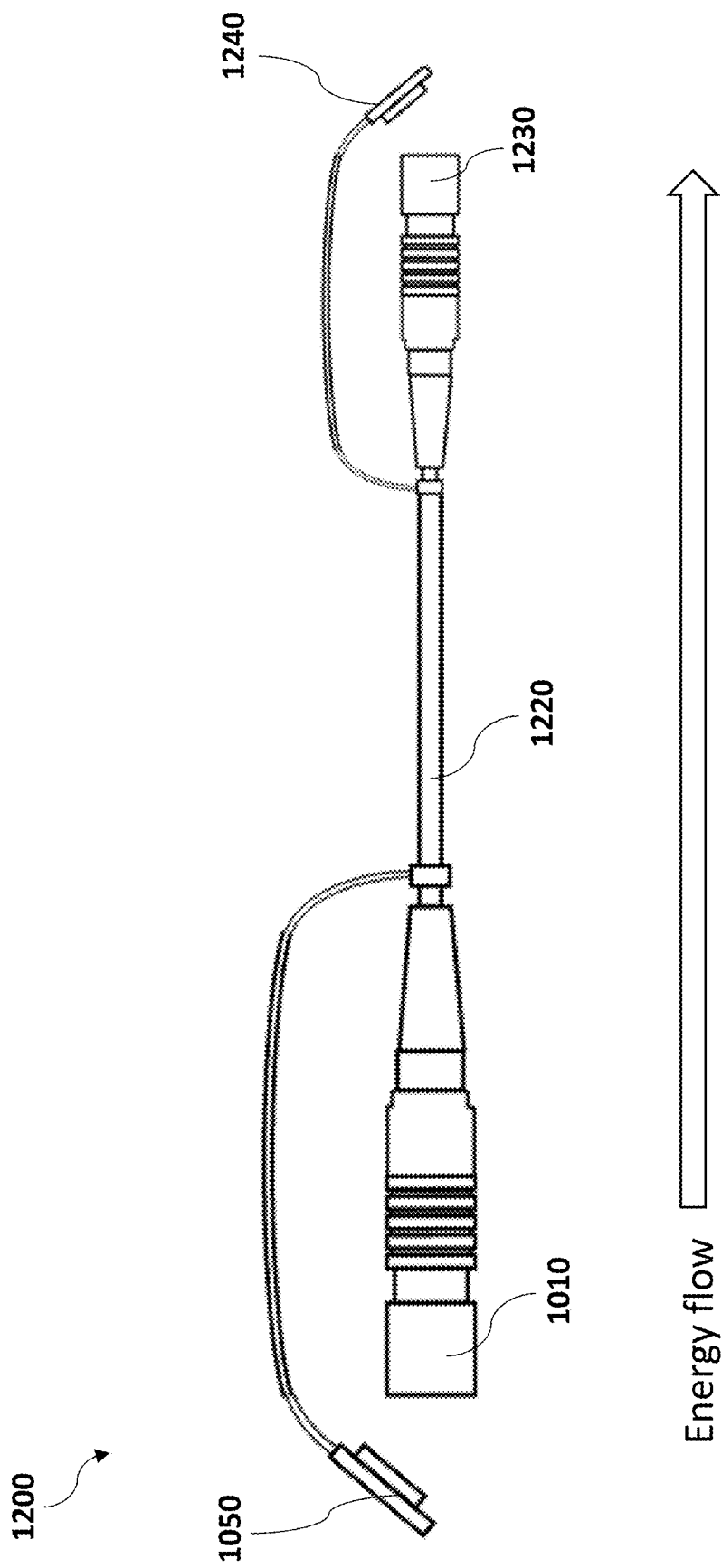
FIG. 23 illustrates one embodiment of a 12V output cable for use with the DC-DC conversion system.

FIG. 23 illustrates one embodiment of a 12V output cable 1200. The 12V output cable 1200 includes a load input connector 1010, a 12V load output cable 1220, a 12V output connector 1230, a 12V output dust cap 1240, and a load input dust cap 1050. The load input connector 1010 is operable to mate to the DC-DC output connector of the DC-DC converter. In one embodiment, the load input connector 1010 is a FISHER S104 A054 connector. In a preferred embodiment, the 12V output connector 1230 has a smaller diameter than a TAJIMI R04-P5m connector. The 12V output dust cap 1240 is operable to protect the 12V output connector 1230 from external elements (e.g., dust, water). The load input dust cap 1050 is operable to protect the load input connector 1010 from external elements (e.g., dust, water). In a preferred embodiment, the 12V output dust cap 1240 is molded into a boot of the 12V output connector 1230. In a preferred embodiment, the load input dust cap 1050 is molded into a boot of the load input connector 1010.

The 12V output connector 1230 is preferably a slip away connector to allow for rapid egress in mounted to dismounted operations. The 12V output connector 1230 is operable to mate to a battery. Examples of a battery are described in U.S. Patent Publication No. 20170229692, which is incorporated herein by reference in its entirety.

34V Output 1300

Figure 24:
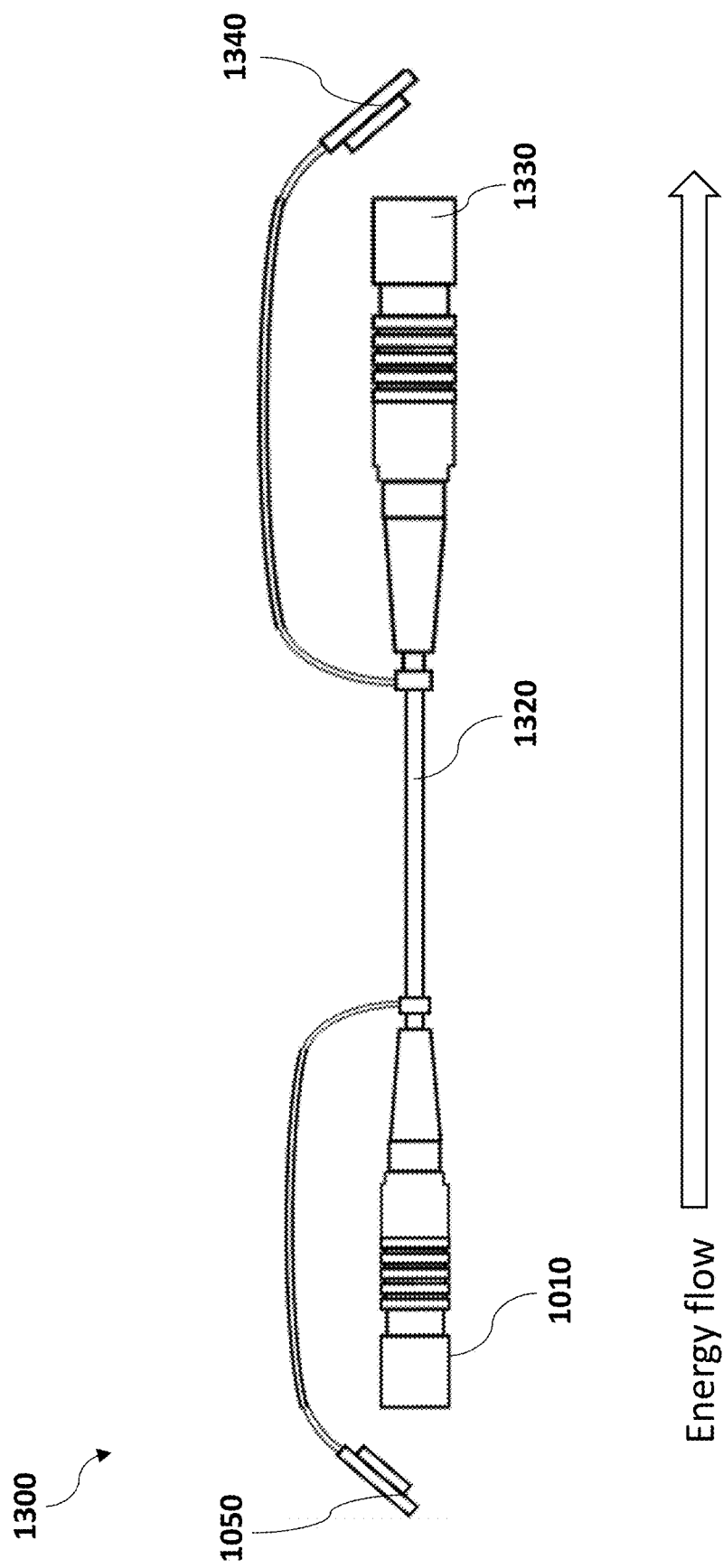
FIG. 24 illustrates one embodiment of a 34V output cable for use with the DC-DC conversion system.

FIG. 24 illustrates one embodiment of a 34V output cable 1300. The 34V output cable 1300 includes a load input connector 1010, a 34V load output cable 1320, a 34V output connector 1330, a 34V output dust cap 1340, and a load input dust cap 1050. The load input connector 1010 is operable to mate to the DC-DC output connector of the DC-DC converter. In one embodiment, the load input connector 1010 is a FISHER S104 A054 connector. In one embodiment, the 34V output connector 1330 is a FISHER 106 series connector. The 34V output dust cap 1340 is operable to protect the 34V output connector 1330 from external elements (e.g., dust, water). The load input dust cap 1050 is operable to protect the load input connector 1010 from external elements (e.g., dust, water). In a preferred embodiment, the 34V output dust cap 1340 is molded into a boot of the 34V output connector 1330. In a preferred embodiment, the load input dust cap 1050 is molded into a boot of the load input connector 1010.

The 34V output connector 1330 is preferably a slip away connector to allow for rapid egress in mounted to dismounted operations. The 34V output connector 1330 is operable to mate to a 33.6V lithium ion battery. In one embodiment, the 34V output connector 1330 is operable to mate to a portable power case. Examples of a portable power case are described in U.S. Patent Publication Nos. 20180102656, 20180062197, and 20190081493, each of which is incorporated herein by reference in its entirety.

Multiple Outputs

In one embodiment, the DC-DC conversion system includes an output cable with at least two output connectors. In one embodiment, the at least two output connectors are for the same voltage. Alternatively, the at least two output connectors are for different voltages (e.g., 17V and 30V).

In one embodiment, the DC-DC conversion system includes at least one dual voltage output cable. The at least one dual output cable is operable to charge a first device (e.g., a first rechargeable battery) with a first voltage (e.g., 17V) and a second device (e.g., a second rechargeable battery) with a second voltage (e.g., 30V). In a preferred embodiment, the at least one dual output cable is operable to sequentially charge the first device with the first voltage (e.g., 17V) and the second device with the second voltage (e.g., 30V). Alternatively, the at least one dual output cable is operable to simultaneously charge the first device with the first voltage (e.g., 17V) and the second device with the second voltage (e.g., 30V).

In a preferred embodiment, the DC-DC conversion system includes a 17V and 30V dual output cable. In another preferred embodiment, the DC-DC conversion system includes a 12V and 17V dual output cable. In still another preferred embodiment, the DC-DC conversion system includes a 30V and 34V dual output cable. In another embodiment, the DC-DC conversion system includes a 12V and 30V dual output cable. In yet another embodiment, the DC-DC conversion system includes a 12V and 34V dual output cable. In one embodiment, the DC-DC conversion system includes a 17V and 34V dual output cable. Other output voltages (e.g., 40V) are compatible with the DC-DC conversion system.

In one embodiment, the DC-DC conversion system includes at least one triple voltage output cable. In a preferred embodiment, the at least one triple voltage output cable is operable to sequentially charge a first device (e.g., a first rechargeable battery) with a first voltage (e.g., 12V), a second device (e.g., a second rechargeable battery) with a second voltage (e.g., 17V), and a third device (e.g., a third rechargeable battery) with a third voltage (e.g., 30V). Alternatively, the at least one dual output cable is operable to simultaneously charge the first device with the first voltage (e.g., 12V), the second device with the second voltage (e.g., 17V), and the third device with the third voltage (e.g., 30V). In a preferred embodiment, the DC-DC conversion system includes a 12V, 17V, and 30V triple output cable. Other output voltages (e.g., 40V) are compatible with the DC-DC conversion system.

Figure 25:
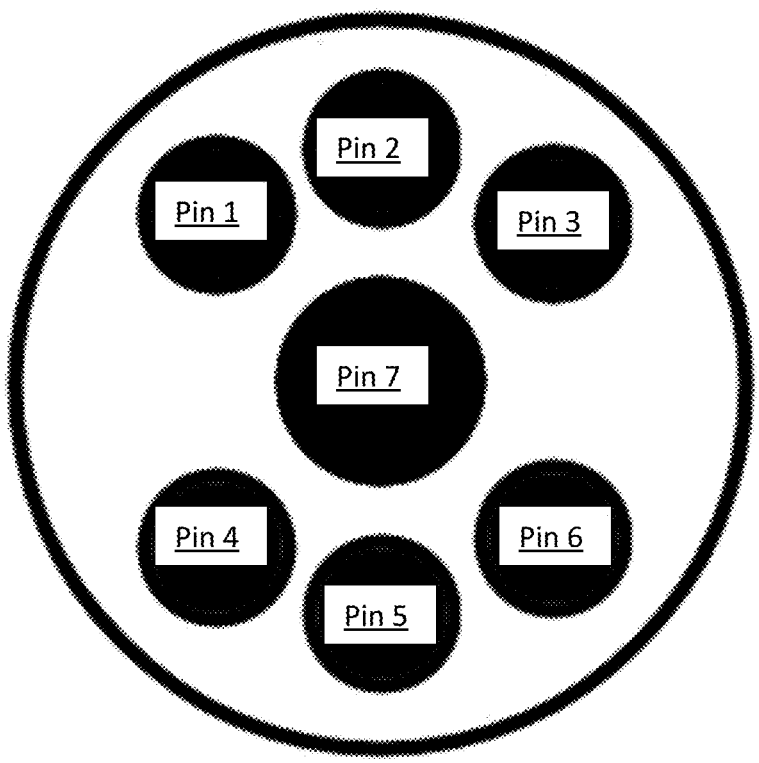
FIG. 25 illustrates one embodiment of a 7-pin connector.

FIG. 25 illustrates one embodiment of a 7-pin connector (e.g., FISCHER S104 A054). In one embodiment, the 7-pin connector is connected to a 4-core cable. In one embodiment, a first wire and a second wire of the 4-core cable are connected to a first pin and a second pin (e.g., Pin 1 and Pin 2), respectively, and a third wire and a fourth wire of the 4-core cable are connected to a third pin and a fourth pin (e.g., Pin 5 and Pin 6), respectively. Advantageously, this allows the output cable to provide two output voltages.

In another embodiment, the 7-pin connector is connected to a 6-core cable. In one embodiment, a first wire and a second wire of the 6-core cable are connected to a first pin and a second pin (e.g., Pin 1 and Pin 2), respectively, a third wire and a fourth wire of the 6-core cable are connected to a third pin and a fourth pin (e.g., Pin 4 and Pin 5), respectively, and a fifth wire and a sixth wire of the 6-core cable are connected to a fifth pin and a sixth pin (e.g., Pin 3 and Pin 6), respectively. Advantageously, this allows the output cable to provide three output voltages.

The system needs to remain simple and intuitive, with operators not having to learn the voltages of their batteries and gear. To maintain this simplicity, the preferred embodiment of the system requires an output cable with multiple voltages to employ only one output voltage at a time. Preferably, only a single device (e.g., rechargeable battery) is connected to the DC-DC converter at a time. The single device determines which voltage is employed.

In another embodiment, the DC-DC conversion system is programmed with a list of preferred voltages. For example, if a first device with a first voltage (e.g., 12V), a second device with a second voltage (e.g., 17V), and a third device with a third voltage (e.g., 30V) are all connected to the DC-DC converter via a triple voltage output cable, the DC-DC conversion system defaults to charge the second device (e.g., 17V), then the third device (e.g., 30V), and then the first device (e.g., 12V).

In yet another embodiment, the DC-DC converter divides the power output such that all connections are recharging at least two devices simultaneously, but at a lower current than a single device would be charged.

17V & 30V Dual Output 1400

Figure 26:
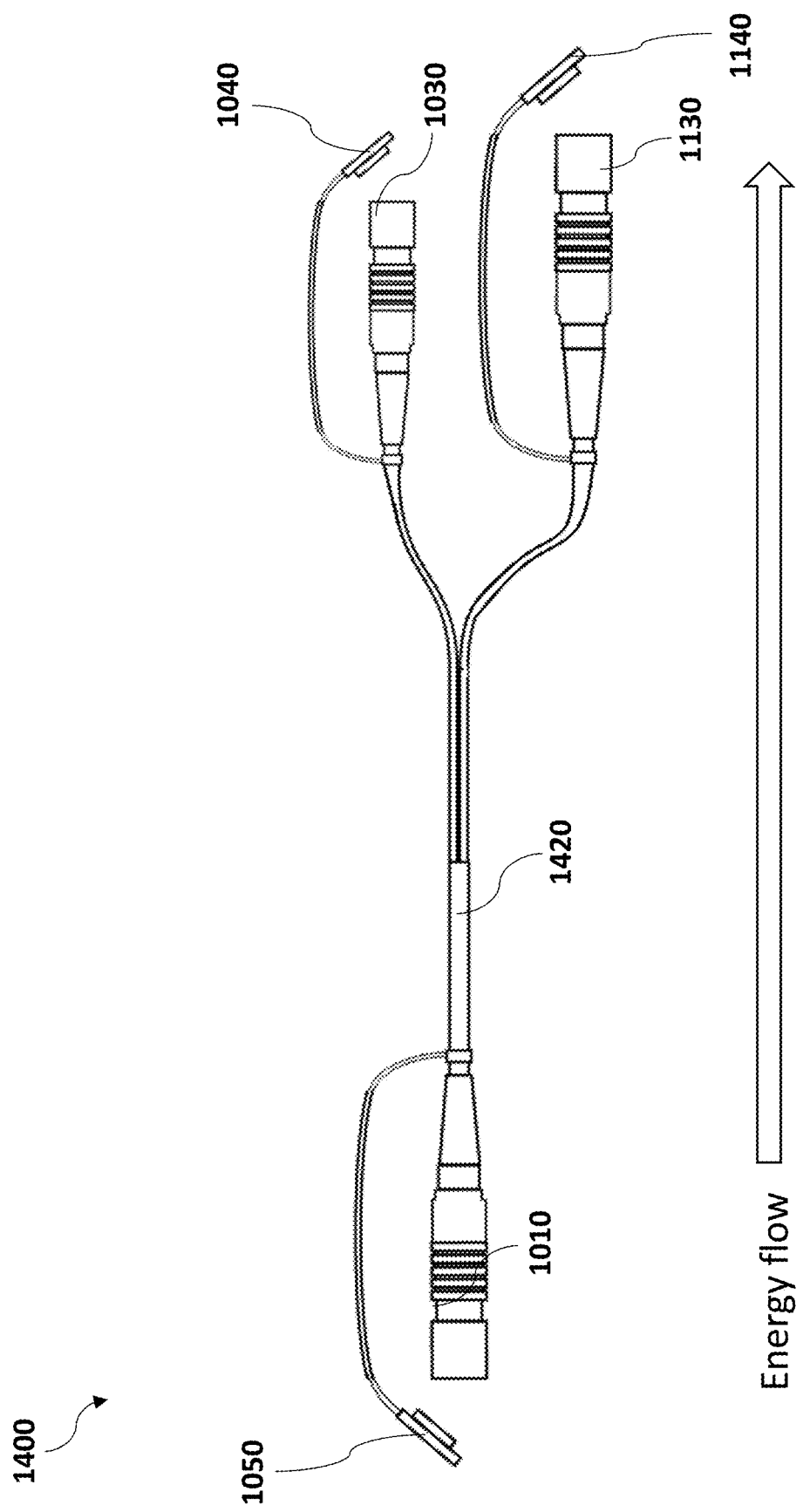
FIG. 26 illustrates one embodiment of a 17V and 30V dual output cable for use with the DC-DC conversion system.

FIG. 26 illustrates one embodiment of a 17V and 30V dual output cable 1400. The 17V and 30V dual output cable 1400 includes a load input connector 1010, a 17V and 30V dual load output cable 1420, a 17V output connector 1030, a 17V output dust cap 1040, a 30V output connector 1130, a 30V output dust cap 1140, and a load input dust cap 1050. The load input connector 1010 is operable to mate to the DC-DC output connector of the DC-DC converter. In one embodiment, the load input connector 1010 is a FISHER S104 A054 connector. As previously described, in one embodiment, the 17V and 30V dual load output cable 1420 is a four-core cable. In one embodiment, the 17V output connector 1030 is a modified TAJIMI R04-P5m connector (described above). The 17V output dust cap 1040 is operable to protect the 17V output connector 1030 from external elements (e.g., dust, water). In one embodiment, the 30V output connector 1130 is a FISHER SOV 105 A087 connector. The 30V output dust cap 1140 is operable to protect the 30V output connector 1130 from external elements (e.g., dust, water). The load input dust cap 1050 is operable to protect the load input connector 1010 from external elements (e.g., dust, water). In a preferred embodiment, the 17V output dust cap 1040 is molded into a boot of the 17V output connector 1030. In a preferred embodiment, the 30V output dust cap 1140 is molded into a boot of the 30V output connector 1130. In a preferred embodiment, the load input dust cap 1050 is molded into a boot of the load input connector 1010.

As can be seen in FIG. 26, the diameter of the 17V output connector 1030 is smaller than the diameter of the 30V output connector 1130. Again, this coordination of higher voltage with larger diameter and lower voltage with smaller diameter makes it intuitive for an operator to use the correct output connector for the correct device (e.g., rechargeable battery, wearable battery, portable power case). Advantageously, this coordination allows an operator to associate the correct output connector with the correct device in the dark. Thus, the output connector is an inherent voltage selector. Further, the operator can quickly connect devices without knowing an operating voltage, thereby maintaining situational awareness and eyes on combat.

12V & 17V Dual Output 1500

Figure 27:
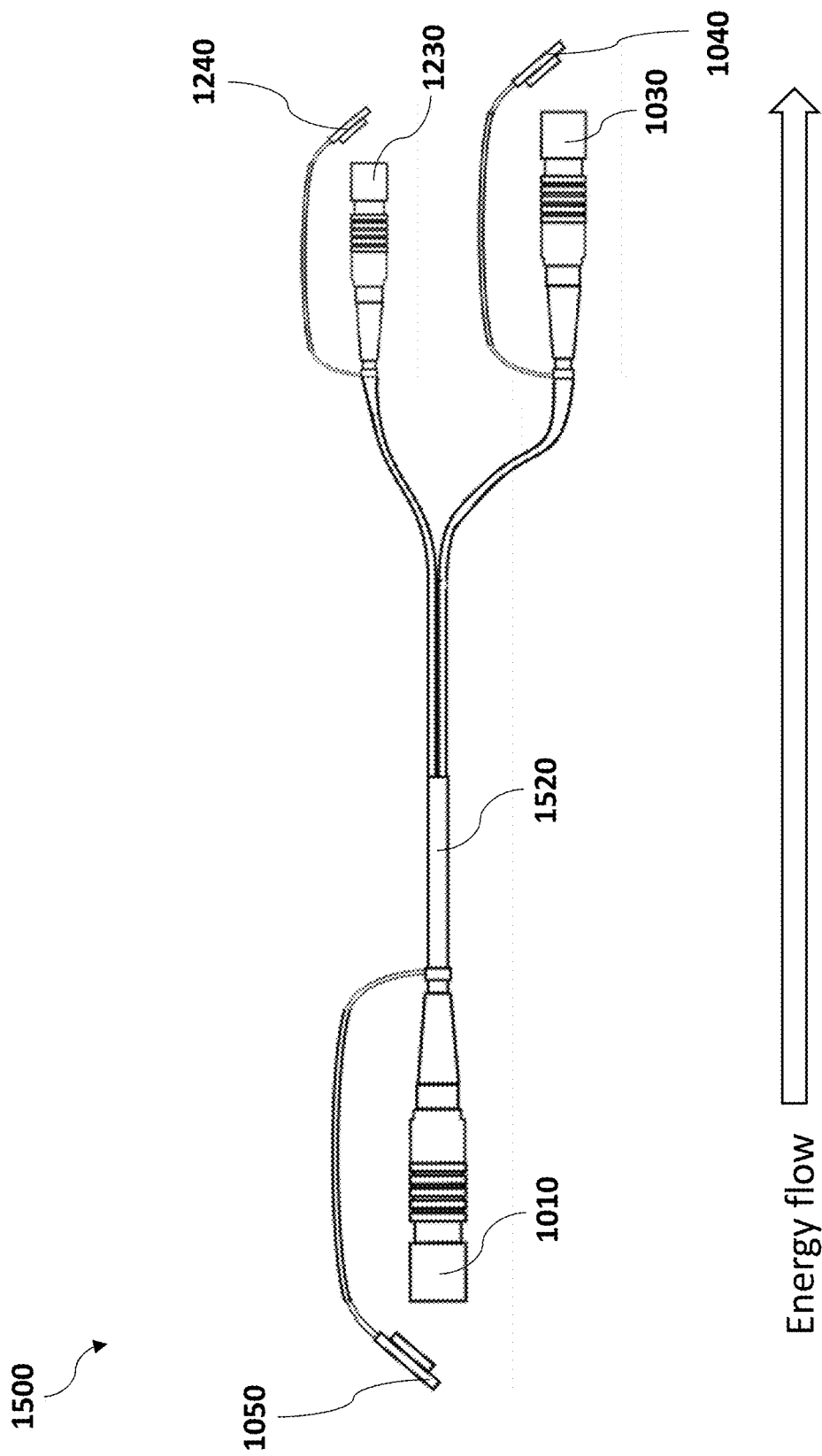
FIG. 27 illustrates one embodiment of a 12V and 17V dual output cable for use with the DC-DC conversion system.

FIG. 27 illustrates one embodiment of a 12V and 17V dual output cable 1500. The 12V and 17V dual output cable 1500 includes a load input connector 1010, a 12V and 17V dual load output cable 1520, a 12V output connector 1230, a 12V output dust cap 1240, a 17V output connector 1030, a 17V output dust cap 1040, and a load input dust cap 1050. The load input connector 1010 is operable to mate to the DC-DC output connector of the DC-DC converter. In one embodiment, the load input connector 1010 is a FISHER S104 A054 connector. As previously described, in one embodiment, the 12V and 17V dual load output cable 1520 is a four-core cable. In a preferred embodiment, the 12V output connector 1230 has a smaller diameter than a TAJIMI R04-P5m connector. The 12V output dust cap 1240 is operable to protect the 12V output connector 1230 from external elements (e.g., dust, water). In one embodiment, the 17V output connector 1030 is a modified TAJIMI R04-P5m connector (described above). The 17V output dust cap 1040 is operable to protect the 17V output connector 1030 from external elements (e.g., dust, water). The load input dust cap 1050 is operable to protect the load input connector 1010 from external elements (e.g., dust, water). In a preferred embodiment, the 17V output dust cap 1040 is molded into a boot of the 17V output connector 1030. In a preferred embodiment, the 12V output dust cap 1240 is molded into a boot of the 12V output connector 1230. In a preferred embodiment, the load input dust cap 1050 is molded into a boot of the load input connector 1010.

As can be seen in FIG. 27, the diameter of the 12V output connector 1230 is smaller than the diameter of the 17V output connector 1030. Again, this coordination of higher voltage with larger diameter and lower voltage with smaller diameter makes it intuitive for an operator to use the correct output connector for the correct device (e.g., rechargeable battery, wearable battery, portable power case). Advantageously, this coordination allows an operator to associate the correct output connector with the correct device in the dark. Thus, the output connector is an inherent voltage selector. Further, the operator can quickly connect devices without knowing an operating voltage, thereby maintaining situational awareness and eyes on combat.

30V & 34V Dual Output 1600

Figure 28:
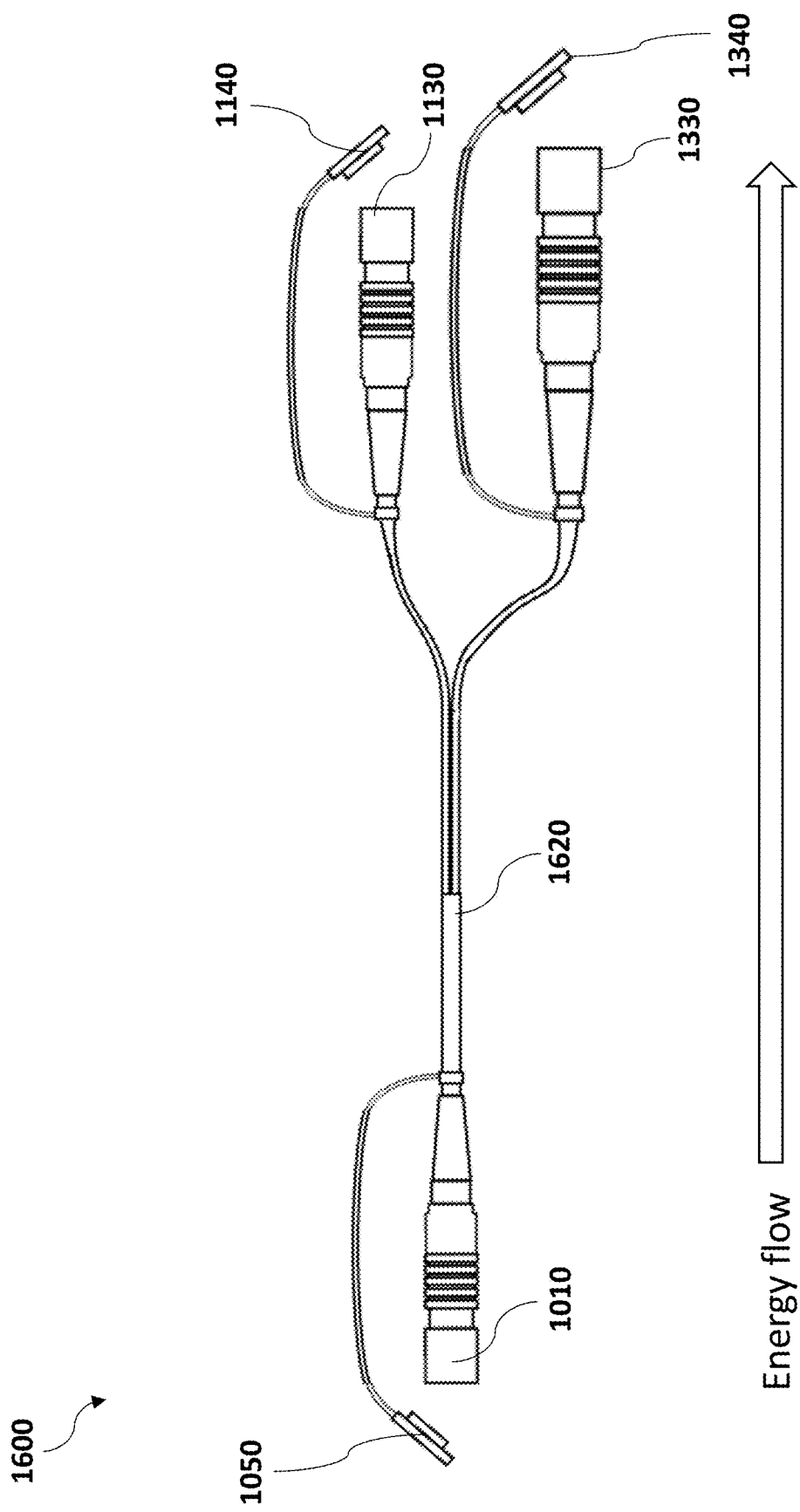
FIG. 28 illustrates one embodiment of a 30V and 34V dual output cable for use with the DC-DC conversion system.

FIG. 28 illustrates one embodiment of a 30V and 34V dual output cable 1600. The and 34V dual output cable 1600 includes a load input connector 1010, a 30V and 34V dual load output cable 1620, a 30V output connector 1130, a 30V output dust cap 1140, a 34V output connector 1330, a 34V output dust cap 1340, and a load input dust cap 1050. The load input connector 1010 is operable to mate to the DC-DC output connector of the DC-DC converter. In one embodiment, the load input connector 1010 is a FISHER S104 A054 connector. As previously described, in one embodiment, the 30V and 34V dual load output cable 1620 is a four-core cable. In one embodiment, the 30V output connector 1130 is a FISHER SOV 105 A087 connector. The 30V output dust cap 1140 is operable to protect the 30V output connector 1130 from external elements (e.g., dust, water). In one embodiment, the 34V output connector 1330 is a FISHER 106 series connector. The 34V output dust cap 1340 is operable to protect the 34V output connector 1330 from external elements (e.g., dust, water). The load input dust cap 1050 is operable to protect the load input connector 1010 from external elements (e.g., dust, water). In a preferred embodiment, the 30V output dust cap 1140 is molded into a boot of the output connector 1130. In a preferred embodiment, the 34V output dust cap 1340 is molded into a boot of the 34V output connector 1330. In a preferred embodiment, the load input dust cap 1050 is molded into a boot of the load input connector 1010.

As can be seen in FIG. 28, the diameter of the 30V output connector 1130 is smaller than the diameter of the 34V output connector 1330. Again, this coordination of higher voltage with larger diameter and lower voltage with smaller diameter makes it intuitive for an operator to use the correct output connector for the correct device (e.g., rechargeable battery, wearable battery, portable power case). Advantageously, this coordination allows an operator to associate the correct output connector with the correct device in the dark. Thus, the output connector is an inherent voltage selector. Further, the operator can quickly connect devices without knowing an operating voltage, thereby maintaining situational awareness and eyes on combat.

12V, 17V, & 30V Triple Output 1700

Figure 29:
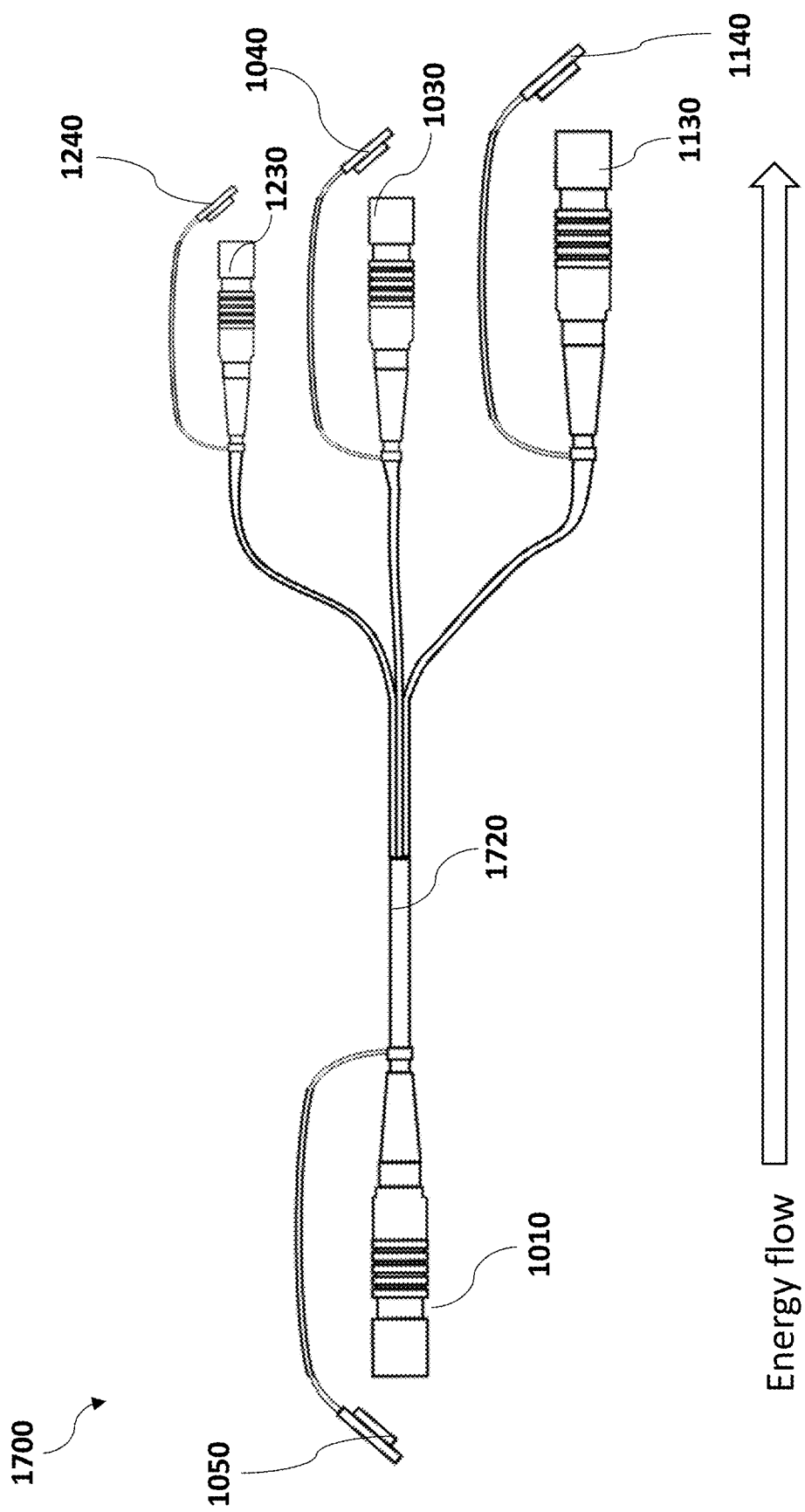
FIG. 29 illustrates one embodiment of a 12V, 17V, and 30V triple output cable for use with the DC-DC conversion system.

FIG. 29 illustrates one embodiment of a 12V, 17V, and 30V triple output cable 1700. The 12V, 17V, and 30V triple output cable 1700 includes a load input connector 1010, a 12V, 17V, and 30V triple load output cable 1720, a 12V output connector 1230, a 12V output dust cap 1240, a 17V output connector 1030, a 17V output dust cap 1040, a 30V output connector 1130, a 30V output dust cap 1140, and a load input dust cap 1050. The load input connector 1010 is operable to mate to the DC-DC output connector of the DC-DC converter. In one embodiment, the load input connector 1010 is a FISHER S104 A054 connector. As previously described, in one embodiment, the 12V, 17V, and 30V triple load output cable 1720 is a six-core cable. In a preferred embodiment, the 12V output connector 1230 has a smaller diameter than a TAJIMI R04-P5m connector. The 12V output dust cap 1240 is operable to protect the 12V output connector 1230 from external elements (e.g., dust, water). In one embodiment, the 17V output connector 1030 is a modified TAJIMI R04-P5m connector (described above). The 17V output dust cap 1040 is operable to protect the 17V output connector 1030 from external elements (e.g., dust, water). In one embodiment, the 30V output connector 1130 is a FISHER SOV 105 A087 connector. The 30V output dust cap 1140 is operable to protect the 30V output connector 1130 from external elements (e.g., dust, water). The load input dust cap 1050 is operable to protect the load input connector 1010 from external elements (e.g., dust, water). In a preferred embodiment, the 12V output dust cap 1240 is molded into a boot of the 12V output connector 1230. In a preferred embodiment, the 17V output dust cap 1040 is molded into a boot of the 17V output connector 1030. In a preferred embodiment, the 30V output dust cap 1140 is molded into a boot of the 30V output connector 1130. In a preferred embodiment, the load input dust cap 1050 is molded into a boot of the load input connector 1010.

As can be seen in FIG. 29, the diameter of the 12V output connector 1230 is smaller than the 17V output connector 1030, which is smaller than the diameter of the 30V output connector 1130. Again, this coordination of higher voltage with larger diameter and lower voltage with smaller diameter makes it intuitive for an operator to use the correct output connector for the correct device (e.g., rechargeable battery, wearable battery, portable power case). Advantageously, this coordination allows an operator to associate the correct output connector with the correct device in the dark. Thus, the output connector is an inherent voltage selector. Further, the operator can quickly connect devices without knowing an operating voltage, thereby maintaining situational awareness and eyes on combat.

17V Quadruple Output 1800

Figure 30:
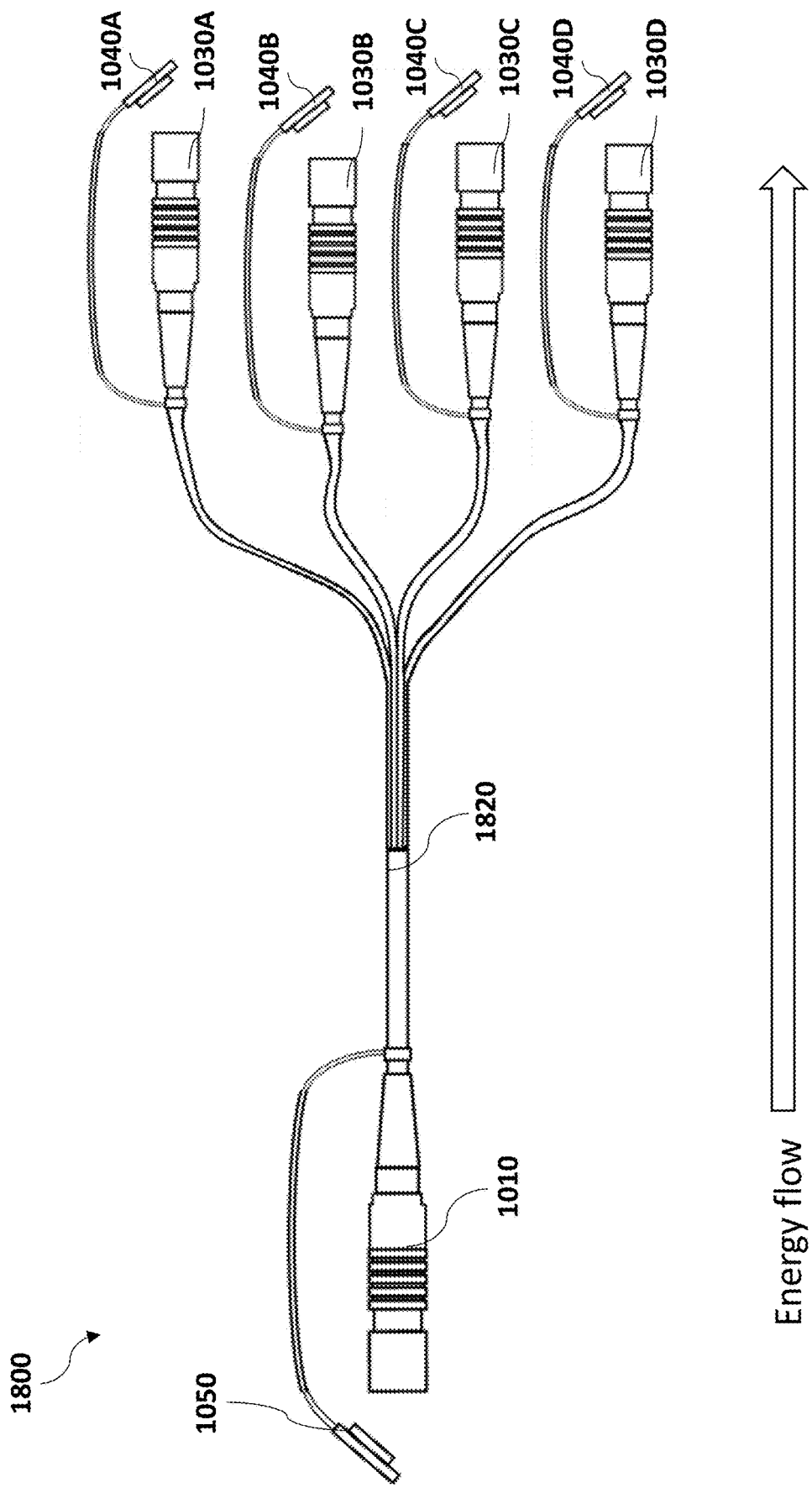
FIG. 30 illustrates one embodiment of a 17V quadruple output cable for use with the DC-DC conversion system.

FIG. 30 illustrates one embodiment of a 17V quadruple output cable 1800. The 17V quadruple output cable 1800 includes a load input connector 1010, a 17V quadruple load output cable 1820, a first 17V output connector 1030A, a first 17V output dust cap 1040A, a second 17V output connector 1030B, a second 17V output dust cap 1040B, a third 17V output connector 1030C, a third 17V output dust cap 1040C, a fourth 17V output connector 1030D, a fourth 17V output dust cap 1040D, and a load input dust cap 1050. The load input connector 1010 is operable to mate to the DC-DC output connector of the DC-DC converter. In one embodiment, the load input connector 1010 is a FISHER S104 A054 connector. In one embodiment, the 17V output connector 1030A-1030D is a modified TAJIMI R04-P5m connector (described above). The 17V output dust cap 1040 (e.g., 1040A-1040D) is operable to protect the 17V output connector 1030 (e.g., 1030A-1030D, respectively) from external elements (e.g., dust, water). The load input dust cap 1050 is operable to protect the load input connector 1010 from external elements (e.g., dust, water). In a preferred embodiment, the 17V output dust cap 1040 (e.g., 1040A-1040D) is molded into a boot of the 17V output connector 1030 (e.g., 1030A-1030D, respectively). In a preferred embodiment, the load input dust cap 1050 is molded into a boot of the load input connector 1010.

The 17V quadruple output cable 1800 is operable to charge multiple batteries (e.g., four portable battery packs) simultaneously. Advantageously, this allows for trickle charging each battery of the four portable battery packs while mostly charged, thereby extending the run time of each battery. Each battery can remain connected to the DC source until dismount is necessary.

Additional Cables

The DC-DC conversion system includes additional conversion cables including, but not limited to, a female cigarette lighter adapter cable, a female charger adapter cable, a male charger adapter cable, a Society of Automobile Engineers (SAE) source cable, at least one dual output cable with two different connectors, and/or at least one Y-splitter.

Female Cigarette Lighter Adapter Cable 1900

Figure 31:
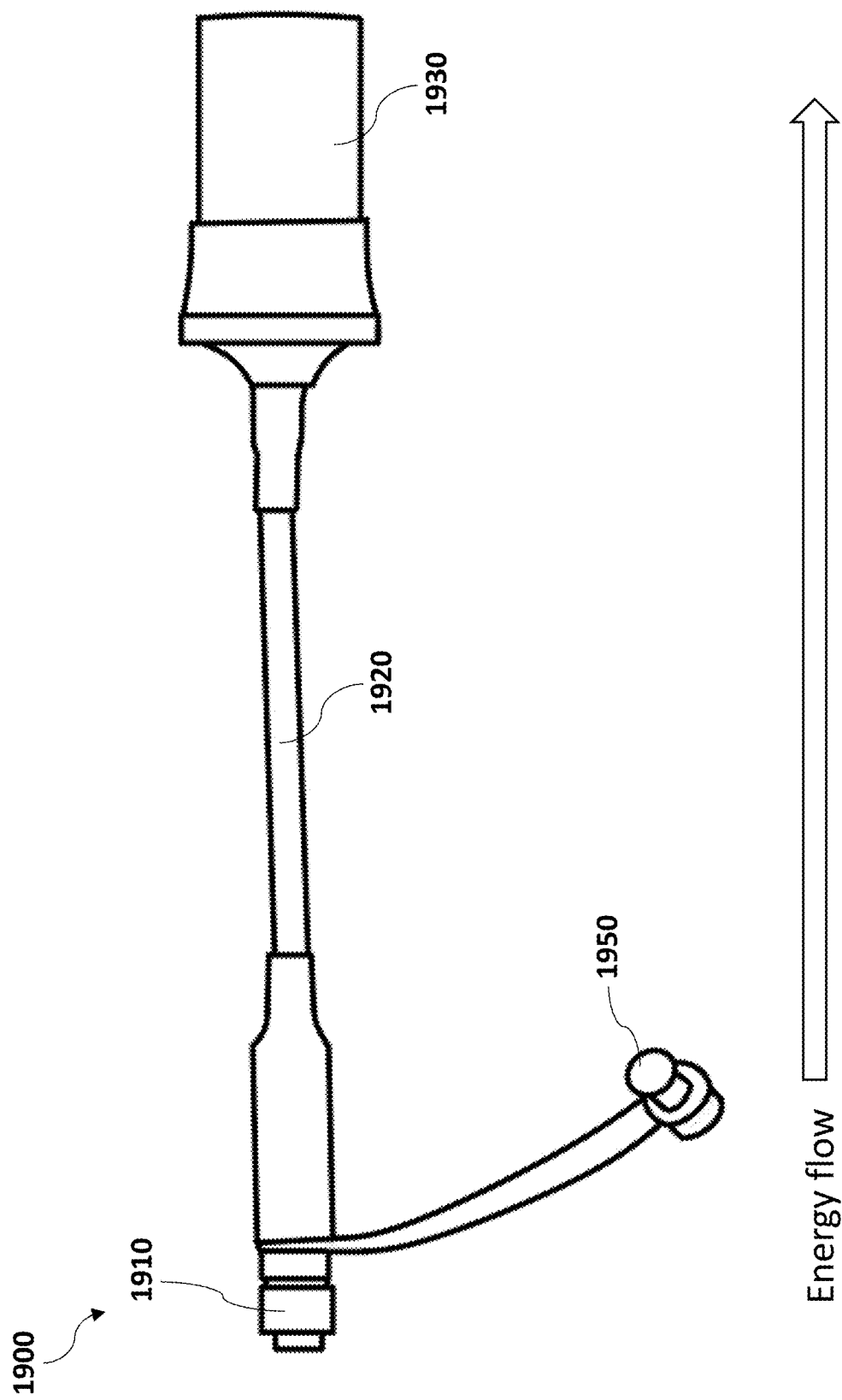
FIG. 31 illustrates one embodiment of a female cigarette lighter adapter cable.

FIG. 31 illustrates one embodiment of a female cigarette lighter adapter cable 1900. The female cigarette lighter adapter cable 1900 includes a female cigarette lighter input connector 1910, a female cigarette lighter input cable 1920, a female cigarette lighter output connector 1930, and a female cigarette lighter input dust cap 1950. In a preferred embodiment, the female cigarette lighter input connector 1910 is a modified TAJIMI R04-P5m connector (described above). The female cigarette lighter input connector 1910 is operable to mate to an output connector on a portable battery pack. The female cigarette lighter input dust cap 1950 is operable to protect the female cigarette lighter input connector 1910 from external elements (e.g., dust, water). In a preferred embodiment, the female cigarette lighter input connector 1910 is molded into a boot of the female cigarette lighter input dust cap 1950 as shown in FIG. 31. In one embodiment, the female cigarette lighter adapter cable 1900 further includes a female cigarette lighter output dust cap operable to protect the female cigarette lighter output connector 1930 from external elements (e.g., dust, water).

Advantageously, the female cigarette lighter adapter cable 1900 allows for charging of any device via a male cigarette lighter adapter (e.g., connected to a flexible omnidirectional lead of a battery of a portable battery pack) including, but not limited to, a smartphone, a tablet, a laptop, a hand tool, a drone battery, a laser target designator, a laser range finder, a fishfinder, and/or a global positioning system (GPS) device. Additionally, the female cigarette lighter adapter cable 1900 allows for harvesting energy from a battery with a mating connector (e.g., a flexible omnidirectional lead of a battery of a portable battery pack) via the male cigarette lighter adapter. Thus, the female cigarette lighter adapter cable 1900 is operable to be used on both the source side and the load side of the DC-DC connector.

Female Charger Adapter Cable 2000

Figure 32:
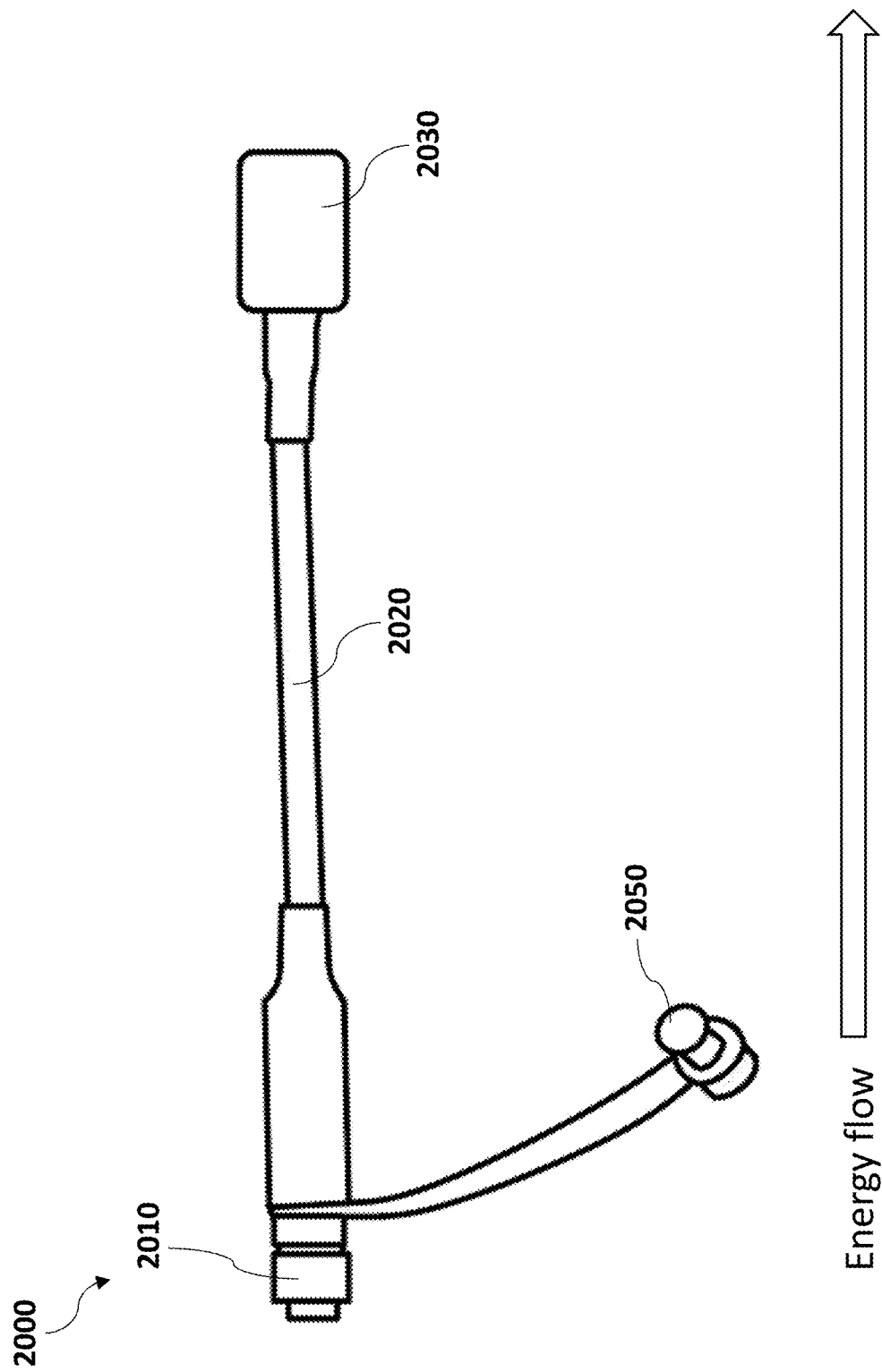
FIG. 32 illustrates one embodiment of a female charger adapter cable

FIG. 32 illustrates one embodiment of a female charger adapter cable 2000. The female charger adapter cable 2000 includes a female charger input connector 2010, a female charger input cable 2020, a female charger output connector 2030, and a female charger input dust cap 2050. In a preferred embodiment, the female charger input connector 2010 is a modified TAJIMI R04-P5m connector (described above). The female charger input connector 2010 is operable to mate to an output connector on a portable battery pack. The female charger output connector 2030 is preferably a female universal serial bus (USB) connector as shown in FIG. 32. As USB is often used to charge devices, this embodiment has compatibility with multiple different charging cables and is likely to be compatible with future charging technologies. Alternatively, the female charger output connector 2030 is a female micro USB, LIGHTNING, and/or FIREWIRE connector. The female charger input dust cap 2050 is operable to protect the female charger input connector 2010 from external elements (e.g., dust, water). In a preferred embodiment, the female charger input connector 2010 is molded into a boot of the female charger input dust cap 2050 as shown in FIG. 32.

Advantageously, the female charger adapter cable 2000 allows for charging of any device via a mating male connector and/or a mating male charging cable including, but not limited to, a smartphone, a tablet, a laptop, an electric toothbrush, personal care devices, a camera (e.g., GOPRO), a satellite phone, a laser target designator, a laser range finder, a global positioning system (GPS) device, a power distribution and data hub, a mesh network adapter (e.g., GOTENNA), and/or a survey device (e.g., TRIMBLE TSC3).

Male Charger Adapter Cable 2100

Figure 33:
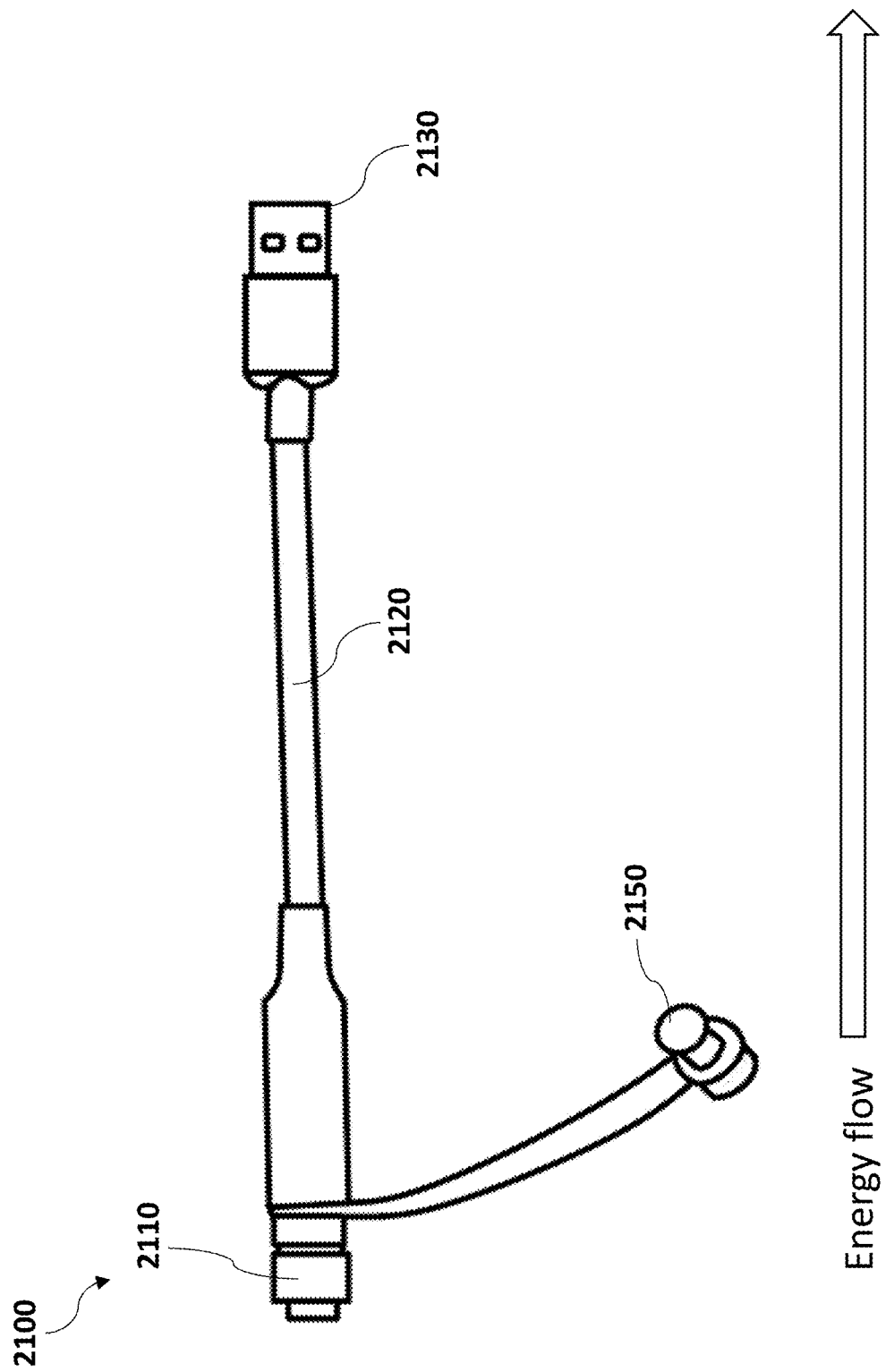
FIG. 33 illustrates one embodiment of a male charger adapter cable

FIG. 33 illustrates one embodiment of a male charger adapter cable 2100. The male charger adapter cable 2100 includes a male charger input connector 2110, a male charger input cable 2120, a male charger output connector 2130, and a male charger input dust cap 2150. In a preferred embodiment, the male charger input connector 2110 is a modified TAJIMI R04-P5m connector (described above). The male charger input connector 2110 is operable to mate to an output connector on a portable battery pack. The male charger output connector 2130 is a male universal serial bus (USB) (as shown in FIG. 33), micro USB, LIGHTNING, and/or FIREWIRE connector. The male charger input dust cap 2150 is operable to protect the male charger input connector 2110 from external elements (e.g., dust, water). In a preferred embodiment, the male charger input connector 2110 is molded into a boot of the male charger input dust cap 2150 as shown in FIG. 33.

Advantageously, the male charger adapter cable 2100 allows for direct charging of any mating device including, but not limited to, a smartphone, a tablet, a satellite phone, a laser range finder, a laser target designator, a drone battery, a global positioning system (GPS) device, a survey device, and/or a laptop.

SAE Source Cable 2200

Figure 34:
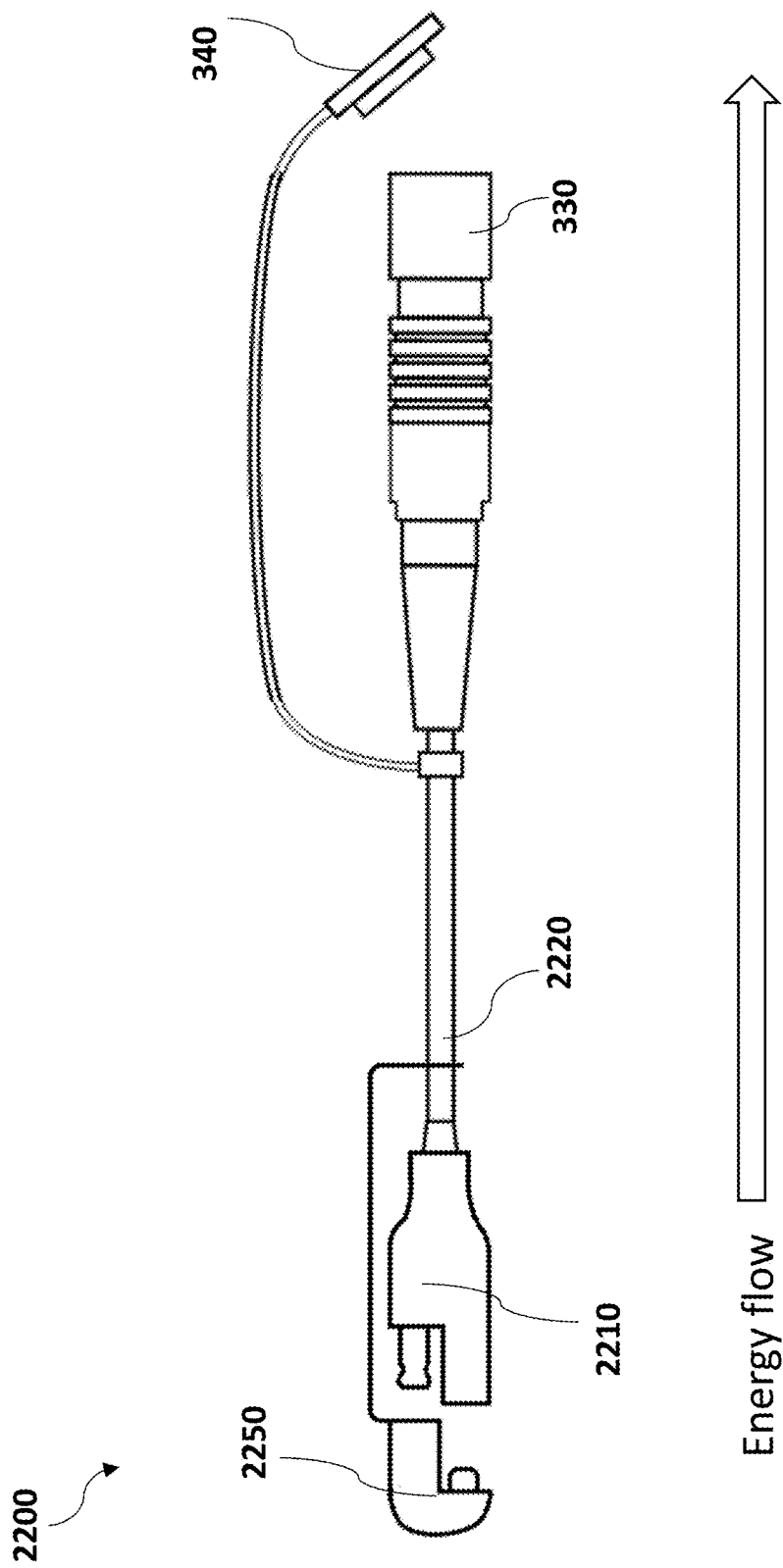
FIG. 34 illustrates one embodiment of a Society of Automobile Engineers (SAE) source cable for use with the DC-DC conversion system.

FIG. 34 illustrates one embodiment of the SAE source cable 2200 operable to connect to an SAE connector on the DC source (e.g., a vehicle battery, a solar panel, a wind device, a trailer, a hydroelectric device). The SAE source cable 2200 includes an SAE input connector 2210, an SAE source input cable 2220, a source output connector 330, a source output dust cap 340, and an SAE input connector dust cap 2250. The source output connector 330 is operable to mate to the DC-DC input connector of the DC-DC converter. In one embodiment, the source output connector 330 is a FISHER K105 A087 connector. The source output dust cap 340 is operable to protect the source output connector 330 from external elements (e.g., dust, water). In a preferred embodiment, the source output dust cap 340 is molded into a boot of the source output connector 330. The SAE input dust cap 2250 protects the SAE input connector 2210 from external elements (e.g., dust, water). In one embodiment, the SAE input dust cap 2250 is molded into a boot of the SAE input connector 2210.

Dual Output Cables and Y-Splitters

In one embodiment, the at least one output cable includes at least one dual output cable. In one embodiment, the at least one dual output cable includes a load input connector, a first load output connector, and a second load output connector. The load input connector is operable to mate to the DC-DC output connector of the DC-DC converter. In one embodiment, the load input connector is a FISHER S104 A054 connector. The first load output connector and/or the second load output connector includes, but is not limited to, a 17V output connector, a 30V output connector, a 12V output connector, a 34V output connector, a female USB connector, a female cigarette lighter adapter, a laptop adapter (e.g., for a PANASONIC TOUGHBOOK), a 152/148 battery input connector, a laser target designator input connector, a speaker box input connector, a rangefinder (e.g., Pocket Laser Range Finder (PLRF)) input connector, and/or a laser target designator (e.g., Special Operations Forces Laser Acquisition Marker (SOFLAM), Type 163 Laser Target Designator) input connector. For example, in one embodiment, the dual output cable includes a 17V output connector and a laptop adapter. Advantageously, this allows for charging both a battery of a portable battery pack and a laptop at the same time. In another example, the dual output cable includes a 30V output connector and a laser target designator input connector. Advantageously, this allows for charging both a 30V battery and a laser target designator at the same time.

In a preferred embodiment, the at least one dual output cable includes a load input dust cap. The load input dust cap is operable to protect the load input connector from external elements (e.g., dust, water). In a preferred embodiment, the load input dust cap is molded into a boot of the load input connector. In one embodiment, the at least one dual output cable further includes a first load output dust cap and/or a second load output dust cap. The first load output dust cap and/or the second load output dust cap are operable to protect the first load output connector and/or the second load output connector from external elements (e.g., dust, water), respectively.

In another embodiment, the system includes at least one Y-splitter. The at least one Y-splitter includes a Y-splitter input connector, a Y-splitter first output connector, and a Y-splitter second output connector. The Y-splitter input connector is operable to connect to the load output connector and/or an output connector on the load itself. The Y-splitter input connector, the Y-splitter first output connector, and/or the Y-splitter second output connector include, but are not limited to, a 17V input connector, a 30V input connector, a 12V input connector, a 34V input connector, a 17V output connector, a 30V output connector, a 12V output connector, a 34V output connector, a female USB connector, a female cigarette lighter adapter, a laptop adapter (e.g., for a PANASONIC TOUGHBOOK), a 152/148 battery input connector, a laser target designator input connector, a speaker box input connector, a rangefinder (e.g., Pocket Laser Range Finder (PLRF)) input connector, and/or a laser target designator (e.g., Special Operations Forces Laser Acquisition Marker (SOFLAM), Type 163 Laser Target Designator) input connector. For example, in one embodiment, the Y-splitter input connector is a 17V input connector, the Y-splitter first output connector is a 17V output connector, and the Y-splitter second output connector is a laptop adapter. Advantageously, this allows for charging both a battery of a portable battery pack and a laptop at the same time. In another example, the Y-splitter input connector is a 30V input connector, the Y-splitter first output connector is a 30V output connector, and the Y-splitter second output connector is a laser target designator input connector. Advantageously, this allows for charging both a 30V battery and a laser target designator at the same time.

In a preferred embodiment, the at least one Y-splitter further includes a Y-splitter input dust cap. The Y-splitter input dust cap is operable to protect the Y-splitter input connector from external elements (e.g., dust, water). In a preferred embodiment, the Y-splitter input dust cap is molded into a boot of the Y-splitter input connector. In one embodiment, the at least one Y-splitter further includes a Y-splitter first output dust cap and/or a Y-splitter second output dust cap. The Y-splitter first output dust cap and/or the Y-splitter second output dust cap are operable to protect the Y-splitter first output connector and/or the Y-splitter second output connector from external elements (e.g., dust, water), respectively.

Pouch

In one embodiment, components within the DC-DC conversion system are operable to be stored in a pouch or skin. In some embodiments, the present invention provides a DC-DC conversion system enclosed by, e.g., inside of, a wearable and replaceable pouch or skin, wherein the pouch or skin can be provided in different colors and/or patterns. Namely, a set of multiple interchangeable pouches or skins can be provided with one DC-DC conversion system. This feature is particularly beneficial when it is required that the DC-DC conversion system blend into different environments, such as in military applications. In one example, if the DC-DC conversion system is used in a jungle or wilderness environment, components of the DC-DC conversion system can be placed inside a camouflage pouch or skin. In another example, if the DC-DC conversion system is used in an arctic environment, components of the DC-DC conversion system can be placed inside a white-colored pouch or skin. In yet another example, if the DC-DC conversion system is used in a desert environment, components of the DC-DC conversion system can be placed inside a sand-colored pouch or skin.

Representative camouflages include, but are not limited to, Universal Camouflage Pattern (UCP), also known as ACUPAT or ARPAT or Army Combat Uniform; MULTICAM, also known as Operation Enduring Freedom Camouflage Pattern (OCP); Universal Camouflage Pattern-Delta (UCP-Delta); Airman Battle Uniform (ABU); Navy Working Uniform (NWU), including variants, such as, blue-grey, desert (Type II), and woodland (Type III); MARPAT, also known as Marine Corps Combat Utility Uniform, including woodland, desert, and winter/snow variants; Disruptive Overwhite Snow Digital Camouflage, Urban Digital Camouflage, and Tactical Assault Camouflage (TACAM).

In a preferred embodiment, the pouch is formed of a flexible, durable, and waterproof or at least water-resistant material. For example, the pouch is formed of polyester, polyvinyl chloride (PVC)-coated polyester, vinyl-coated polyester, nylon, canvas, PVC-coated canvas, or polycotton canvas. In one embodiment, the pouch is formed of a material that is laminated to or treated with a waterproofing or water repellant material (e.g., rubber, PVC, polyurethane, silicone elastomer, fluoropolymers, wax, thermoplastic elastomer). Additionally or alternatively, the pouch is treated with a UV coating to increase UV resistance. The exterior finish of the pouch can be any color, such as white, brown, green, orange (e.g., international orange), yellow, black, or blue, or any pattern, such as camouflage, as provided herein, or any other camouflage in use by the military, law enforcement, or hunters. In one embodiment, the exterior of the pouch includes a reflective tape, fabric, or material. Advantageously, the reflective tape, fabric, or material improves visibility of the user in low-light conditions.

In one embodiment, the pouch includes a material for dissipating heat. Examples of a material for dissipating heat are disclosed in US Publication Nos. 20170229692 and 20160112004 and U.S. application Ser. No. 15/664,776, each of which is incorporated herein by reference in its entirety.

In another embodiment, the pouch includes at least one layer of a material to provide resistance to bullets and/or shrapnel. In one embodiment, the at least one layer of a material to provide resistance to bullets and/or shrapnel is formed from an aramid (e.g., KEVLAR®, TWARON®), an ultra-high-molecular-weight polyethylene fiber (UHMWPE) (e.g., SPECTRA®, DYNEEMA®), a polycarbonate (e.g., LEXAN®), a carbon fiber composite material, ceramic, steel, and/or titanium. In another embodiment, the at least one layer of a material to provide resistance to bullets and/or shrapnel is incorporated into the pouch itself. In yet another embodiment, the at least one layer of a material to provide resistance to bullets and/or shrapnel is housed in a built-in pocket inside of the pouch or permanently affixed (e.g., laminated, stitched, adhered) to the pouch.

In a preferred embodiment, the at least one layer of a material to provide resistance to bullets and/or shrapnel is on a first side (i.e., the exterior facing side) of the pouch. Advantageously, this layer protects the contents of the pouch as well as the user when the pouch is a wearable pouch (see, e.g., FIGS. 39-42). This layer also protects the contents of the pouch when the pouch is a rollable pouch (see, e.g., FIGS. 35-38). Additionally or alternatively, the at least one layer of a material to provide resistance to bullets and/or shrapnel is on a second side (i.e., the user facing side) of the pouch. Advantageously, this layer provides additional protection to the user.

Operators make plans for charging their gear in the field based on the resources they believe will be available. In a preferred embodiment, the pouch has at least one clear pocket and at least one band (e.g., elastic band) that are arranged such that the user can see at a glance where a specific adapter cable is, and can verify before the user departs if the kit is complete and, if not, which adapter is missing.

Figure 35:
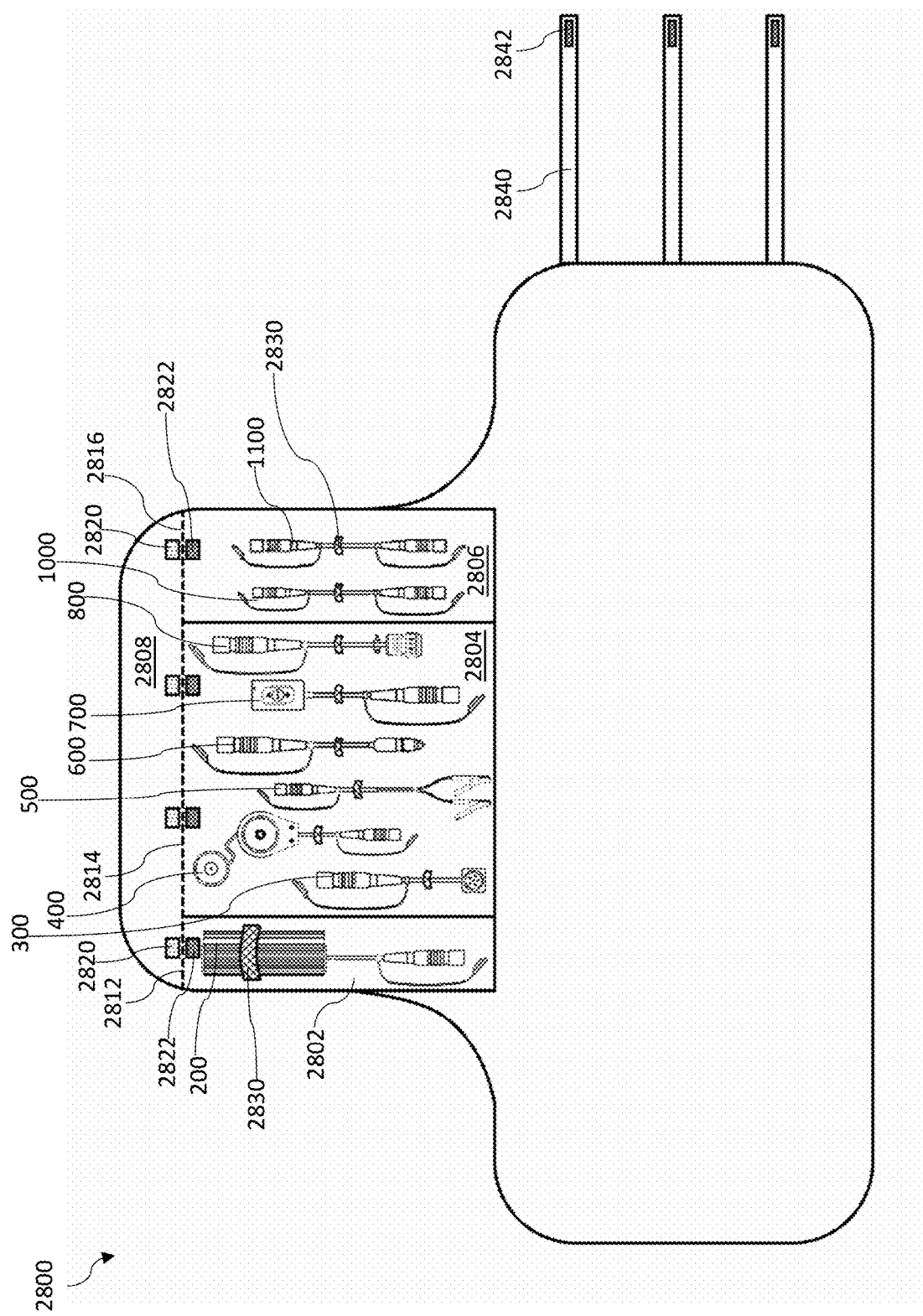
FIG. 35 illustrates one embodiment of a rollable pouch in an unrolled configuration.

In one embodiment, the pouch is operable to be rolled for storage (e.g., in a rucksack). FIG. 35 illustrates one embodiment of a rollable pouch 2800 in an unrolled configuration. The rollable pouch preferably includes at least one pocket operable to hold at least one component of the DC-DC conversion system. The embodiment shown in FIG. 35 includes a first pocket 2802, a second pocket 2804, and a third pocket 2806. The first pocket 2802 is shown in FIG. 35 holding the DC-DC converter 200. The second pocket 2804 is shown in FIG. 35 holding the XX90 source cable 300, the NATO source cable 400, the alligator clip source cable 500, the male cigarette source cable 600, the 152/148 battery source cable 700, and the helicopter source cable 800. The third pocket 2806 is shown in FIG. 35 holding the 17V dual output cable 1000 and the 30V output cable 1100. Although the rollable pouch 2800 is shown with three pockets, it is equally possible for the pouch to have one, two, or more than three (e.g., four, five, six, etc.) pockets. The rollable pouch 2800 is not limited to holding only the components shown in FIG. 35. For example, the rollable pouch 2800 is operable to also hold the conformal wearable battery source cable, at least one dual voltage output cable, and/or at least one triple voltage output cable. Additionally, the NATO source cable 400 is also operable to be the cable shown in FIG. 9.

The at least one pocket (e.g., the first pocket 2802, the second pocket 2804, the third pocket 2806) preferably includes at least one opening to place and remove components of the DC-DC conversion system in the at least one pocket. In the embodiment shown in FIG. 35, the first pocket 2802 has a first opening 2812, the second pocket 2804 has a second opening 2814, and the third pocket 2806 has a third opening 2816. In one embodiment, the at least one opening is operable to be closed by folding over a flap 2808 and securing using hook tape 2820 and loop tape 2822. Alternatively, the at least one opening is operable to be closed using at least one zipper, one or more buttons, one or more snaps, one or more ties, one or more buckles, one or more clips, and/or one or more hooks. In one embodiment, one or more of the at least one zipper includes a ball portion and a socket portion. An example of a zipper with a ball portion and a socket portion is described in U.S. Pat. No. 9,795,195, which is incorporated herein by reference in its entirety. Alternatively, one or more of the at least one zipper is a vacuum press zipper assembly. An example of a vacuum press zipper assembly is described in U.S. Pat. No. 8,646,156, which is incorporated herein by reference in its entirety. In a preferred embodiment, one or more of the at least one zipper is sliding, toothless, silent, dustproof, waterproof, and/or submersible.

The at least one pocket (e.g., the first pocket 2802, the second pocket 2804, the third pocket 2806) preferably include at least one strap 2830 to hold at least one component of the DC-DC conversion system. In one embodiment, the at least one strap 2830 is formed of an elastic material. Alternatively, the at least one strap 2830 is made of a non-elastic material. In other embodiments, the at least one strap 2830 includes hook-and-loop tape.

The rollable pouch 2800 preferably includes at least one securing strap 2840 to secure the rollable pouch 2800 in a closed configuration. In one embodiment, each of the at least one securing strap 2840 includes one or more buttons, one or more holes, one or more snaps, one or more ties, one or more buckles, one or more clips, hook tape and/or loop tape, and/or one or more hooks. The embodiment shown in FIG. 34 includes a piece of hook tape 2842 that secures the rollable pouch 2800 in a closed configuration when attached to a corresponding piece of loop tape (not shown). The piece hook tape 2842 is permanently attached to the at least one securing strap 2840 via adhesive and/or stitching.

Figure 36:
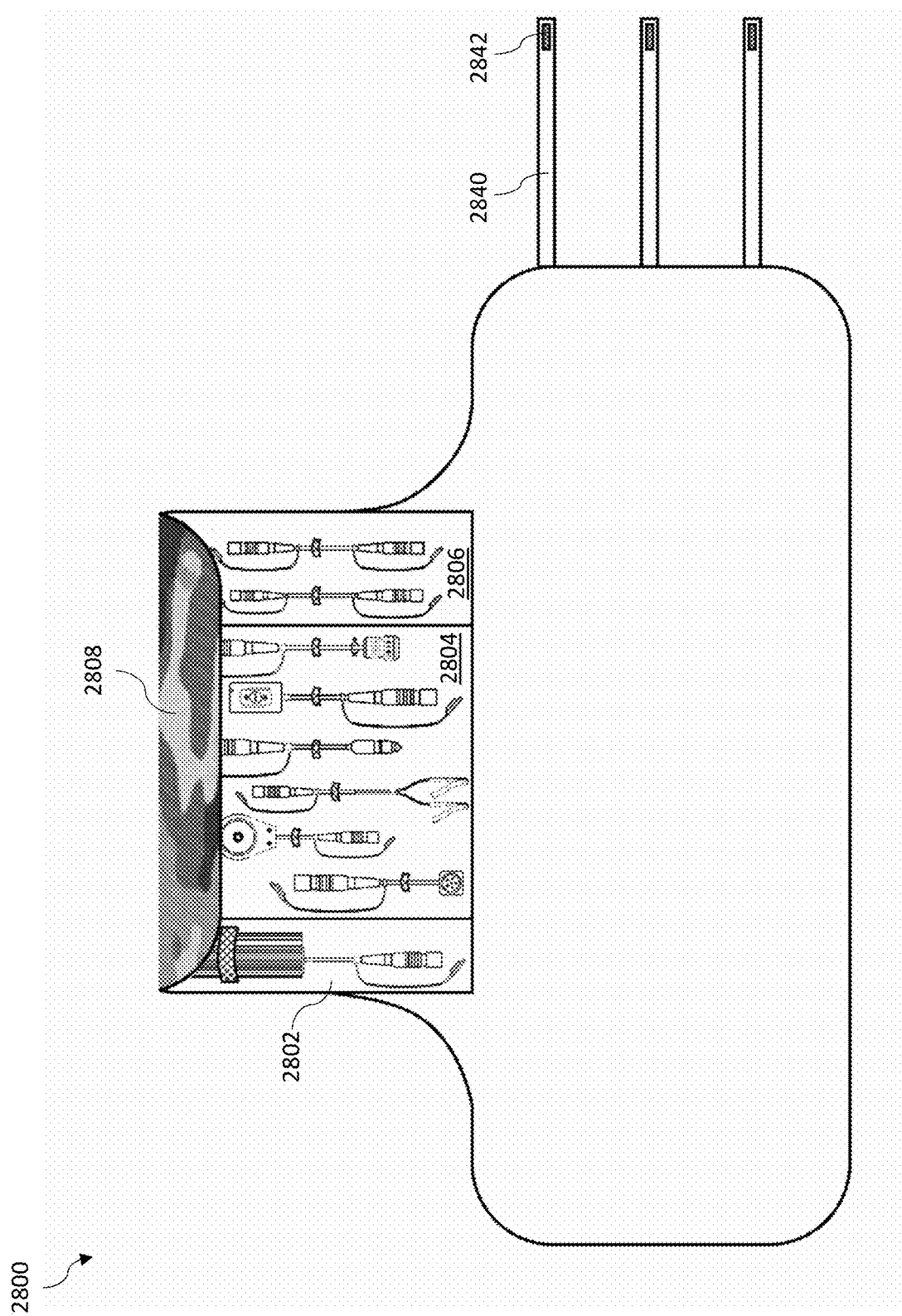
FIG. 36 illustrates the rollable pouch of FIG. 35 in a configuration with a flap closed to secure contents of a pocket.

FIG. 36 illustrates a view of the rollable pouch 2800 from FIG. 35 with the flap 2808 closed. As previously described, the rollable pouch 2800 includes hook tape and loop tape to secure the at least one opening closed via the flap in one embodiment. In the embodiment shown in FIG. 36, an exterior of the rollable pouch 2800 includes a camouflage pattern.

Figure 37:
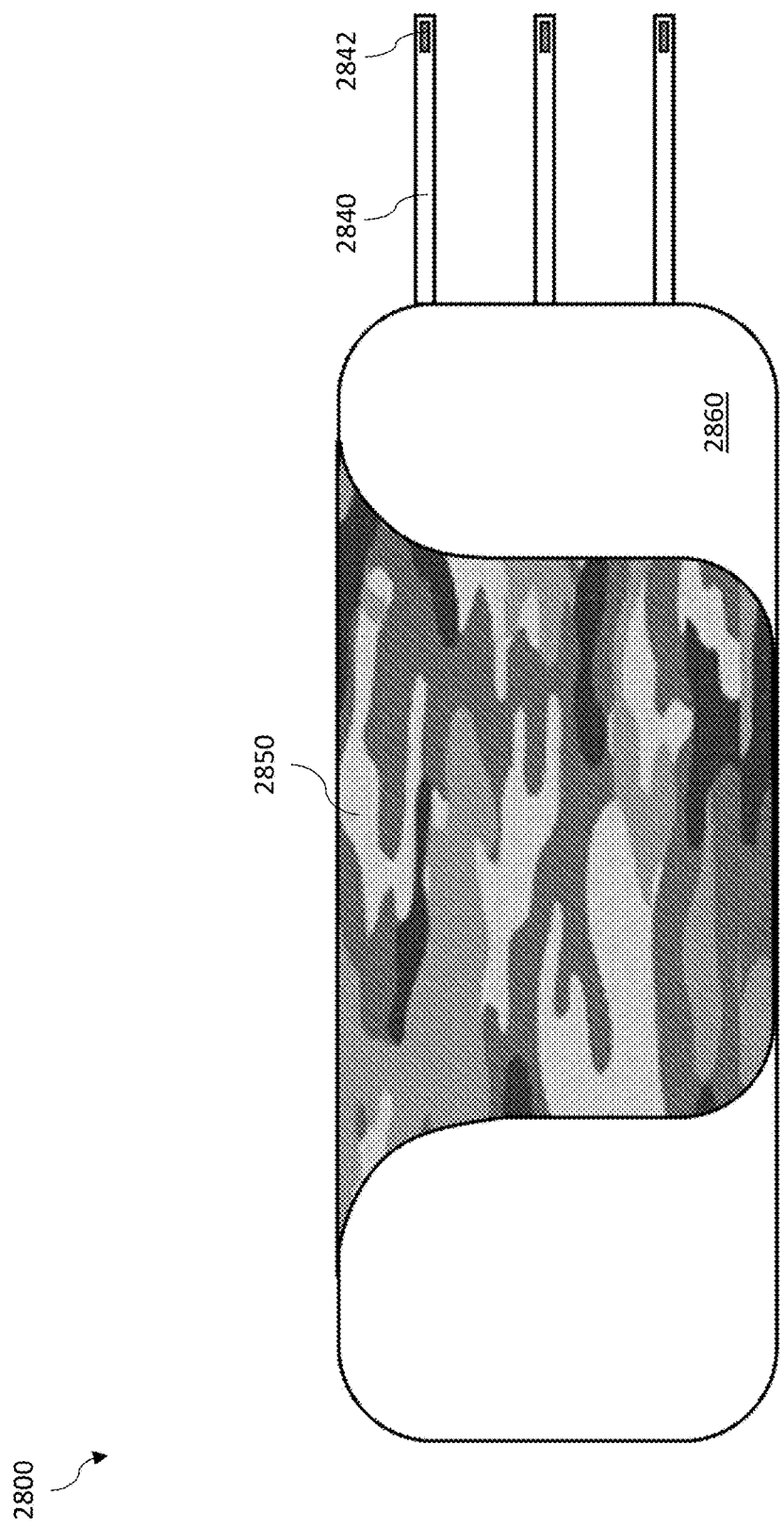
FIG. 37 illustrates the rollable pouch of FIG. 35 in a folded and unrolled configuration.

To secure the rollable pouch 2800 in the closed configuration, a pocket portion 2850 is folded over a main body 2860 as shown in FIG. 37. The rollable pouch 2800 is then rolled starting at an end opposite of the at least one securing strap 2840. The at least one securing strap is secured using the one or more buttons, the one or more holes, the one or more snaps, the one or more ties, the one or more buckles, the one or more clips, the hook tape and/or the loop tape, and/or the one or more hooks. The embodiment shown in FIG. 37 is secured using the hook tape 2842.

Figure 38:
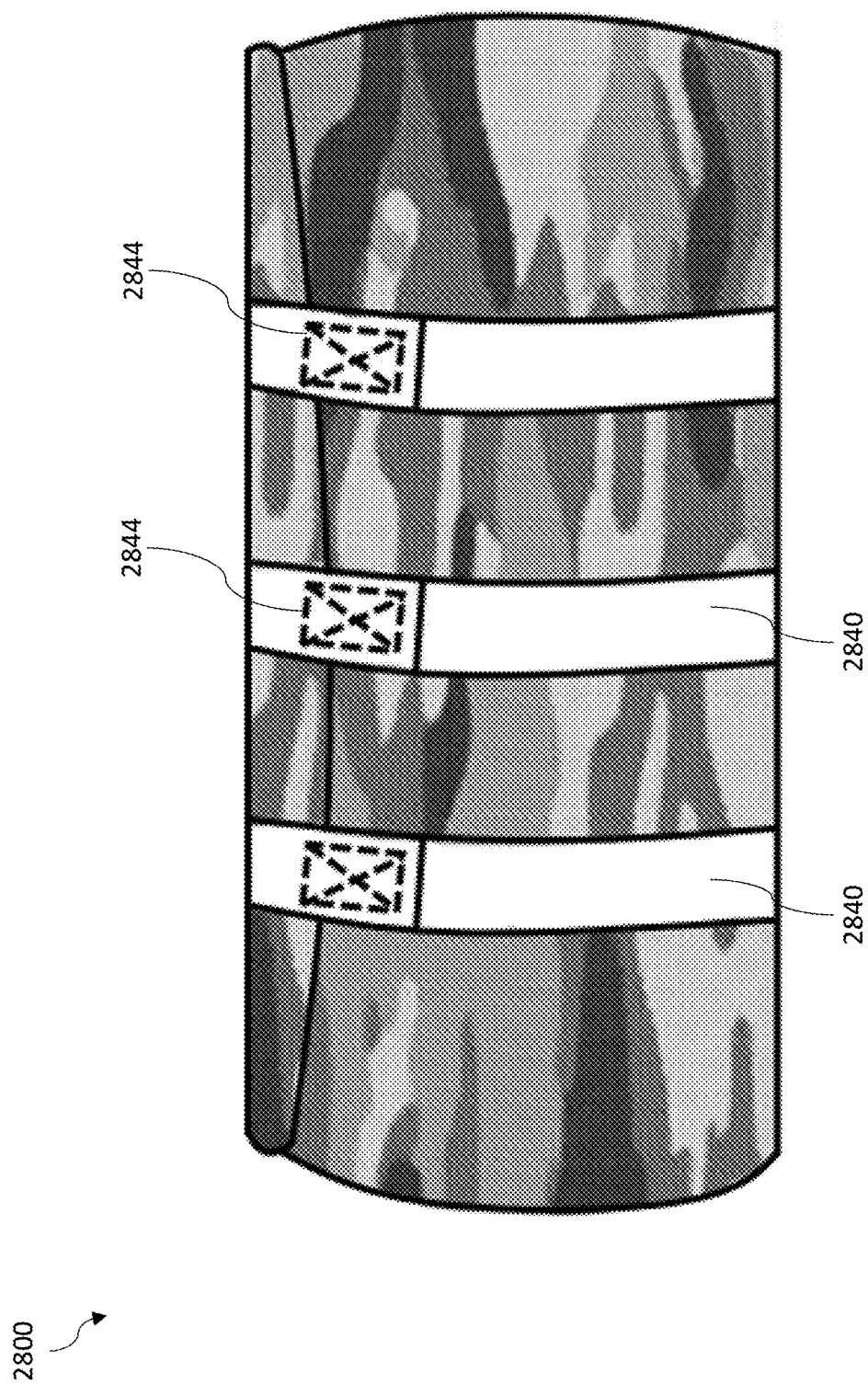
FIG. 38 illustrates the rollable pouch of FIG. 35 in a rolled configuration.

FIG. 38 illustrates the rollable pouch 2800 in a closed configuration. The piece of hook tape is permanently affixed to the at least one securing strap 2840 using a plurality of stitches 2844.

Figure 39:
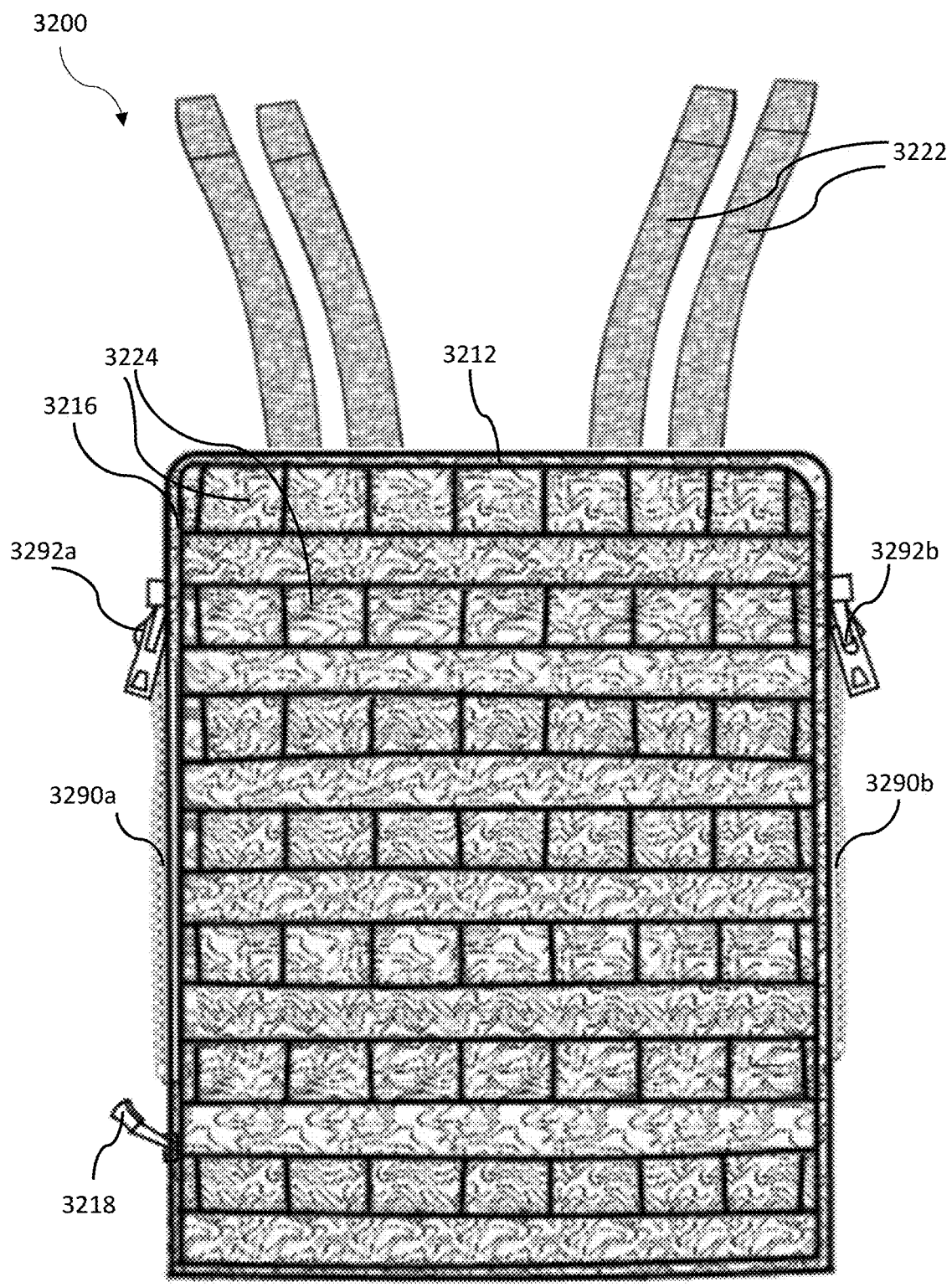
FIG. 39 illustrates a front view of one embodiment of a pouch operable to affix to a load-bearing platform.
Figure 40:
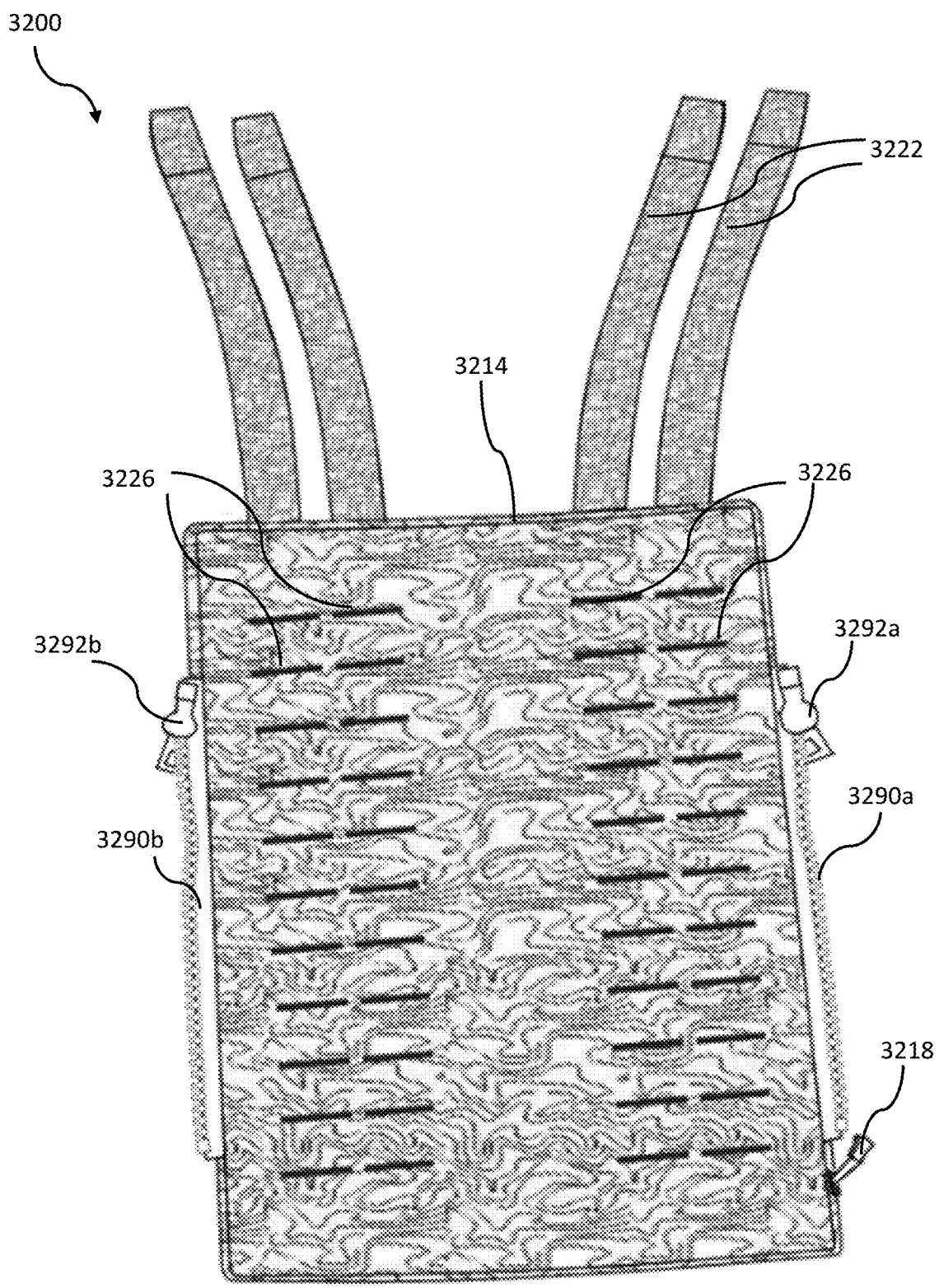
FIG. 40 illustrates a back view of one embodiment of a pouch operable to affix to a load-bearing platform.

FIGS. 39-40 illustrate one embodiment of a pouch operable to affix to a load-bearing platform. The pouch 3200 has a first side 3212 and a second side 3214. The pouch 3200 also includes a pouch opening 3216. In the example shown in FIGS. 39-40 the pouch opening 3216 is opened and closed using a zipper, as the pouch 3200 includes a zipper tab 3218. Other mechanisms, however, can be used for holding the pouch opening 3216 of the pouch 3200 open or closed, such as, a hook and loop system (e.g., VELCRO®), buttons, snaps, hooks, ties, clips, buckles, and the like.

In a preferred embodiment, the pouch 3200 is MOLLE-compatible. In one embodiment, the pouch 3200 incorporates a pouch attachment ladder system (PALS), which is a grid of webbing used to attach smaller equipment onto load-bearing platforms, such as vests and backpacks. For example, the PALS grid consists of horizontal rows of 1-inch (2.5 cm) webbing, spaced about one inch apart, and reattached to the backing at 1.5-inch (3.8 cm) intervals. In one embodiment, the webbing is formed of nylon (e.g., cordura nylon webbing, MIL-W-43668 Type III nylon webbing). Accordingly, a set of straps 3222 (e.g., four straps 3222) are provided on one edge of the pouch 3200 as shown. Further, rows of webbing 3224 (e.g., seven rows 3224) are provided on the first side 3212 of the pouch 3200, as shown in FIG. 39. Additionally, rows of slots or slits 3226 (e.g., eleven rows of slots or slits 3226) are provided on the second side 3214 of the pouch 3200, as shown in FIG. 40. In a preferred embodiment, the set of straps 3222, the rows of webbing 3224, and the rows of slots or slits 3226 replicate and duplicate the MOLLE underneath the pouch 3200 on the load bearing equipment. Advantageously, this allows for minimal disruption to the user because the user can place additional gear pouches or gear (e.g., water bottle, antenna pouch) on the MOLLE of the pouch 3200 in an equivalent location.

In the embodiment shown in FIGS. 39-40, the portable battery pack is made to affix to a plate carrier, body armor, or a vest with at least one single width of zipper tape sewn on the front panel or the back panel (e.g., JPC 2.0™ by Crye Precision). FIG. 39 shows details of the first side 3212 of the pouch 3200 including a first single width of zipper tape 3290*a* and a first zipper slider 3292*a* and a second single width of zipper tape 3290*b* and a second zipper slider 3292*b*. The first single width of zipper tape 3290*a* mates with a corresponding single width of zipper tape on the plate carrier, the body armor, or the vest. The second single width of zipper tape 3290*b* also mates with a corresponding single width of zipper tape on the plate carrier, the body armor, or the vest.

In other embodiments, the pouch is made to affix to other equipment (e.g., chair or seat, boat or kayak) or a user's body (e.g., back region, chest region, abdominal region, arm, leg) using straps, snaps, hook and loop tape, snaps, buckles, ties, and/or clips. In one example, the pouch is made to affix to a seat of a kayak using at least one strap and at least one side-release buckle. In another example, the pouch is made to affix to a user's body using two shoulder straps. In yet another example, the pouch includes two shoulder straps, a chest strap, and a side-release buckle for the chest strap.

Figure 41:
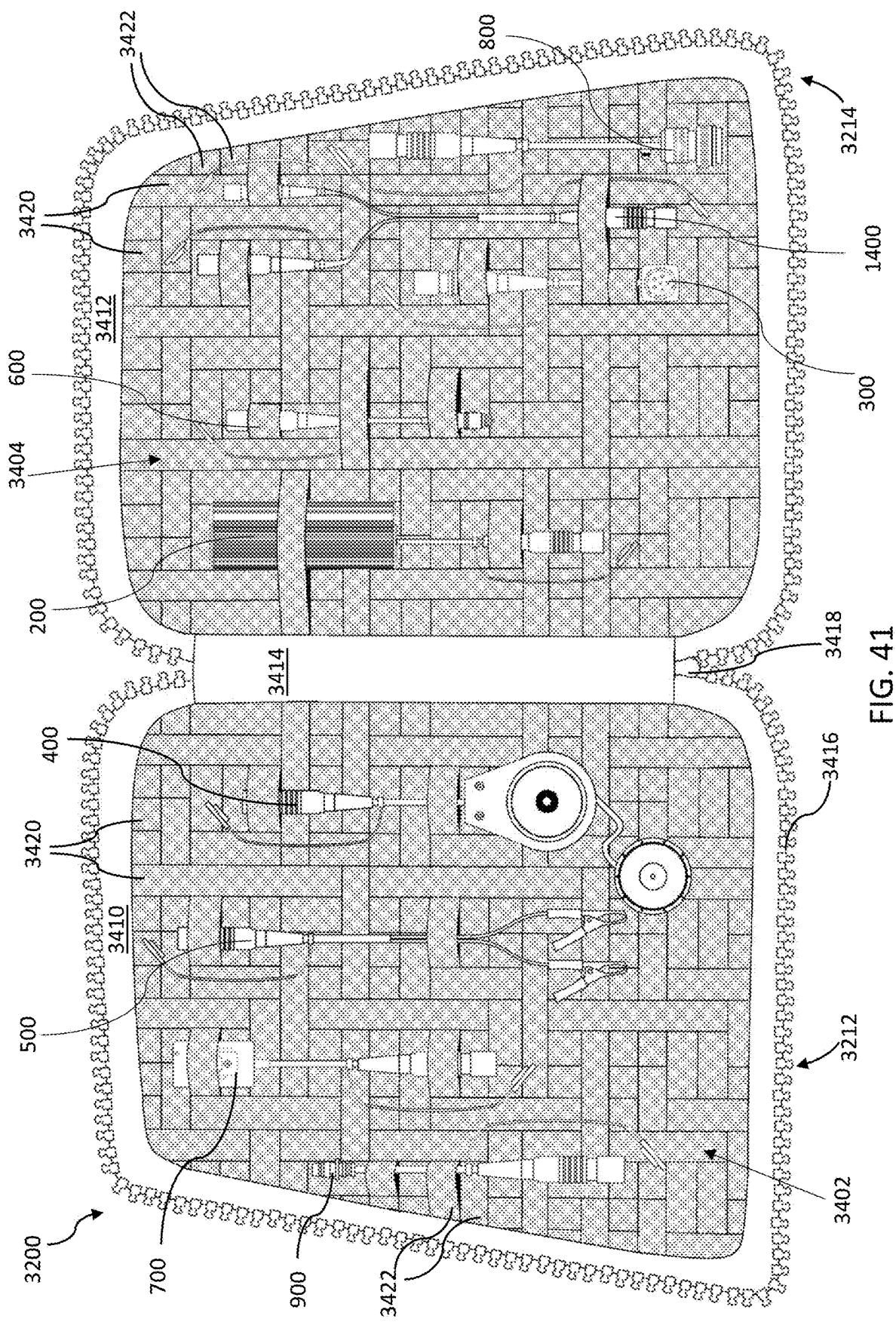
FIG. 41 illustrates an interior perspective view of an example of the pouch that includes an object retention system.

FIG. 41 illustrates an interior perspective view of an example of the pouch that includes an object retention system. The first side 3212 of the pouch 3200 has an interior of the first side 3402. The second side 3214 of the pouch 3200 has an interior of the second side 3404. The first side 3212 has a first side gusset 3410 and the second side 3214 has a second side gusset 3412. The first side gusset 3410 and the second side gusset 3412 are attached at a top position of a fabric stop 3414 and a bottom position of the fabric stop 3414. A zipper 3416 with a zipper pull 3418 is attached to the first side gusset 3410 and the second side gusset 3412. Advantageously, this configuration allows the pouch 3200 to lie flat when opened.

In a preferred embodiment, the interior of the first side 3402 and/or the interior of the second side 3404 contains an object retention system (e.g., GRID-IT® by Cocoon Innovations) as described in U.S. Publication Nos. 20090039122, 20130214119, and 20130256498, each of which is incorporated herein by reference in its entirety.

The object retention system is formed of a weave of a plurality of rubberized elastic bands. The plurality of rubberized elastic bands is preferably formed of a first set of straps 3420 and a second set of straps 3422. The first set of straps 3420 is preferably oriented substantially perpendicular to the second set of straps 3422. Additionally, each strap in the first set of straps 3420 is preferably oriented substantially parallel to other straps in the first set of straps 3420. Further, each strap in the second set of straps 3422 is preferably oriented substantially parallel to other straps in the second set of straps 3422. In the example shown in FIG. 41, the first set of straps 3420 is shown in a substantially vertical direction and the second set of straps 3422 is shown in a substantially horizontal direction.

In the example shown in FIG. 41, the interior of the first side 3402 has an object retention system. The object retention system in the interior of the first side 3402 is shown holding a North American Treaty Organization (NATO) cable 400, an alligator clip cable 500 connected, a 152/148 battery cable 700, and a conformal wearable battery cable 900. Additionally, the NATO source cable 400 is also operable to be the cable shown in FIG. 9.

In the example shown in FIG. 41, the interior of the second side 3404 has an object retention system. The object retention system in the interior of the second side 3404 is shown holding an XX90 source cable 300, a male cigarette source cable 600, a helicopter source cable 800, and a 17V and 30V dual output cable 1400.

The pouch 3200 is not limited to holding only the components shown in FIG. 41. For example, the pouch 3200 is operable to also hold at least one single voltage output cable (e.g., 12V, 17V, 30V, 34V) and/or at least one triple voltage output cable.

Figure 42:
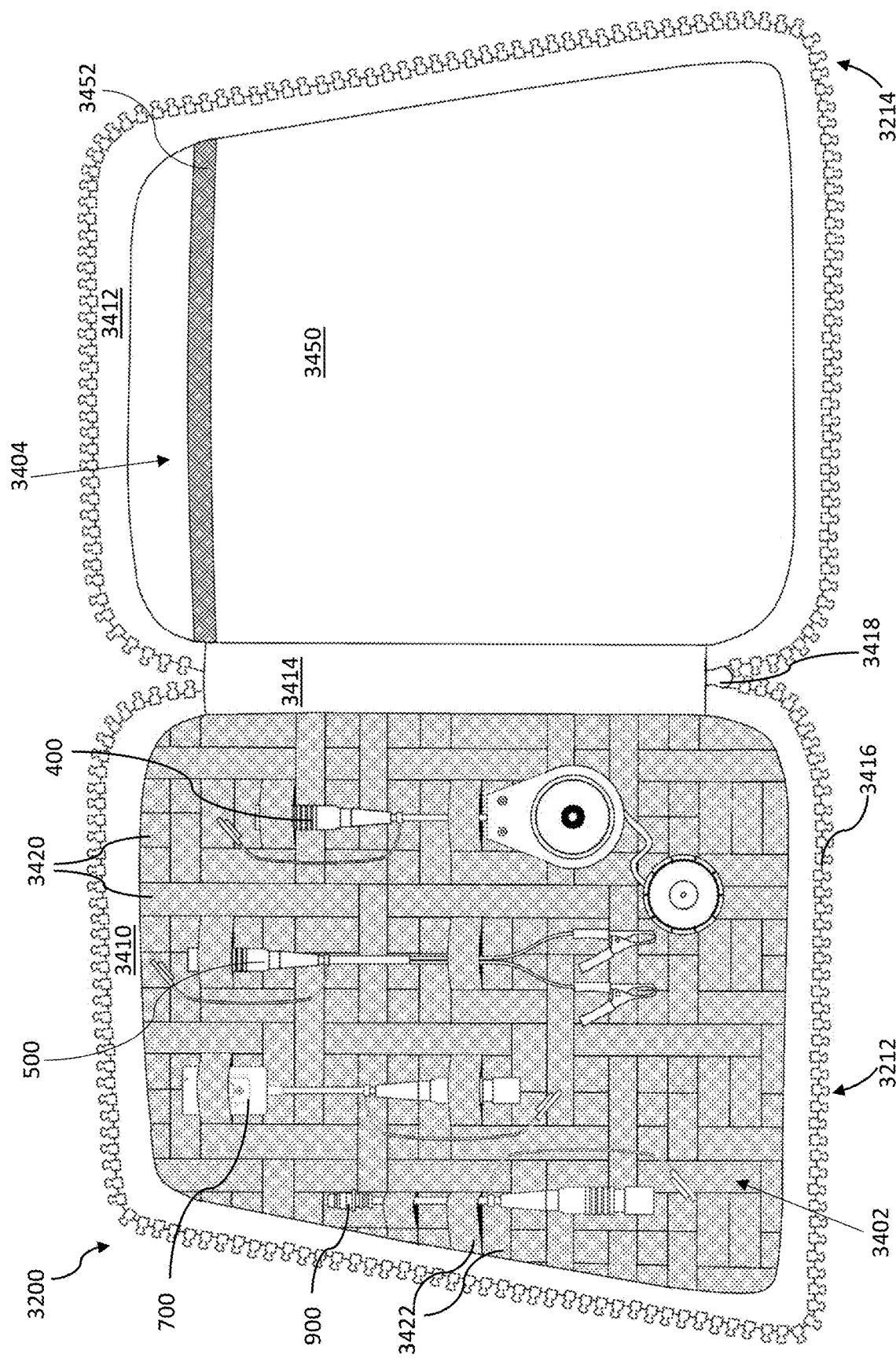
FIG. 42 illustrates an interior perspective view of an example of the pouch that includes an integrated pocket.

In a preferred embodiment, an interior of the pouch includes at least one integrated pocket. In the example shown in FIG. 42, the interior of the second side 3404 has an integrated pocket 3450. The integrated pocket 3450 is formed of polyester, polyvinyl chloride (PVC)-coated polyester, vinyl-coated polyester, nylon, canvas, PVC-coated canvas, polycotton canvas, and/or a mesh fabric. In a preferred embodiment, the integrated pocket 3450 is formed of a clear vinyl fabric. Advantageously, this allows a user to see the contents of the integrated pocket 3450. In one example, the user stores a map or instructions in the integrated pocket 3450. The integrated pocket 3450 closes using a piece of elastic 3452. Alternatively, the integrated pocket 3450 closes using a zipper, a hook and loop system, one or more buttons, one or more snaps, one or more ties, one or more buckles, one or more clips, and/or one or more hooks. Although FIG. 42 illustrates a single integrated pocket, it is equally possible to have more than one integrated pocket (e.g., two, three, four, five, six, etc.). Additionally or alternatively, the interior of the first side has at least one integrated pocket. In one embodiment, one or more of the at least one zipper includes a ball portion and a socket portion. An example of a zipper with a ball portion and a socket portion is described in U.S. Pat. No. 9,795,195, which is incorporated herein by reference in its entirety. Alternatively, one or more of the at least one zipper is a vacuum press zipper assembly. An example of a vacuum press zipper assembly is described in U.S. Pat. No. 8,646,156, which is incorporated herein by reference in its entirety. In a preferred embodiment, one or more of the at least one zipper is sliding, toothless, silent, dustproof, waterproof, and/or submersible.

The above-mentioned examples are provided to serve the purpose of clarifying the aspects of the invention, and it will be apparent to one skilled in the art that they do not serve to limit the scope of the invention. The above-mentioned examples are just some of the many configurations that the mentioned components can take on. All modifications and improvements have been deleted herein for the sake of conciseness and readability but are properly within the scope of the present invention.

The invention claimed is:

1. A direct current (DC)-DC conversion system comprising:
    at least one DC source;
    at least one source cable, wherein each of the at least one source cable comprises a source input connector, a source output connector, and a source input cable electrically connecting the source input connector with the source output connector;
    a DC-DC converter, wherein the DC-DC converter includes a housing, a DC-DC input connector, and a DC-DC output connector;
    at least one output cable, wherein each of the at least one output cable comprises a load input connector, at least one load output connector, and a load input cable electrically connecting the load input connector with the at least one load output connector; and
    at least one DC load;
    wherein the DC-DC converter is operable to receive energy from the at least one source via the at least one source cable, wherein the source input connector is operable to electrically connect to the at least one source, and wherein the source output connector is operable to electrically connect to the DC-DC input connector; and
    wherein the DC-DC converter is operable to provide energy to the at least one load via the at least one output cable, wherein the DC-DC output connector is operable to electrically connect to the load input connector, and wherein one or more of the at least one load output connector is operable to electrically connect to one or more of the at least one DC load.

2. The DC-DC conversion system of claim 1, wherein the at least one source cable includes an XX90 battery source cable, a North American Treaty Organization (NATO) source cable, an alligator clip source cable, a male cigarette source cable, a Society of Automobile Engineers (SAE) source cable, a conformal wearable battery source cable, and/or a 152/148 battery source cable, and wherein the source input connector of the 152/148 battery source cable mates to a battery operable to power an AN/PRC-152 radio, an AN/PRC-148 radio, an AN/PRC-161, and/or an AN/PRC-163 radio.

3. The DC-DC conversion system of claim 1, wherein the DC-DC converter has an input voltage range between about 9V and about 40V.

4. The DC-DC conversion system of claim 1, wherein the at least one output cable includes a 17V output cable, a 30V output cable, and/or a 34V output cable.

5. The DC-DC conversion system of claim 1, wherein the housing includes at least one fin and at least one vacuum tube, wherein the at least one vacuum tube is comprised of copper, and wherein the at least one copper vacuum tube is encased in an aluminum extrusion.

6. The DC-DC conversion system of claim 1, wherein the DC-DC converter further includes a panel mount strain relief, and wherein the panel mount strain relief includes a right-angle adapter.

7. The DC-DC conversion system of claim 1, wherein the source input connector on the source cable is operable to electrically connect to a 28V utility receptacle.

8. The DC-DC conversion system of claim 1, wherein a voltage output of the DC-DC converter is configured based on a pin out of the load input connector.

9. The DC-DC conversion system of claim 1, wherein the housing is configured to store electronics, and wherein the electronics are configured to designate at least one output voltage.

10. The DC-DC conversion system of claim 1, wherein the at least one output cable includes at least one dual voltage output cable, wherein the at least one dual voltage output cable includes a first load output connector and a second load output connector, wherein the first load output connector has a first output voltage and the second load output connector has a second output voltage, wherein the first output voltage is higher than the second output voltage, and wherein the first load output connector has a larger diameter than the second load output connector.

11. The DC-DC conversion system of claim 1, wherein the at least one output cable includes a triple voltage output cable, wherein the triple voltage output cable includes a first load output connector, a second load output connector, and a third load output connector, wherein the first load output connector has a first output voltage, wherein the second load output connector has a second output voltage, wherein the third load output connector has a third output voltage, wherein the first output voltage is higher than the second output voltage, wherein the second output voltage is higher than the third output voltage, wherein the first load output connector has a larger diameter than the second load output connector, and wherein the second load output connector has a larger diameter than the third load output connector.

12. The DC-DC conversion system of claim 1, wherein the at least one source cable includes a helicopter source cable.

13. The DC-DC conversion system of claim 1, wherein the at least one output cable includes a quad voltage output cable, wherein the quad voltage output cable includes four load output connectors, and wherein the four load output connectors have the same output voltage.

14. A direct current (DC)-DC conversion system comprising:
    at least one DC source;
    at least one source cable, wherein each of the at least one source cable comprises a source input connector, a source output connector, and a source input cable electrically connecting the source input connector with the source output connector;
    a DC-DC converter, wherein the DC-DC converter includes a housing, a DC-DC input connector, and a DC-DC output connector;
    at least one output cable, wherein each of the at least one output cable comprises a load input connector, at least one load output connector, and a load output cable electrically connecting the load input connector with the at least one load output connector;
    at least one DC load; and
    a pouch, wherein the pouch is configured to hold the at least one source cable, the DC-DC converter, and the at least one output cable;
    wherein the DC-DC converter is operable to receive energy from the at least one source via the at least one source cable, wherein the source input connector is operable to electrically connect to the at least one source, and wherein the source output connector is operable to electrically connect to the DC-DC input connector; and wherein the DC-DC converter is operable to provide energy to the at least one DC load via the at least one output cable, wherein the DC-DC output connector is operable to electrically connect to the load input connector, and wherein one or more of the at least one load output connector is operable to electrically connect to one or more of the at least one DC load.

15. The DC-DC conversion system of claim 14, wherein the pouch is rollable.

16. The DC-DC conversion system of claim 14, wherein the at least one source cable includes a helicopter source cable.

17. The DC-DC conversion system of claim 14, wherein the housing is configured to store electronics, and wherein the electronics are configured to designate at least one output voltage.

18. A direct current (DC)-DC conversion system comprising:
    at least one DC source, wherein the at least one DC source includes a vehicle battery;
    at least one source cable, wherein each of the at least one source cable comprises a source input connector, a source output connector, and a source input cable electrically connecting the source input connector with the source output connector;
    a DC-DC converter, wherein the DC-DC converter includes a housing, a DC-DC input connector, and a DC-DC output connector;
    at least one output cable, wherein each of the at least one output cable comprises a load input connector, at least one load output connector, and a load output cable electrically connecting the load input connector with the at least one load output connector;
    at least one DC load; and
    a battery protector, wherein the battery protector is electrically connected to the vehicle battery and the DC-DC converter;
    wherein the DC-DC converter is operable to receive energy from the at least one source via the at least one source cable, wherein the source input connector is operable to electrically connect to the at least one source, and wherein the source output connector is operable to electrically connect to the DC-DC input connector;
    wherein the DC-DC converter is operable to provide energy to the at least one DC load via the at least one output cable, wherein the DC-DC output connector is operable to electrically connect to the load input connector, and wherein one or more of the at least one load output connector is operable to electrically connect to one or more of the at least one DC load; and
    wherein the battery protector prevents draining of the vehicle battery.

19. The DC-DC conversion system of claim 18, wherein the at least one source cable includes a helicopter source cable.

20. The DC-DC conversion system of claim 18, wherein the housing is configured to store electronics, and wherein the electronics are configured to designate at least one output voltage.

* * * * *